(12) United States Patent
Shen et al.

(10) Patent No.: US 7,322,005 B2
(45) Date of Patent: *Jan. 22, 2008

(54) LDPC (LOW DENSITY PARITY CHECK) CODED MODULATION SYMBOL DECODING USING NON-GRAY CODE MAPS FOR IMPROVED PERFORMANCE

(75) Inventors: Ba-Zhong Shen, Irvine, CA (US); Hau Thien Tran, Irvine, CA (US); Kelly Brian Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 735 days.

This patent is subject to a terminal disclaimer.

(21) Appl. No.: 10/802,023

(22) Filed: Mar. 16, 2004

(65) Prior Publication Data

US 2004/0255231 A1    Dec. 16, 2004

Related U.S. Application Data

(63) Continuation-in-part of application No. 10/668,526, filed on Sep. 23, 2003, now Pat. No. 7,159,170.

(60) Provisional application No. 60/548,953, filed on Mar. 1, 2004, provisional application No. 60/490,967, filed on Jul. 29, 2003, provisional application No. 60/478,690, filed on Jun. 13, 2003.

(51) Int. Cl.
*G06F 11/00* (2006.01)
*H03M 13/00* (2006.01)

(52) U.S. Cl. .................................. 714/801; 714/755
(58) Field of Classification Search ............... None See application file for complete search history.

(56) References Cited

U.S. PATENT DOCUMENTS 3,542,756 A   11/1970   Gallager (Continued)

FOREIGN PATENT DOCUMENTS

EP          0836305 A2    4/1998

OTHER PUBLICATIONS

Wadayama 1: "A Coded Modulation Scheme Based on Low Density Parity Check Codes"IEICE Transactions on Fundamentals of Electronics, Communications and Computer Sciences, Institute of Electronics Information and Comm. Eng. Tokyo, JP, vol. E84A, No. 10, Oct. 2001, pp. 2523-2527, XPOO1107784 ISSN: 0916-8508.

(Continued)

*Primary Examiner*—Phung My Chung
(74) *Attorney, Agent, or Firm*—Garlick Harrison & Markison; Shayne X. Short

(57) ABSTRACT

LDPC (Low Density Parity Check) coded modulation symbol decoding using non-Gray code maps for improved performance. Symbol decoding is supported by appropriately modifying an LDPC tripartite graph to eliminate the bit nodes thereby generating an LDPC bipartite graph (such that symbol nodes are appropriately mapped directly to check nodes thereby obviating the bit nodes). The edges that communicatively couple the symbol nodes to the check nodes are labeled appropriately to support symbol decoding of the LDPC coded modulation signal. In addition, the LDPC coded modulation symbol decoding can be employed to decode a signal that has been encoded using LDPC-BICM (Low Density Parity Check-Bit Interleaved Coded Modulation) encoding with non-Gray code mapping. By using the non-Gray code mapping, a performance improvement over such a system using only Gray code mapping may be achieved.

30 Claims, 40 Drawing Sheets

U.S. PATENT DOCUMENTS

| | | | |
|---|---|---|---|
| 3,665,396 | A | 5/1972 | Forney, Jr. |
| 4,295,218 | A | 10/1981 | Tanner |
| 6,430,233 | B1 | 8/2002 | Dillon et al. |
| 6,473,010 | B1 | 10/2002 | Vityaev et al. |
| 6,567,465 | B2 | 5/2003 | Goldstein et al. |
| 6,633,856 | B2 | 10/2003 | Richardson et al. |
| 7,159,170 | B2 * | 1/2007 | Shen et al. ............ 714/801 |
| 2003/0074626 | A1 | 4/2003 | Coker et al. |
| 2003/0104788 | A1 | 6/2003 | Kim |
| 2004/0252791 | A1 * | 12/2004 | Shen et al. ............ 375/340 |
| 2004/0258177 | A1 * | 12/2004 | Shen et al. ............ 375/308 |

OTHER PUBLICATIONS

Mittelholzer T et al.: "Reduced—complexity decoding of low density parity check codes for generalized partial response channels" IEEE Transactions on Magnetics, IEEE Inc. New York, US, vol. 37, No. 2, pt1, Mar. 2001, pp. 721-728, XP002177074 ISSN: 0018-9464.

R. Gallager, Low-Density Parity-Check Codes, Cambridge, MA: MIT Press, 1963.

M. Ludy, M. Mitzenmacher, A. Shokrollahi, D. Spielman, and V. Stemann, "Practical loss-resilient codes," 1997.

T. J. Richardson and R. L. Urbanke, "The capacity of low-density parity-check code under message-passing decoding," IEEE Trans. Inform. Theory, vol. 47, pp. 599-618, Feb. 2001.

E. Eleftheriou and S. Olcer, "Low-Density Parity-Check Codes for Digital Subscriber Lines," 0-7803-7400-2/02, IEEE, 2002, pp. 1752-1757.

Moe Wheatley, "WinPSK Technical Reference Manual", 46 pages, Dec. 28, 1999.

* cited by examiner

HDTV (High Definition Television) communication system

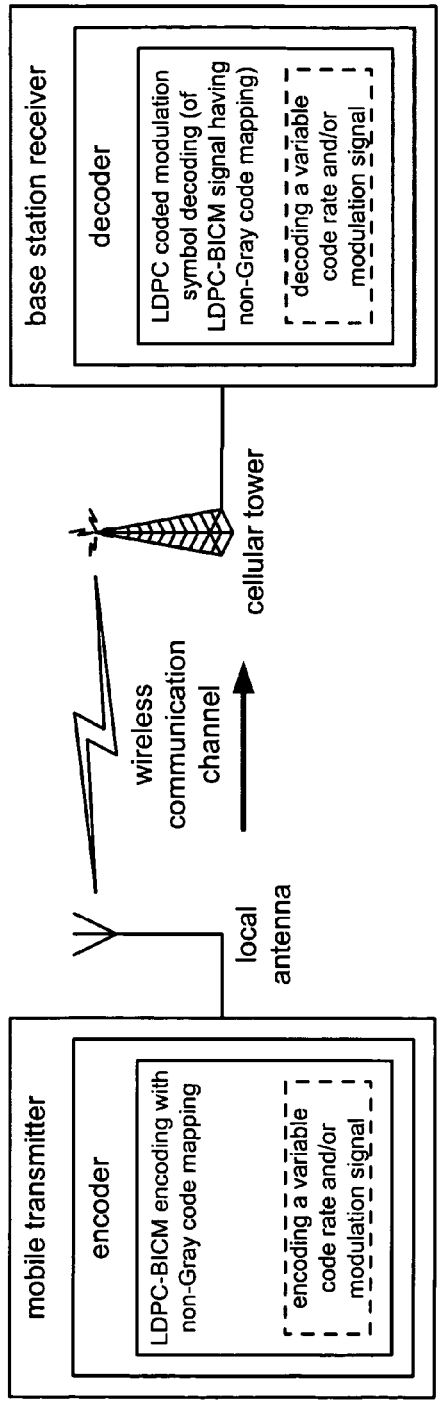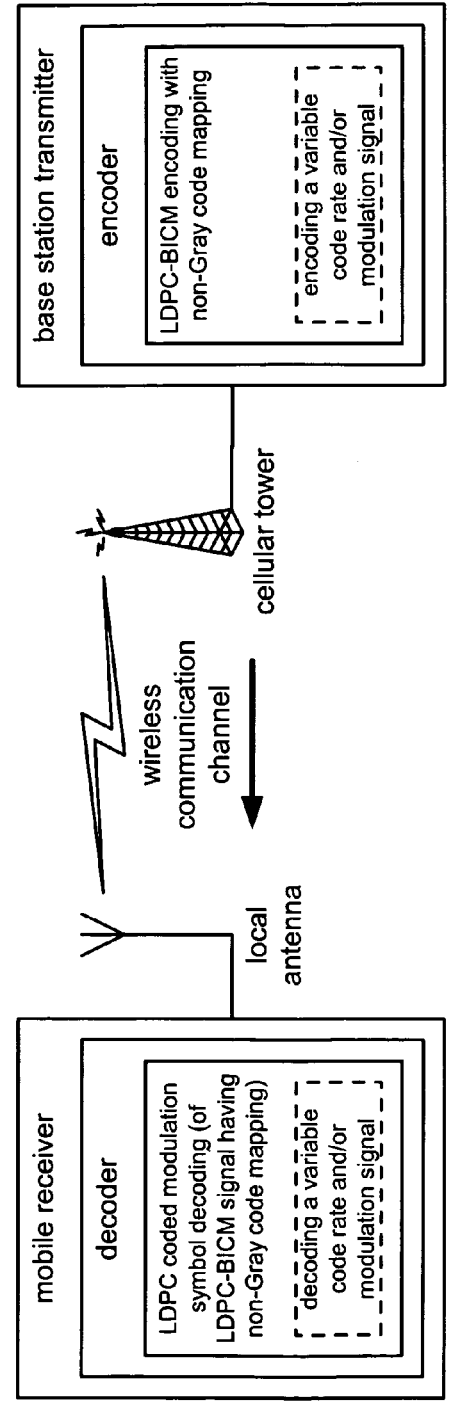

bi-directional cellular communication system uni-directional microwave communication system bi-directional microwave communication system uni-directional point-to-point radio communication system bi-directional point-to-point radio communication system uni-directional communication system bi-directional communication system Fig. 11  one to many communication system WLAN (Wireless Local Area Network) communication system DSL (Digital Subscriber Line) communication system fiber-optic communication system satellite receiver STB (Set Top Box) system LDPC (Low Density Parity Check) code bipartite graph direct combining of LDPC (Low Density Parity Check) coding and modulation BICM (Bit Interleaved Coded Modulation)

multilevel coded modulation variable signal mapping LDPC (Low Density Parity Check) coded modulation system LDPC (Low Density Parity Check) coded modulation decoding functionality using bit metric alternative LDPC coded modulation decoding functionality using bit metric (when performing n number of iterations)

LDPC (Low Density Parity Check) coded modulation decoding functionality using bit metric (with bit metric updating)

alternative LDPC coded modulation decoding functionality using bit metric (with bit metric updating) (when performing n number of iterations)

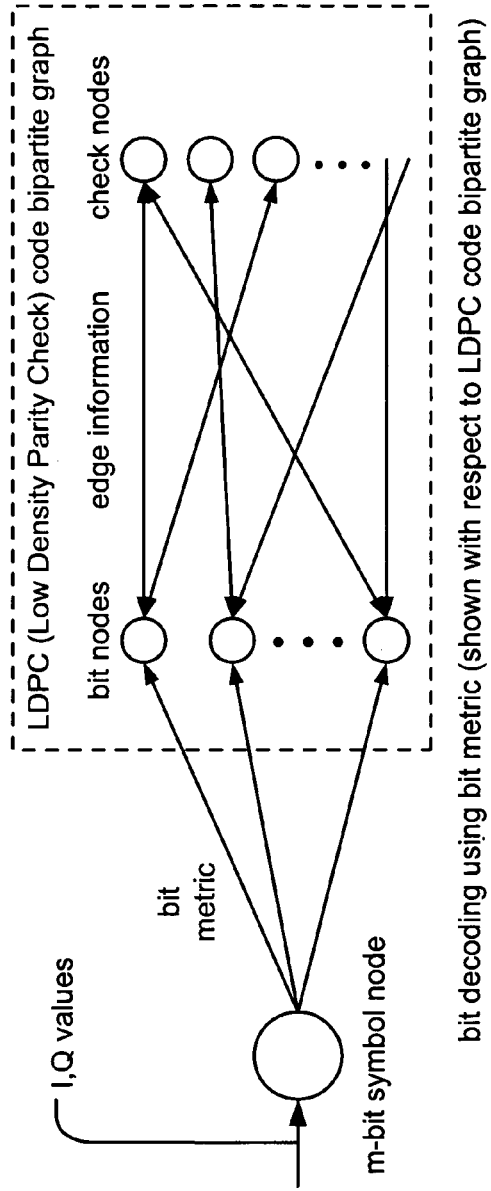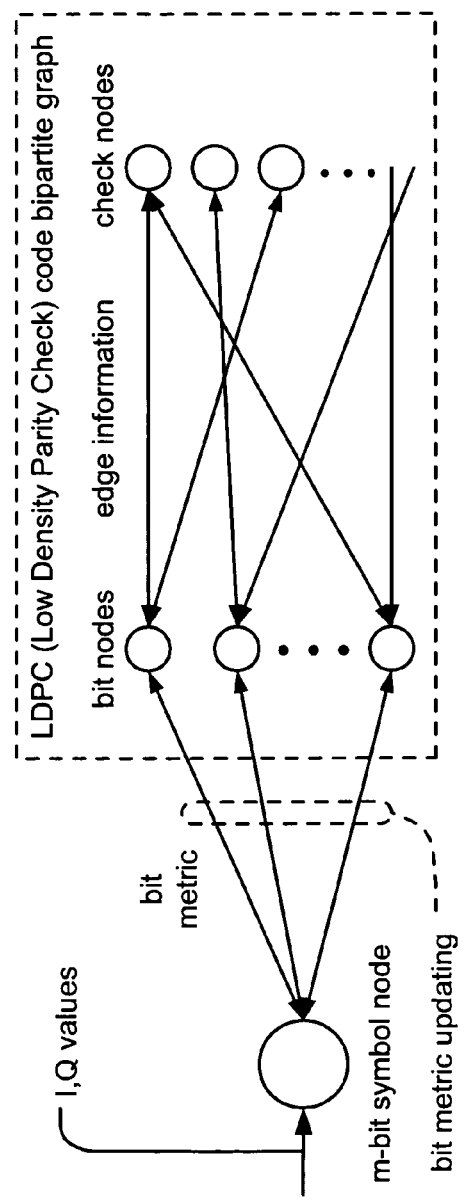

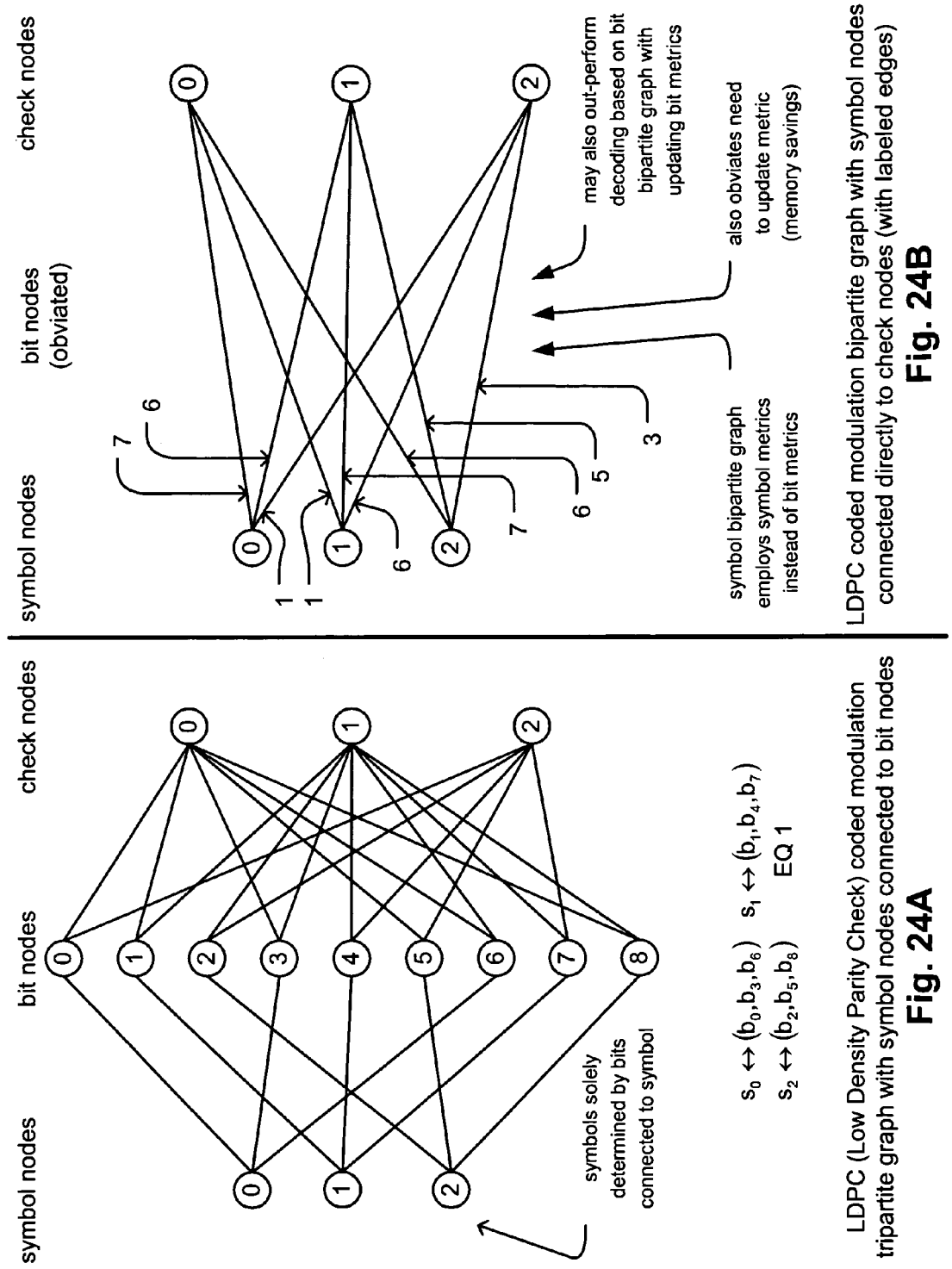

symbol decoding (shown with respect to LDPC (Low Density Parity Check) coded modulation bipartite graph)

symbol decoding functionality (supported with LDPC (Low Density Parity Check) coded modulation bipartite graph)

performance comparison of symbol vs. bit decoding of LDPC (Low Density Parity Check) coded modulation signals hybrid decoding functionality that reduces complexity of symbol decoding of LDPC coded modulation signals

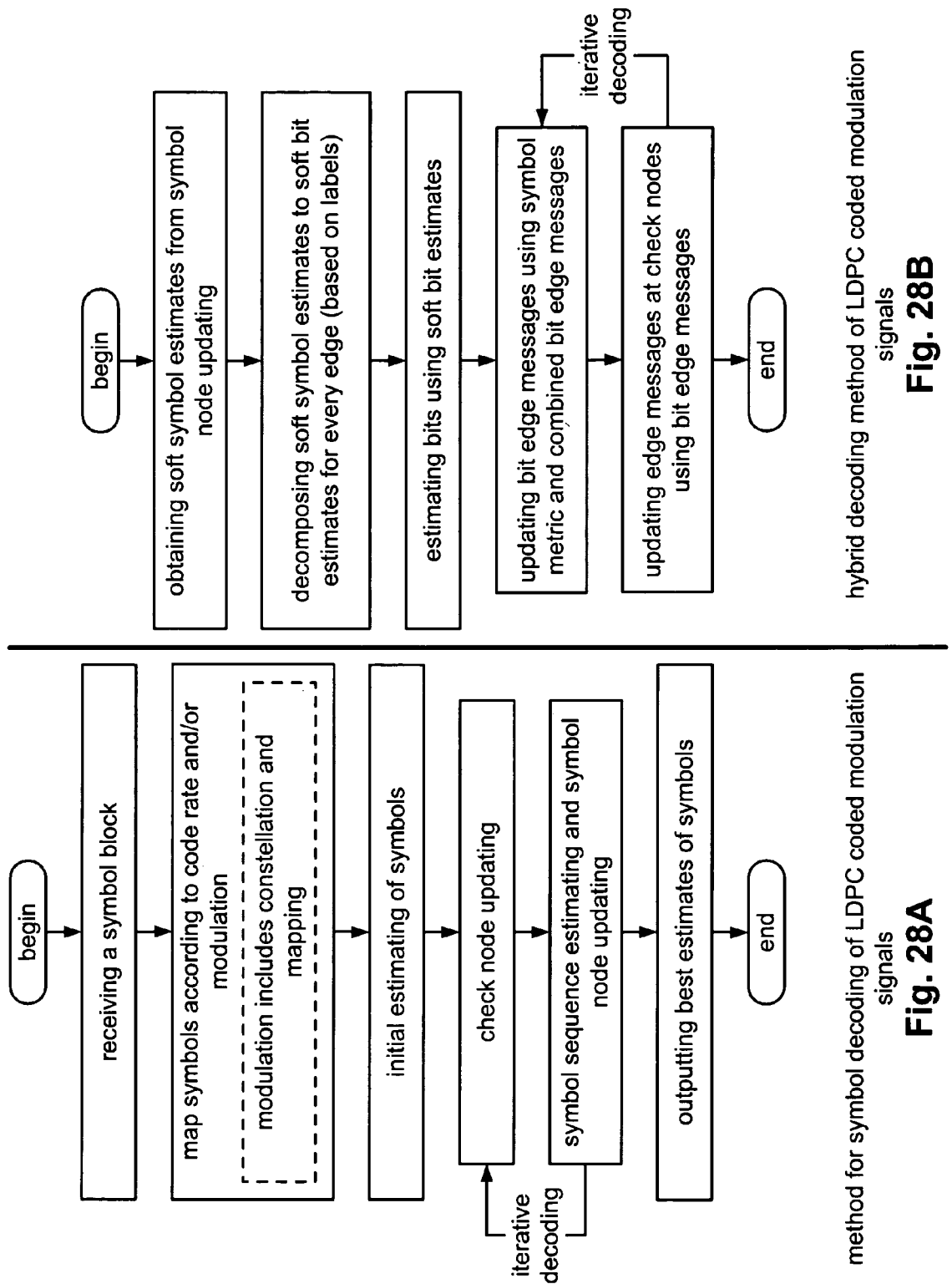

interleaver and S/P (Serial to Parallel) transformer as performed within an LDPC-BICM system G-map I (Gray code map) (shown using 8 PSK shaped constellation)

LDPC-BICM communication system I (encoding using single Gray code map and decoding using bit metric only)

G-map II (Gray code map) (shown using 8 PSK shaped constellation)

LDPC-BICM communication system II (encoding using 2 Gray code maps and decoding using bit metric only)

LDPC-BICM communication system III (encoding using 2 Gray code maps and decoding using symbol metric)

NG-map I (non-Gray code map) (shown using 8 PSK shaped constellation)

LDPC-BICM communication system IV using NG-map I (encoding using 1 Gray code map, 1 non-Gray code map and decoding using symbol metric)

LDPC-BICM communication system V (encoding using 1 Gray code map, 1 non-Gray code map and decoding using bit metric only)

performance comparison of 2 bit/s/Hz LDPC-BICM communication systems I, II, III, IV, and V (50 decoding iterations)

NG-map II
NG-map II (non-Gray code map) (shown using 8 PSK shaped constellation)

LDPC-BICM communication system IV using NG-map II (encoding using 1 Gray code map, 1 non-Gray code map and decoding using symbol metric)

NG-map III
NG-map III (non-Gray code map) (shown using 8 PSK shaped constellation)

LDPC-BICM communication system IV using NG-map III (encoding using 1 Gray code map, 1 non-Gray code map and decoding using symbol metric)

method for generating an LDPC-BICM signal having a non-Gray code mapping

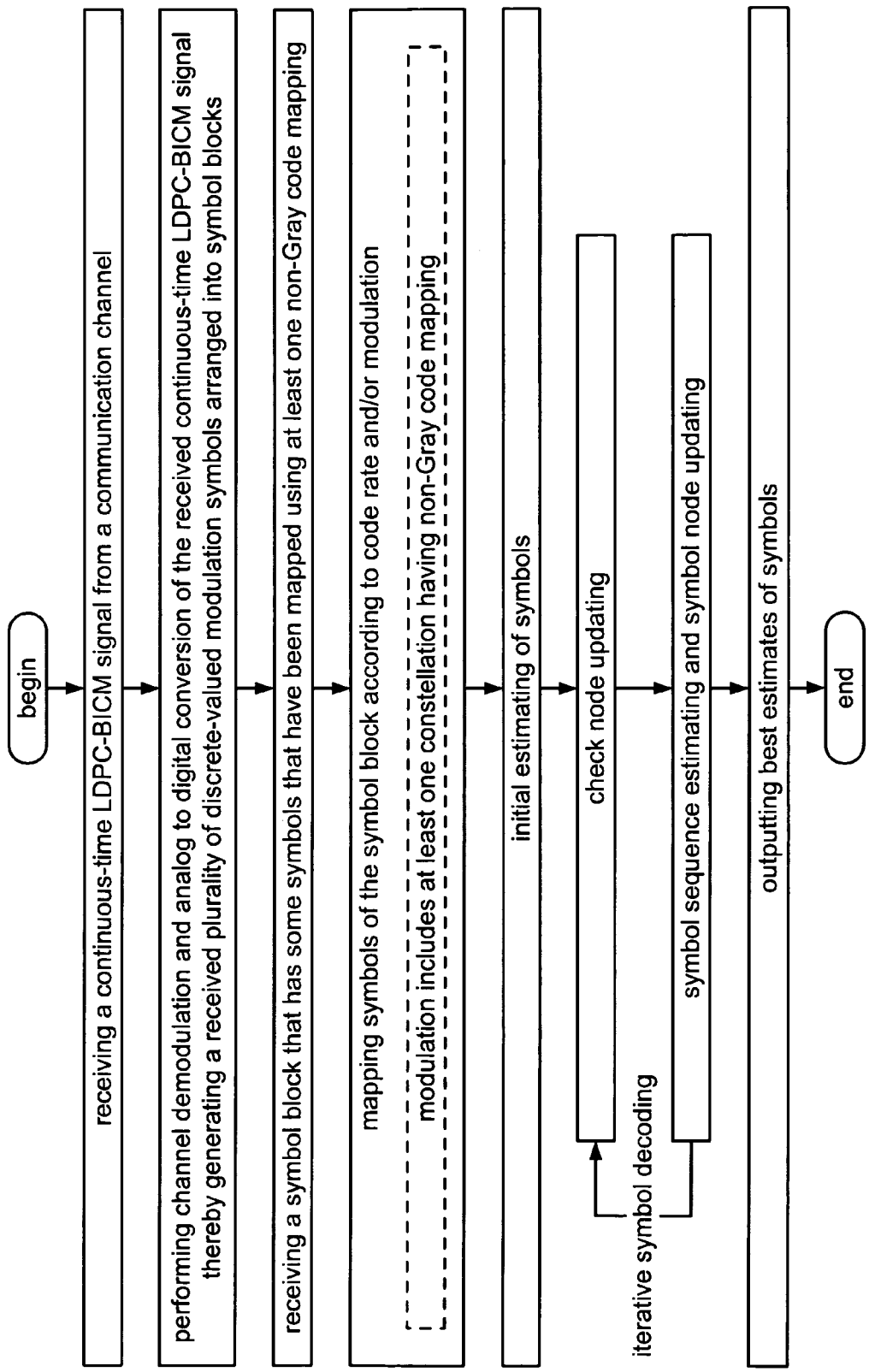

LDPC (LOW DENSITY PARITY CHECK) CODED MODULATION SYMBOL DECODING USING NON-GRAY CODE MAPS FOR IMPROVED PERFORMANCE

CROSS REFERENCE TO RELATED PATENTS/PATENT APPLICATIONS

The present U.S. Utility Patent Application claims priority pursuant to 35 U.S.C. § 119(e) to the following U.S. Provisional Patent Applications which are hereby incorporated herein by reference in their entirety and made part of the present U.S. Utility Patent Application for all purposes: LDPC-BICM (Low Density Parity Check-Bit Interleaved Coded Modulation)

1. U.S. Provisional Application Ser. No. 60/478,690, "Coded modulation with LDPC (Low Density Parity Check) code using variable maps and metric updating," filed Jun. 13, 2003 (Jun. 13, 2003), pending.

2. U.S. Provisional Application Ser. No. 60/490,967, "LDPC (Low Density Parity Check) coded modulation symbol decoding," filed Jul. 29, 2003 (Jul. 29, 2003), pending.

3. U.S. Provisional Application Ser. No. 60/548,953, "LDPC (Low Density Parity Check) coded modulation symbol decoding using non-Gray code maps for improved performance," filed Mar. 1, 2004 (Mar. 1, 2004), pending.

The present U.S. Utility Patent Application is also a continuation-in-part of U.S. Utility patent application Ser. No. 10/668,526, entitled "LDPC (Low Density Parity Check) coded modulation symbol decoding," filed Sep. 23, 2003 (Sep. 23, 2003), now U.S. Pat. No. 7,159,170, which is hereby incorporated herein by reference in its entirety and made part of the present U.S. Utility Patent Application for all purposes.

BACKGROUND OF THE INVENTION

1. Technical Field of the Invention

The invention relates generally to communication systems; and, more particularly, it relates to decoding of signals within such communication systems.

2. Description of Related Art

Data communication systems have been under continual development for many years. One such type of communication system that has been of significant interest lately is a communication system that employs turbo codes. Another type of communication system that has also received interest is a communication system that employs LDPC (Low Density Parity Check) coded modulation. A primary directive in these areas of development has been to try continually to lower the error floor within a communication system. The ideal goal has been to try to reach Shannon's limit in a communication channel. Shannon's limit may be viewed as being the data rate to be used in a communication channel, having a particular SNR (Signal to Noise Ratio), that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

Typical decoding of LDPC coded modulation signals is performed based on a bipartite graph of a given LDPC code such that the graph includes bit nodes and check nodes. The I, Q (In-phase, Quadrature) values associated with received symbols are associated with a symbol node, and that symbol node is associated with corresponding bit nodes. Bit metrics are then calculated for the individual bits of the corresponding symbols, and those bit metrics are provided to the bit nodes of the bipartite graph of the given LDPC code. Edge information corresponding to the edges that interconnect the bit nodes and the check nodes is calculated, and appropriately updated, and communicated back and forth between the bit nodes and the check nodes during iterative decoding of the LDPC coded signal. Therefore, such LDPC decoding is typically performed with respect to the bit nodes and the check nodes of the LDPC bipartite graph. One disadvantage of this approach to LDPC decoding is that it can be very memory and processing resource consumptive. Even in instances where there are sufficient memory and processing resources available, the previous approaches to perform LDPC decoding typically do not give a sufficiently high level of performance for some applications. With the ever-improvements developments in memory management and processing resource allocation, a higher performance means by which LDPC coded modulation signals may be decoded would be desirable.

BRIEF SUMMARY OF THE INVENTION

Various aspects of the invention can be found in any number of devices that perform LDPC (Low Density Parity Check) coded modulation symbol decoding. That is to say, the decoding is performed on a symbol level basis whereas prior art LDPC decoding approaches all include performing the decoding on a bit level basis. An LDPC coded modulation tripartite graph may be appropriately modified to an LDPC coded modulation bipartite graph to facilitate this symbol level decoding of the LDPC coded modulation signal. Moreover, the signal that is decoded using this symbol decoding may be an LDPC-BICM (Low Density Parity Check-Bit Interleaved Coded Modulation) signal. Various symbols of this LDPC-BICM signal may be mapped according to different modulations (e.g., to different shaped constellation and/or differently mapped constellations). In some instances, the different maps that are employed include a Gray code map and also a non-Gray code map.

The symbols of signal received by a device that includes the invention may be arranged in a symbol block. The signal may be a variable code rate signal and/or a variable modulation signal whose code rate and/or modulation may vary as frequently as on a symbol by symbol basis. Moreover, a combination (or hybrid) decoding approach may also be performed in some other embodiments that include a combination of bit level decoding (that may include bit metric updating) and symbol level decoding of LDPC coded signals. In some instances, a single device (e.g., a transceiver or a receiver) is operable to perform the decoding using one or more of these approaches in accordance with invention.

One embodiment of the invention may be found in a decoder that is operable to perform symbol decoding of an LDPC coded modulation signal. In one instance, the decoder includes a check node update functional block and a symbol sequence estimate and symbol node update functional block. The check node update functional block calculates a plurality of forward metrics (alphas) and a plurality of backward metrics (betas) that correspond to each mapped symbol of a plurality of mapped symbols that is mapped from a plurality of symbols of the LDPC coded modulation signal. This calculation of the alphas and betas may be performed using a forward-backward technique throughout the symbol block.

The check node update functional block then uses the plurality of forward metrics and the plurality of backward metrics that correspond to each symbol of the plurality of symbols to update a plurality of edge messages that corresponds to a plurality of edges that communicatively couple a plurality of symbol nodes to a plurality of check nodes within an LDPC bipartite graph that corresponds to an LDPC code. The symbol sequence estimate and symbol node update functional block computes a plurality of soft symbol estimates for each mapped symbol of the plurality of mapped symbols. The symbol sequence estimate and symbol node update functional block estimates each mapped symbol of the plurality of mapped symbols using the corresponding plurality of soft symbol estimates. The symbol sequence estimate and symbol node update functional block updates the plurality of edges using the estimates of each mapped symbol of the plurality of mapped symbols. The check node update functional block and the symbol sequence estimate and symbol node update functional block cooperatively perform iterative decoding in an effort to make final, best estimates of each symbol of the plurality of symbols within the LDPC coded modulation signal.

The LDPC coded modulation signal that is decoded by the decoder may be a variable modulation signal. In such instances, a first symbol of the plurality of symbols is mapped according to a first modulation that includes a first constellation and a corresponding first mapping, and a second symbol of the plurality of symbols is mapped according to a second modulation that includes a second constellation and a corresponding second mapping. That is to say, the various symbols of the LDPC coded modulation signal to be decoded may have different modulations such that different symbols may be mapped according to different constellation shapes having different mappings corresponding thereto.

Alternatively, the various symbols of the LDPC coded modulation signal to be decoded may be mapped according to a singular constellation shape wherein the various symbols having different mappings of the singular constellation shape. As an example, the first modulation may include an 8 PSK (8 Phase Shift Key) shaped constellation whose constellation points are mapped according to the first mapping, and the second modulation may include the same 8 PSK shaped constellation whose constellation points are mapped according to the second mapping (which is different than the first mapping).

The LDPC coded modulation signal that is decoded by the decoder may be a variable code rate signal. For example, a first symbol of the plurality of symbols is encoded according to a first code rate, and a second symbol of the plurality of symbols is encoded according to a second code rate.

The various processing performed within the various functional blocks of the decoder may be performed using min* processing. As some examples, the check node update functional block may calculate the plurality of forward metrics and the plurality of backward metrics that correspond to each symbol of the plurality of mapped symbols by employing min* processing, and the symbol sequence estimate and symbol node update functional block may update the plurality of edges using the estimates of each mapped symbol of the plurality of mapped symbols by employing min* processing.

Such a decoder built according to the invention may be implemented within a variety of types of communication devices that may be implemented within any number of types of communication systems. Some examples of such communications systems may include a satellite communications system, a HDTV (High Definition Television) communication system, a cellular communication system, a and microwave communication system, a point-to-point communication system, a uni-directional communication system, a bi-directional communication system, a one to many communication system, and a fiber optic communication system.

The invention envisions any type of communication devices that supports the functionality and/or processing described herein. Moreover, various types of methods may be performed to support the functionality described herein without departing from the scope and spirit of the invention.

BRIEF DESCRIPTION OF THE SEVERAL VIEWS OF THE DRAWINGS

FIG. 3A and FIG. 3B are system diagrams illustrating embodiment of uni-directional cellular communication systems that are built according to the invention.

FIG. 23A is a diagram illustrating bit decoding using bit metric (shown with respect to an LDPC (Low Density Parity Check) code bipartite graph) according to the invention.

FIG. 23B is a diagram illustrating bit decoding using bit metric updating (shown with respect to an LDPC (Low Density Parity Check) code bipartite graph) according to the invention.

FIG. 24A is a diagram illustrating an LDPC (Low Density Parity Check) coded modulation tripartite graph with symbol nodes connected to bit nodes according to the invention.

FIG. 24B is a diagram illustrating an LDPC (Low Density Parity Check) coded modulation bipartite graph with symbol nodes connected directly to check nodes according to the invention (this bipartite graph is generated from the tripartite graph shown in FIG. 24A).

FIG. 28A is a flowchart illustrating an embodiment of a method for symbol decoding of LDPC coded modulation signals according to the invention.

FIG. 28B is a flowchart illustrating an embodiment of a hybrid decoding method of LDPC coded modulation signals according to the invention.

Gray code map (G-map II) and 1 non-Gray code map (NG-map III) and performs decoding of the LDPC-BICM signal using symbol metric according to the invention.

Figure 38:
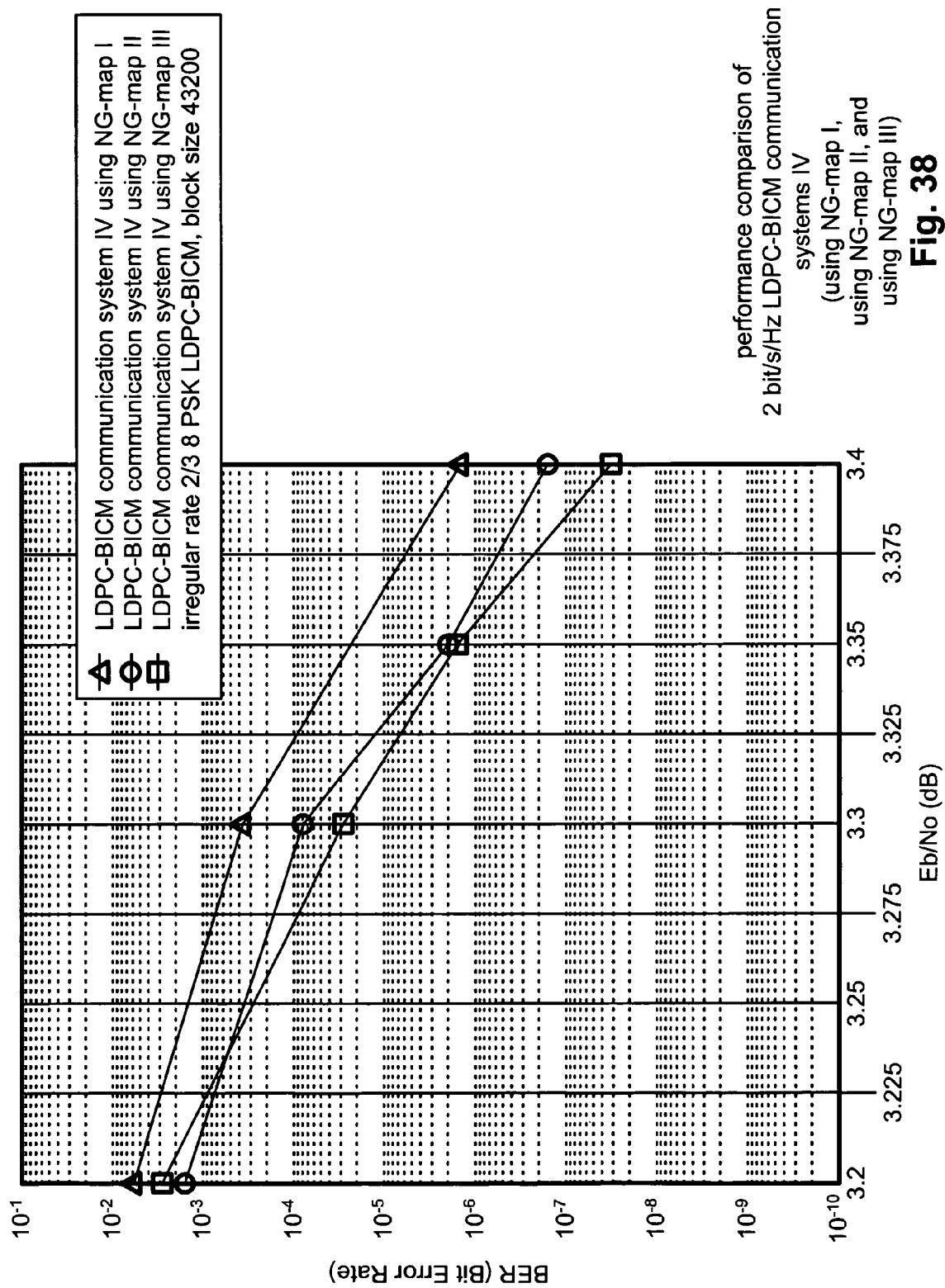

FIG. 38 is a diagram illustrating performance comparison of three alternative embodiments of 2 bit/s/Hz LDPC-BICM communication systems IV (respectively using three possible non-Gray code maps (NG-map I, NG-map II, and NG-map III)) according to the invention.

Figure 39:
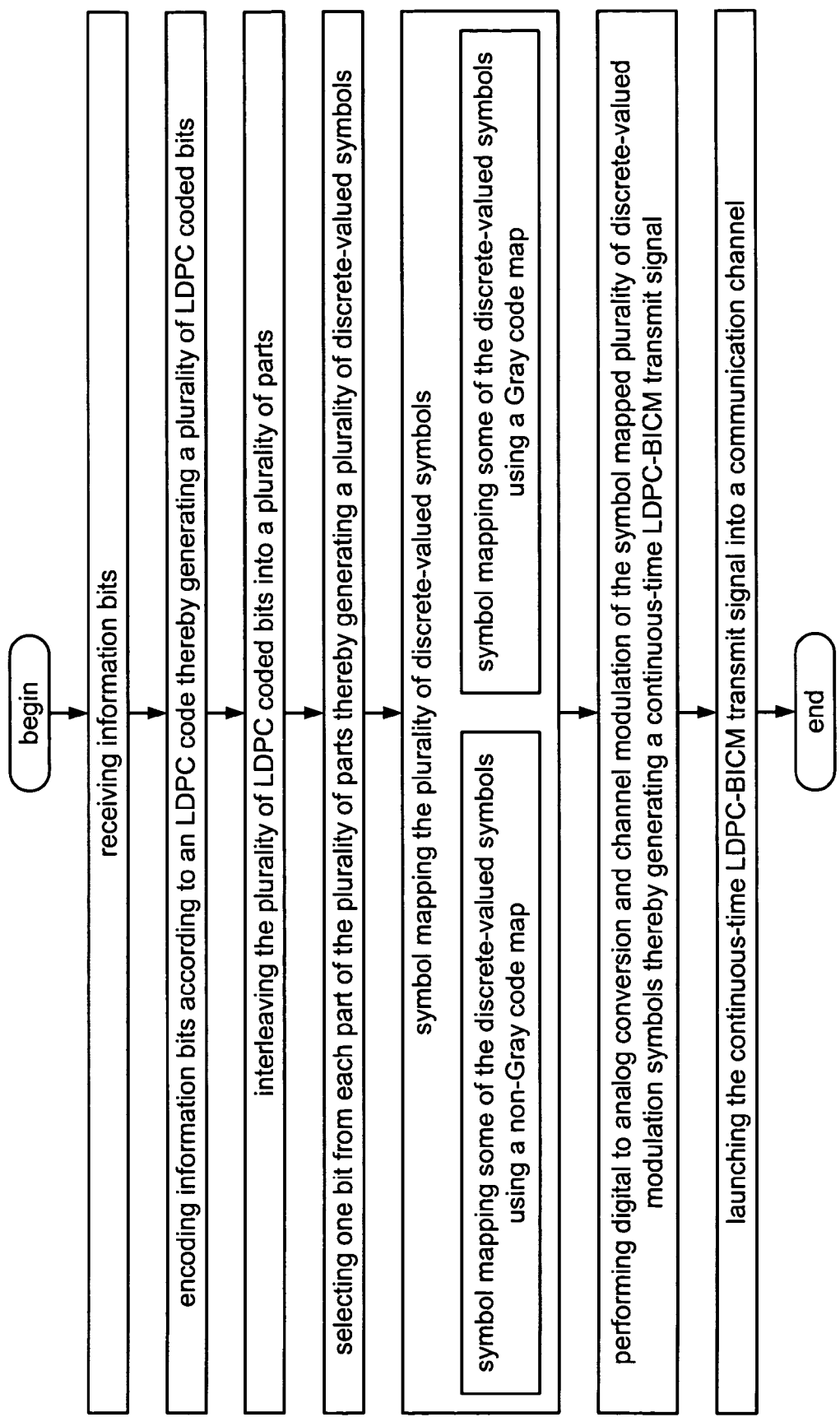

FIG. 39 is a flowchart illustrating an embodiment of a method for generating an LDPC-BICM (Low Density Parity Check-Bit Interleaved Coded Modulation) signal having a non-Gray code mapping according to the invention.

FIG. 40 is a flowchart illustrating an embodiment of a method for symbol decoding of LDPC-BICM signal having a non-Gray code mapping according to the invention.

DETAILED DESCRIPTION OF THE INVENTION

Various aspects of the invention may be found in any number of devices that perform symbol decoding of LDPC (Low Density Parity Check) coded signals that have been generated using non-Gray code mapping. In some instances, the LDPC symbol decoding is performed on signals whose code rate and/or modulation may vary as frequently as on a symbol by symbol basis. Various communication system embodiments in which aspects of the invention may be found may include an encoder and a decoder. Such an encoder may be implemented to perform bit interleaved LDPC coded modulation encoding with non-Gray code mapping, and the LDPC encoding may be performed to generate an LDPC coded signal whose code rate and/or modulation (constellation and mapping) may vary as frequently as on a symbol by symbol basis. Bit interleaved LDPC coded modulation may alternatively be referred to in an acronym format as LDPC-BICM (Low Density Parity Check-Bit Interleaved Coded Modulation).

Such a decoder may be implemented to perform decoding of LDPC coded signals. This LDPC decoding may be implemented to perform symbol decoding within the iterative decoding processing of such an LDPC-BICM signal. In addition, this LDPC decoding may perform LDPC coded modulation symbol decoding of a signal that has been encoded using non-Gray code mapping. Moreover, this LDPC decoding may also be implemented to accommodate decoding processing of an LDPC coded signal whose code rate and/or modulation (constellation and mapping) may vary as frequently as on a symbol by symbol basis.

All prior art communication systems that employ LDPC-BICM signals use Gray code maps to perform the symbol mapping of symbols to their corresponding constellations. Within such prior art communication systems, the main reason that Gray code maps are employed is that the decoding of such LDPC-BICM signals achieves better performance when only bit metric decoding is performed. For example, the prior art approaches to perform decoding of LDPC-BICM signals typically only perform bit level decoding that uses bit metrics. However, in contradistinction, the invention provides for a means to employ multiple mappings when generating an LDPC-BICM signal for use in a communication system. In addition, the invention also provides for a means to perform symbol decoding of such an LDPC-BICM signal. By combining the multiple mapping and symbol decoding functionality, a novel approach is presented by which non-Gray code maps may be used to map symbols when generating an LDPC-BICM signal.

Various embodiments of an LDPC-BICM communication system are presented herein using symbol maps that include a combination of non-Gray code maps with Gray code maps. By also employing symbol decoding of such LDPC-BICM signals that have been generated using non-Gray code mapping, this new communication system is shown to provide for an increase in performance of at least 0.175 dB (decibels) better than a communication system that employs an LDPC-BICM signal that is generated using only a single Gray code map and that is decoded using only bit decoding. Moreover, the new communication system type that is presented herein provides for at least 0.125 dB better performance than a communication system that employs an LDPC-BICM signal that is generated using multiple Gray code maps and that is decoded using only bit decoding. By also combining non-Gray code mapping with Gray code mapping within a communication system that employs an LDPC-BICM signal that is generated using multiple maps (e.g., some of which are Gray code maps and some of which are non-Gray code maps), and by also decoding the generated LDPC-BICM signal using symbol decoding, a performance improvement of at least 0.075 dB is achieved over a communication system that employs an LDPC-BICM signal that is generated using multiple Gray code maps and that is decoded using symbol decoding.

The general operations of some of the various communication systems in which LDPC coded modulation symbol decoding of a signal that has been encoded using non-Gray code mapping are described below within the FIGS. 1-15. Afterwards and in the remaining Figures, greater detail is provided to illustrate the manner in which symbol decoding may be performed on an LDPC-BICM signal that has been encoded with non-Gray code mapping.

Figure 1:
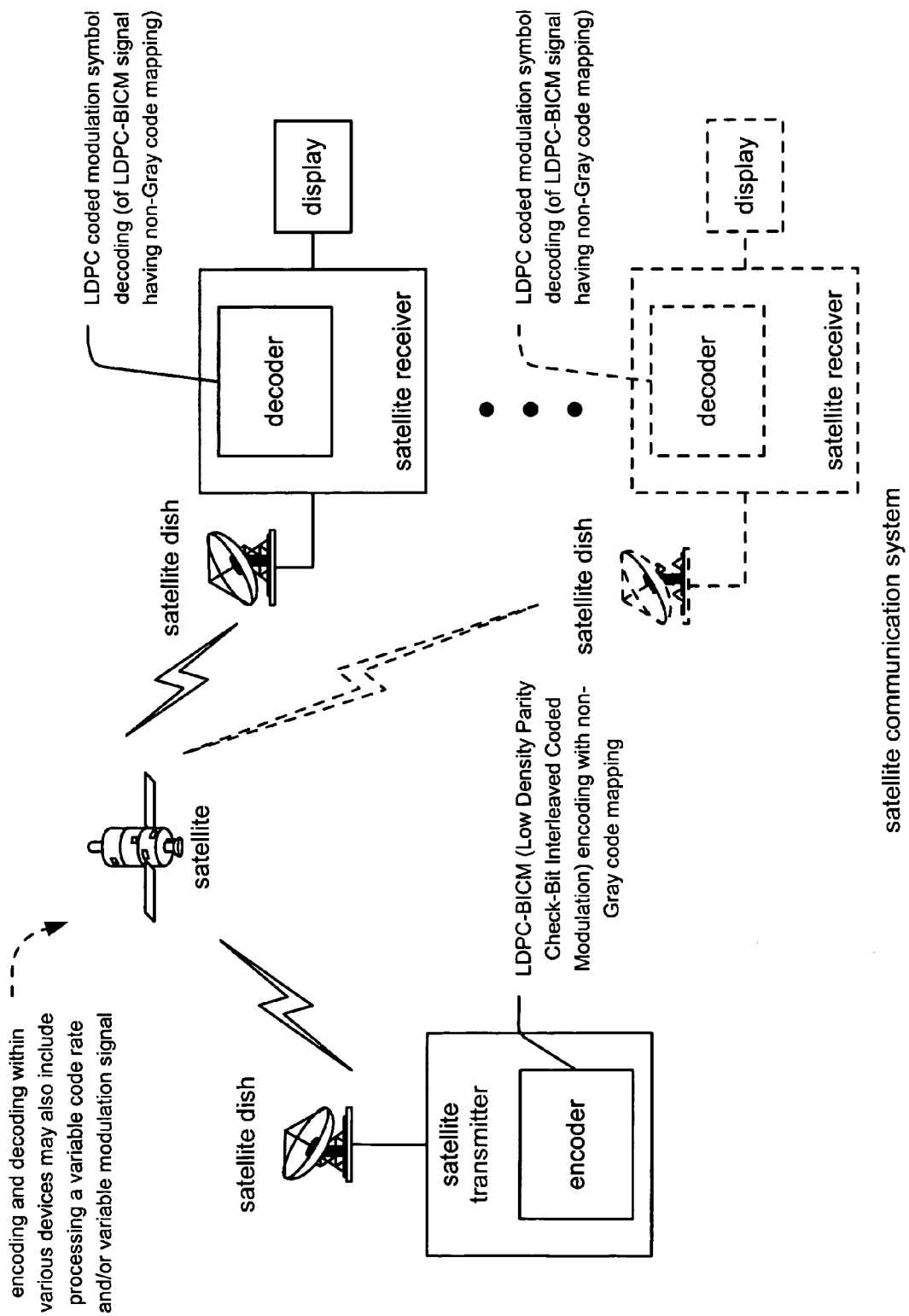
FIG. 1 is a system diagram illustrating an embodiment of a satellite communication system that is built according to the invention.

FIG. 1 is a system diagram illustrating an embodiment of a satellite communication system that is built according to the invention. A satellite transmitter is communicatively coupled to a satellite dish that is operable to communicate with a satellite. The satellite transmitter may also be communicatively coupled to a wired network. This wired network may include any number of networks including the Internet, proprietary networks, other wired networks and/or WANs (Wide Area Networks). The satellite transmitter employs the satellite dish to communicate to the satellite via a wireless communication channel. The satellite is able to communicate with one or more satellite receivers (each having a satellite dish). Each of the satellite receivers may also be communicatively coupled to a display.

Here, the communication to and from the satellite may cooperatively be viewed as being a wireless communication channel, or each of the communication links to and from the satellite may be viewed as being two distinct wireless communication channels.

For example, the wireless communication "channel" may be viewed as not including multiple wireless hops in one embodiment. In other multi-hop embodiments, the satellite receives a signal received from the satellite transmitter (via its satellite dish), amplifies it, and relays it to satellite receiver (via its satellite dish); the satellite receiver may also be implemented using terrestrial receivers such as satellite receivers, satellite based telephones, and/or satellite based Internet receivers, among other receiver types. In the case where the satellite receives a signal received from the satellite transmitter (via its satellite dish), amplifies it, and relays it, the satellite may be viewed as being a "transponder;" this is a multi-hop embodiment. In addition, other satellites may exist that perform both receiver and transmitter operations in cooperation with the satellite. In this case, each leg of an up-down transmission via the wireless communication channel would be considered separately.

In whichever embodiment, the satellite communicates with the satellite receiver. The satellite receiver may be viewed as being a mobile unit in certain embodiments (employing a local antenna); alternatively, the satellite receiver may be viewed as being a satellite earth station that may be communicatively coupled to a wired network in a similar manner in which the satellite transmitter may also be communicatively coupled to a wired network.

The satellite transmitter is operable to encode information (using an encoder) in a manner in accordance with the functionality and/or processing of at least some of the various aspects of the invention to assist in generating a signal that is to be launched into the communication channel coupling the satellite transmitter and the satellite receiver. The satellite receiver is operable to decode a signal (using a decoder) received from the communication channel in a manner in accordance with the functionality and/or processing of at least some of the various aspects of the invention. This diagram shows one embodiment where one or more of the various aspects of the invention may be found.

Figure 2:
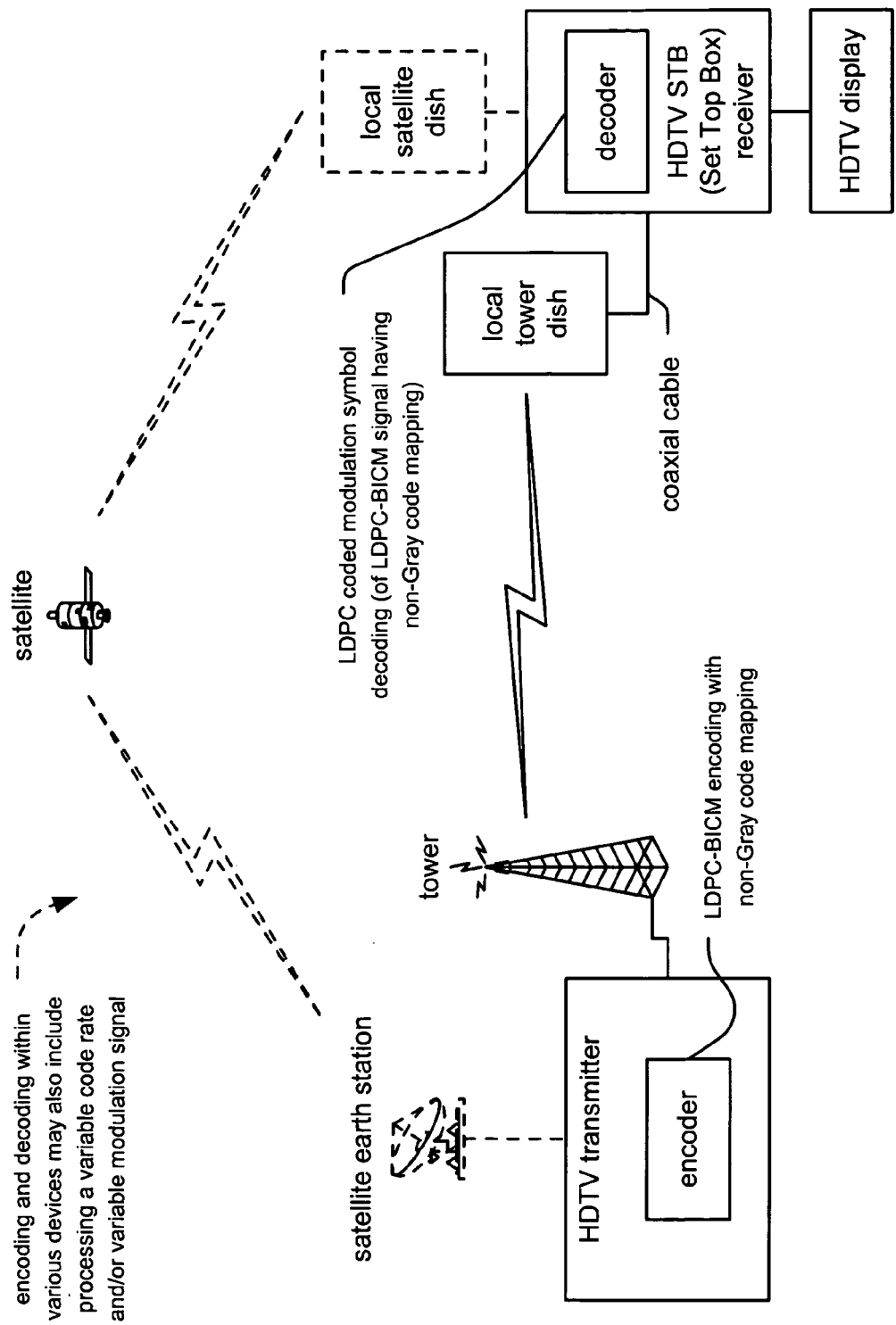
FIG. 2 is a system diagram illustrating an embodiment of an HDTV (High Definition Television) communication system that is built according to the invention.

FIG. 2 is a system diagram illustrating an embodiment of an HDTV (High Definition Television) communication system that is built according to the invention. An HDTV transmitter is communicatively coupled to a tower. The HDTV transmitter, using its tower, transmits a signal to a local tower dish via a wireless communication channel. The local tower dish may communicatively couple to an HDTV STB (Set Top Box) receiver via a coaxial cable. The HDTV STB receiver includes the functionality to receive the wireless transmitted signal that has been received by the local tower dish. This functionality may include any transformation and/or down-converting that may be needed to accommodate for any up-converting that may have been performed before and during transmission of the signal from the HDTV transmitter and its corresponding tower to transform the signal into a format that is compatible with the communication channel across which it is transmitted. For example, certain communication systems step a signal that is to be transmitted from a baseband signal to an IF (Intermediate Frequency) signal, and then to a carrier frequency signal before launching the signal into a communication channel. Alternatively, some communication systems perform a conversion directly from baseband to carrier frequency before launching the signal into a communication channel. In whichever case is employed within the particular embodiment, the HDTV STB receiver is operable to perform any down-converting that may be necessary to transform the received signal to a baseband signal that is appropriate for demodulating and decoding to extract the information there from.

The HDTV STB receiver is also communicatively coupled to an HDTV display that is able to display the demodulated and decoded wireless transmitted signals received by the HDTV STB receiver and its local tower dish. The HDTV transmitter (via its tower) transmits a signal directly to the local tower dish via the wireless communication channel in this embodiment. In alternative embodiments, the HDTV transmitter may first receive a signal from a satellite, using a satellite earth station that is communicatively coupled to the HDTV transmitter, and then transmit this received signal to the local tower dish via the wireless communication channel. In this situation, the HDTV transmitter operates as a relaying element to transfer a signal originally provided by the satellite that is ultimately destined for the HDTV STB receiver. For example, another satellite earth station may first transmit a signal to the satellite from another location, and the satellite may relay this signal to the satellite earth station that is communicatively coupled to the HDTV transmitter. In such a case the HDTV transmitter include transceiver functionality such that it may first perform receiver functionality and then perform transmitter functionality to transmit this received signal to the local tower dish.

In even other embodiments, the HDTV transmitter employs its satellite earth station to communicate to the satellite via a wireless communication channel. The satellite is able to communicate with a local satellite dish; the local satellite dish communicatively couples to the HDTV STB receiver via a coaxial cable. This path of transmission shows yet another communication path where the HDTV STB receiver may communicate with the HDTV transmitter.

In whichever embodiment and by whichever signal path the HDTV transmitter employs to communicate with the HDTV STB receiver, the HDTV STB receiver is operable to receive communication transmissions from the HDTV transmitter and to demodulate and decode them appropriately.

The HDTV transmitter is operable to encode information (using an encoder) in a manner in accordance with the functionality and/or processing of at least some of the various aspects of the invention to assist in generating a signal that is to be launched into the communication channel coupling the HDTV transmitter and the HDTV STB receiver. The HDTV STB receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

FIG. 3A and FIG. 3B are system diagrams illustrating embodiments of uni-directional cellular communication systems that are built according to the invention.

Referring to the FIG. 3A, a mobile transmitter includes a local antenna communicatively coupled thereto. The mobile transmitter may be any number of types of transmitters including a one way cellular telephone, a wireless pager unit, a mobile computer having transmission functionality, or any other type of mobile transmitter. The mobile transmitter transmits a signal, using its local antenna, to a cellular tower via a wireless communication channel. The cellular tower is communicatively coupled to a base station receiver; the receiving tower is operable to receive data transmission from the local antenna of the mobile transmitter that has been communicated via the wireless communication channel. The cellular tower communicatively couples the received signal to the base station receiver.

The mobile transmitter is operable to encode information (using an encoder) in a manner in accordance with the functionality and/or processing of at least some of the various aspects of the invention to assist in generating a signal that is to be launched into the communication channel coupling the mobile transmitter and the base station receiver. The base station receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Referring to the FIG. 3B, a base station transmitter includes a cellular tower communicatively coupled thereto. The base station transmitter, using its cellular tower, transmits a signal to a mobile receiver via a communication channel. The mobile receiver may be any number of types of receivers including a one-way cellular telephone, a wireless pager unit, a mobile computer having receiver functionality, or any other type of mobile receiver. The mobile receiver is communicatively coupled to a local antenna; the local antenna is operable to receive data transmission from the cellular tower of the base station transmitter that has been communicated via the wireless communication channel. The local antenna communicatively couples the received signal to the mobile receiver.

The base station transmitter is operable to encode information (using an encoder) in a manner in accordance with the functionality and/or processing of at least some of the various aspects of the invention to assist in generating a signal that is to be launched into the communication channel coupling the base station transmitter and the mobile receiver. The mobile receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 4:
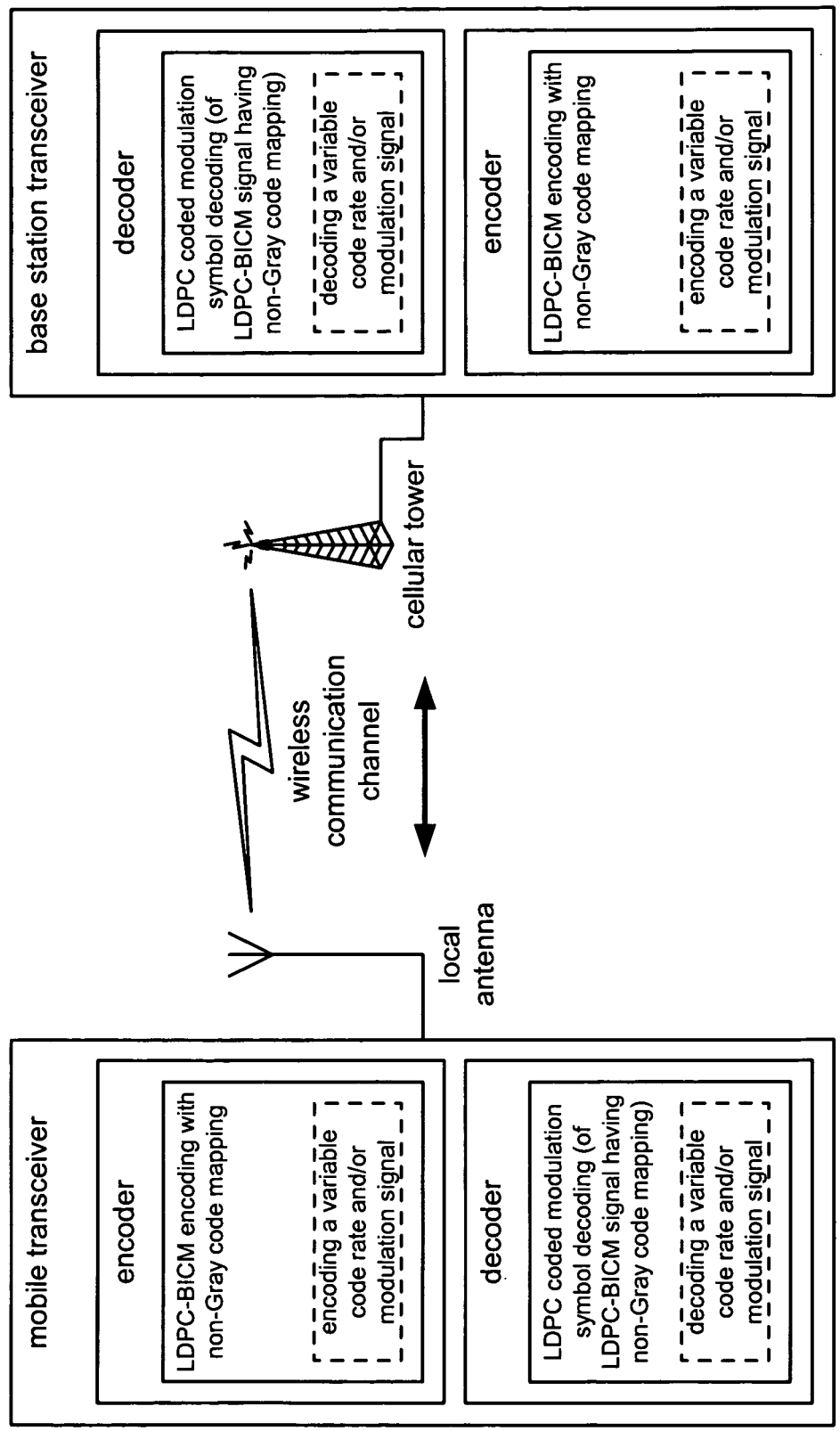
FIG. 4 is a system diagram illustrating an embodiment of a bi-directional cellular communication system that is built according to the invention.

FIG. 4 is a system diagram illustrating an embodiment of a bi-directional cellular communication system, built according to the invention, where the communication can go to and from the base station transceiver and to and from the mobile transceiver via the wireless communication channel.

Referring to the FIG. 4, a base station transceiver includes a cellular tower communicatively coupled thereto. The base station transceiver, using its cellular tower, transmits a signal to a mobile transceiver via a communication channel. The reverse communication operation may also be performed. The mobile transceiver is able to transmit a signal to the base station transceiver as well. The mobile transceiver may be any number of types of transceivers including a cellular telephone, a wireless pager unit, a mobile computer having transceiver functionality, or any other type of mobile transceiver. The mobile transceiver is communicatively coupled to a local antenna; the local antenna is operable to receive data transmission from the cellular tower of the base station transceiver that has been communicated via the wireless communication channel. The local antenna communicatively couples the received signal to the mobile transceiver.

The base station transceiver is operable to encode information (using its corresponding encoder) that is to be transmitted to the mobile transceiver. The mobile transceiver is operable to decode the transmitted signal (using its corresponding decoder). Similarly, mobile transceiver is operable to encode information (using its corresponding encoder) that is to be transmitted to the base station transceiver; the base station transceiver is operable to decode the transmitted signal (using its corresponding decoder).

As within other embodiments that employ an encoder and a decoder, the encoder of either of the base station transceiver or the mobile transceiver may be implemented to encode information (using its corresponding encoder) in a manner in accordance with the functionality and/or processing of at least some of the various aspects of the invention to assist in generating a signal that is to be launched into the communication channel coupling the base station transceiver and the mobile transceiver. The decoder of either of the base station transceiver or the mobile transceiver may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 5:
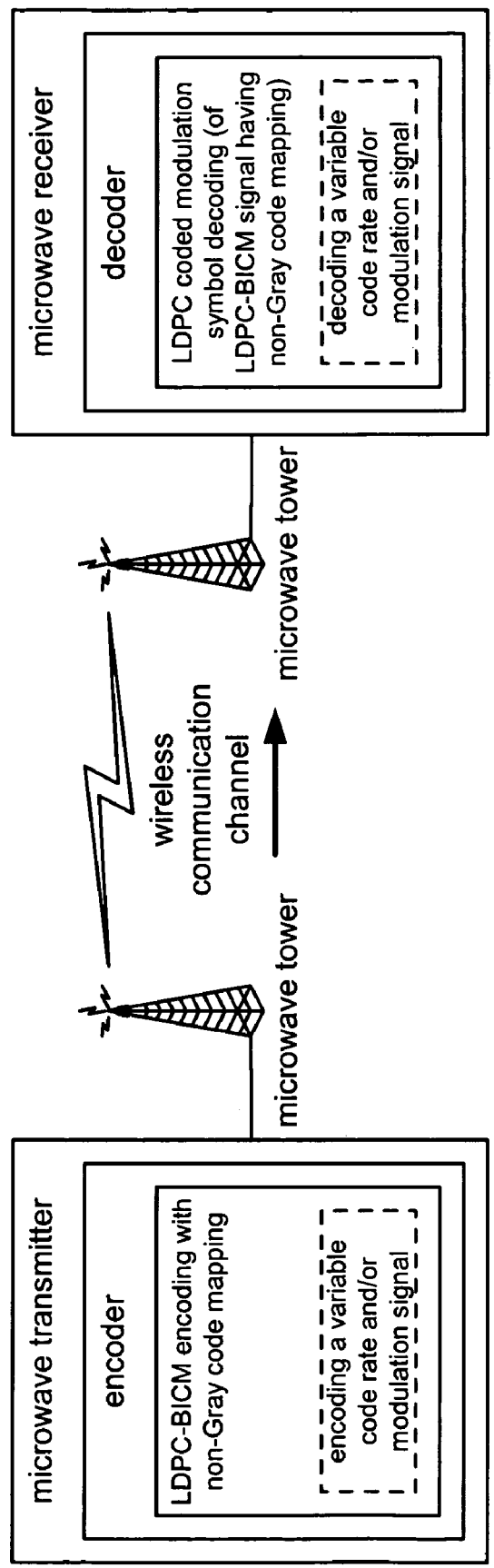
FIG. 5 is a system diagram illustrating an embodiment of a uni-directional microwave communication system that is built according to the invention.

FIG. 5 is a system diagram illustrating an embodiment of a uni-directional microwave communication system that is built according to the invention. A microwave transmitter is communicatively coupled to a microwave tower. The microwave transmitter, using its microwave tower, transmits a signal to a microwave tower via a wireless communication channel. A microwave receiver is communicatively coupled to the microwave tower. The microwave tower is able to receive transmissions from the microwave tower that have been communicated via the wireless communication channel.

The microwave transmitter is operable to encode information (using an encoder) in a manner in accordance with the functionality and/or processing of at least some of the various aspects of the invention to assist in generating a signal that is to be launched into the communication channel coupling the microwave transmitter and the microwave receiver. The microwave receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 6:
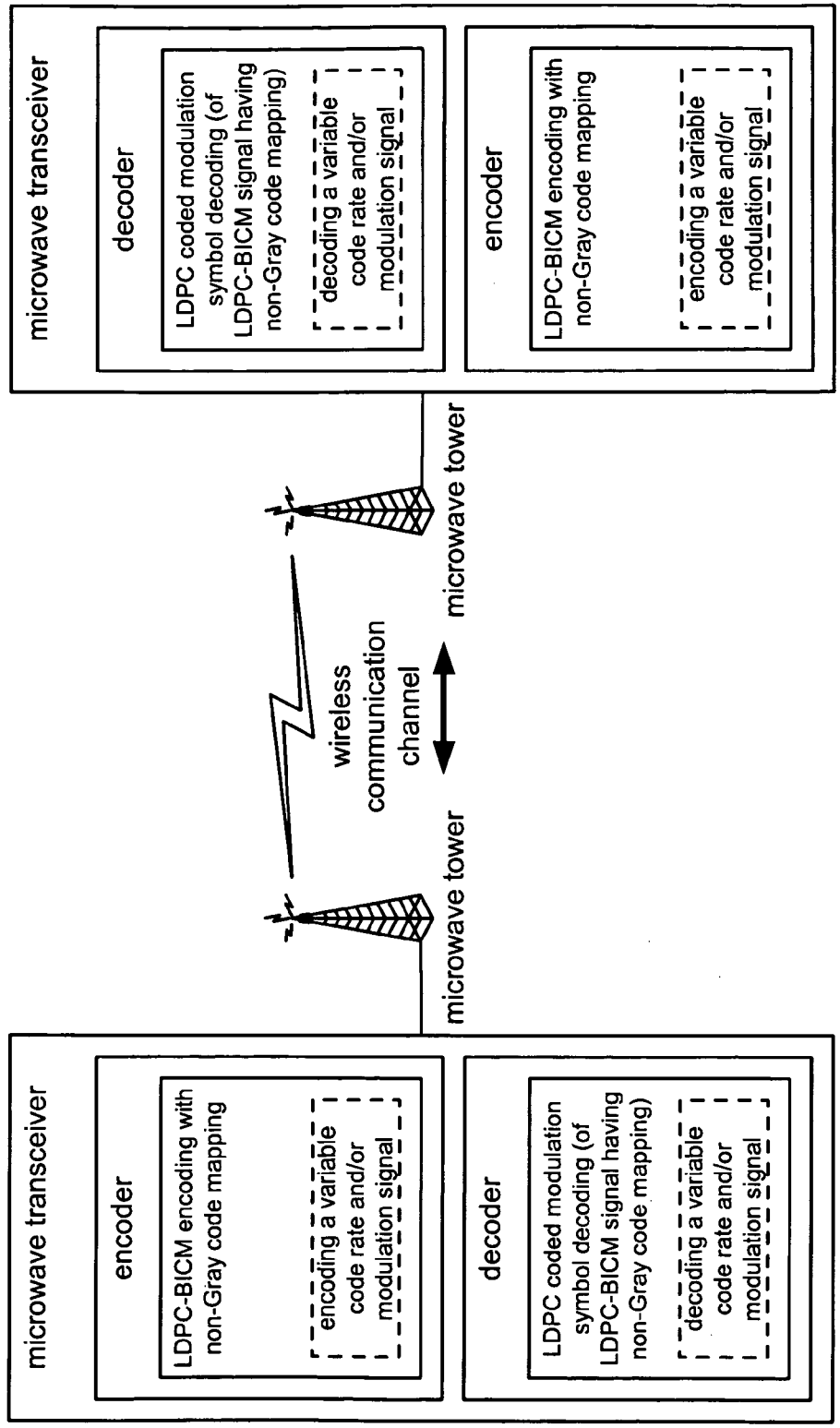
FIG. 6 is a system diagram illustrating an embodiment of a bi-directional microwave communication system that is built according to the invention.

FIG. 6 is a system diagram illustrating an embodiment of a bi-directional microwave communication system that is built according to the invention. Within the FIG. 6, a first microwave transceiver is communicatively coupled to a first microwave tower. The first microwave transceiver, using the first microwave tower (the first microwave transceiver's microwave tower), transmits a signal to a second microwave tower of a second microwave transceiver via a wireless communication channel. The second microwave transceiver is communicatively coupled to the second microwave tower (the second microwave transceiver's microwave tower). The second microwave tower is able to receive transmissions from the first microwave tower that have been communicated via the wireless communication channel. The reverse communication operation may also be performed using the first and second microwave transceivers.

Each of the microwave transceivers is operable to encode information (using its corresponding encoder) that is to be transmitted the other microwave transceiver. Each microwave transceiver is operable to decode the transmitted signal (using its corresponding decoder) that it receives. Each of the microwave transceivers includes an encoder and a decoder.

As within other embodiments that employ an encoder and a decoder, the encoder of either of the microwave transceivers may be implemented to encode information (using its corresponding encoder) in a manner in accordance with the functionality and/or processing of at least some of the various aspects of the invention to assist in generating a signal that is to be launched into the communication channel coupling the microwave transceivers. The decoder of either of the microwave transceivers may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 7:
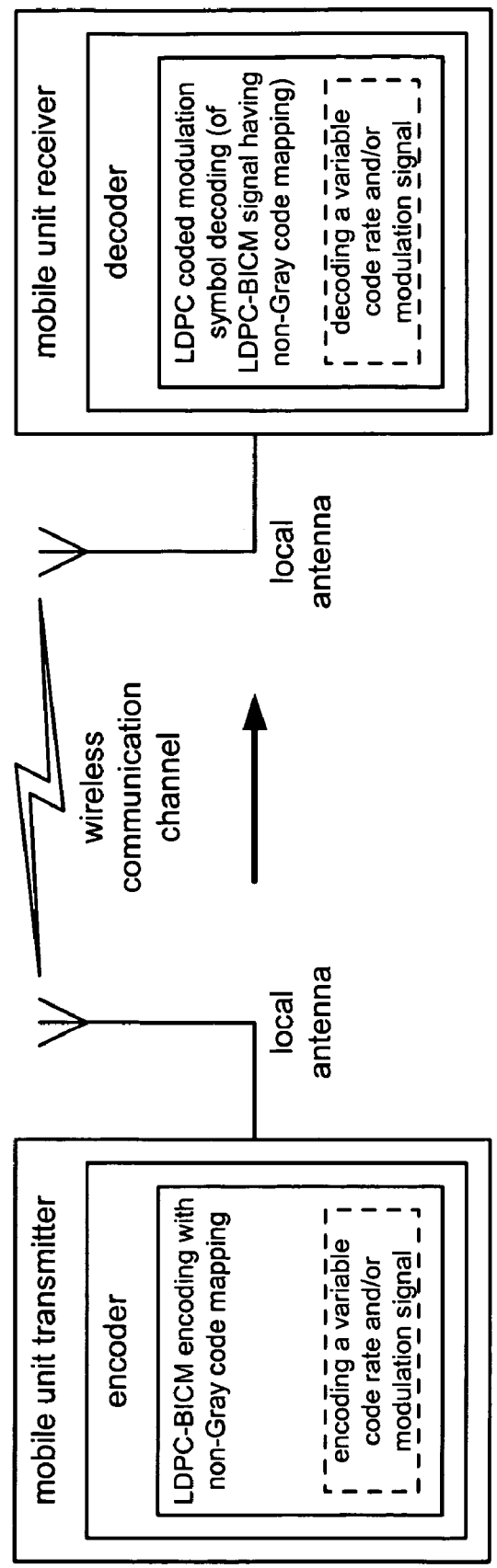
FIG. 7 is a system diagram illustrating an embodiment of a uni-directional point-to-point radio communication system that is built according to the invention.

FIG. 7 is a system diagram illustrating an embodiment of a uni-directional point-to-point radio communication system, built according to the invention, where the communication goes from a mobile unit transmitter to a mobile unit receiver via the wireless communication channel.

A mobile unit transmitter includes a local antenna communicatively coupled thereto. The mobile unit transmitter, using its local antenna, transmits a signal to a local antenna of a mobile unit receiver via a wireless communication channel.

The mobile unit transmitter is operable to encode information (using an encoder) in a manner in accordance with the functionality and/or processing of at least some of the various aspects of the invention to assist in generating a signal that is to be launched into the communication channel coupling the mobile unit transmitter and the mobile unit receiver. The mobile unit receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 8:
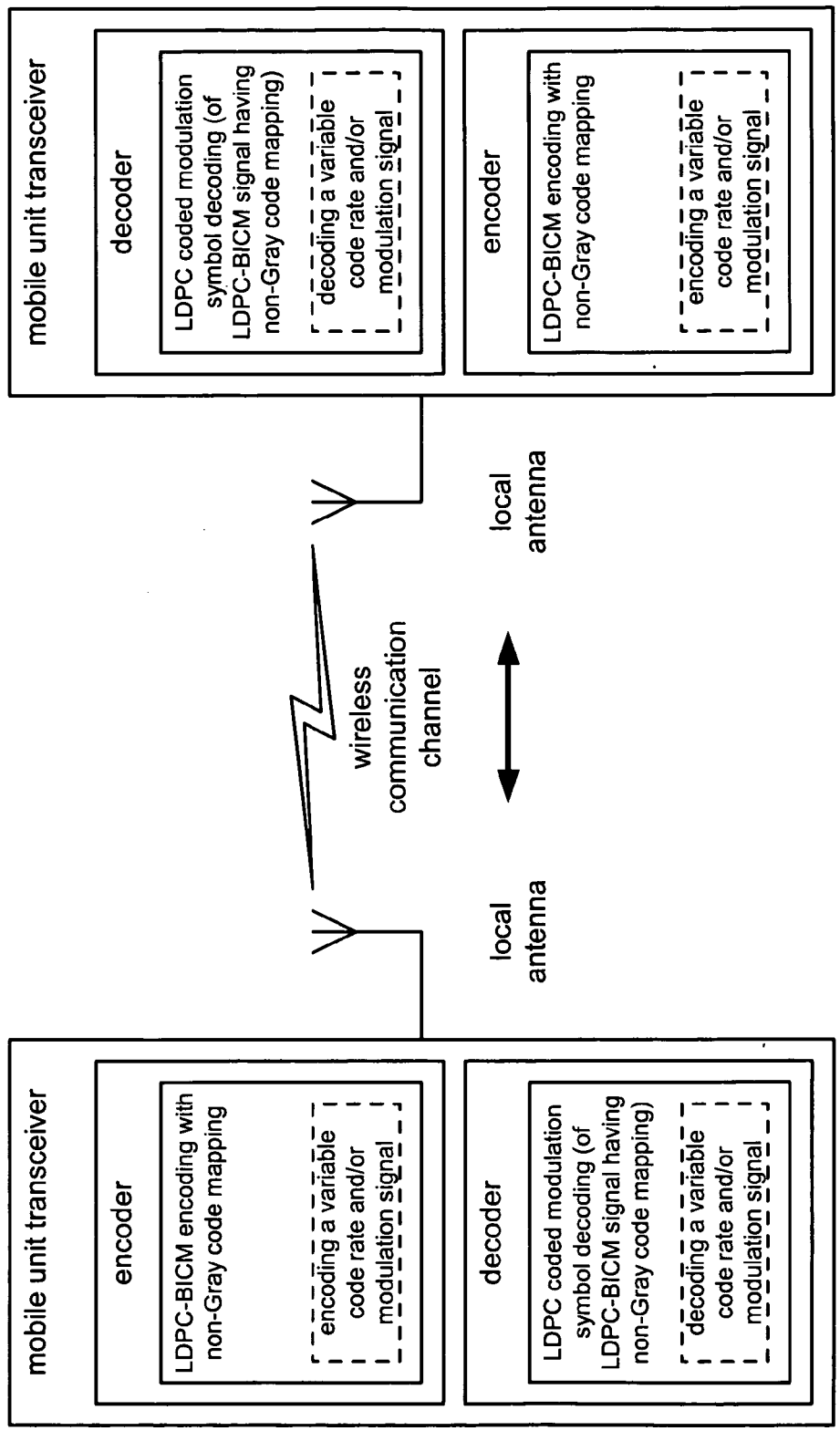
FIG. 8 is a system diagram illustrating an embodiment of a bi-directional point-to-point radio communication system that is built according to the invention.

FIG. 8 is a system diagram illustrating an embodiment of a bi-directional point-to-point radio communication system that is built according to the invention. A first mobile unit transceiver is communicatively coupled to a first local antenna. The first mobile unit transceiver, using the first local antenna (the first mobile unit transceiver's local antenna), transmits a signal to a second local antenna of a second mobile unit transceiver via a wireless communication channel. The second mobile unit transceiver is communicatively coupled to the second local antenna (the second mobile unit transceiver's local antenna). The second local antenna is able to receive transmissions from the first local antenna that have been communicated via the communication channel. The reverse communication operation may also be performed using the first and second mobile unit transceivers.

Each of the mobile unit transceivers is operable to encode information (using its corresponding encoder) that is to be transmitted the other mobile unit transceiver. Each mobile unit transceiver is operable to decode the transmitted signal (using its corresponding decoder) that it receives. Each of the mobile unit transceivers includes an encoder and a decoder.

As within other embodiments that employ an encoder and a decoder, the encoder of either of the mobile unit transceivers may be implemented to encode information (using its corresponding encoder) in a manner in accordance with the functionality and/or processing of at least some of the various aspects of the invention to assist in generating a signal that is to be launched into the communication channel coupling the mobile unit transceivers. The decoder of either of the mobile unit transceivers may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 9:
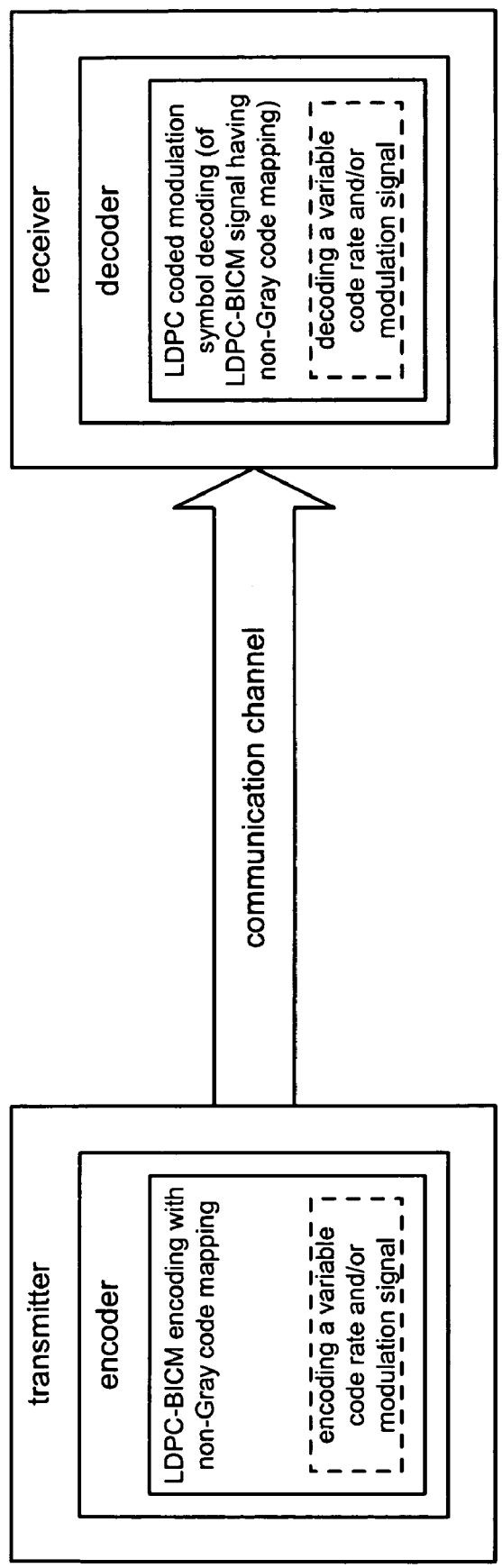
FIG. 9 is a system diagram illustrating an embodiment of a uni-directional communication system that is built according to the invention.

FIG. 9 is a system diagram illustrating an embodiment of a uni-directional communication system that is built according to the invention. A transmitter communicates to a receiver via a uni-directional communication channel. The uni-directional communication channel may be a wireline (or wired) communication channel or a wireless communication channel without departing from the scope and spirit of the invention. The wired media by which the uni-directional communication channel may be implemented are varied, including coaxial cable, fiber-optic cabling, and copper cabling, among other types of "wiring." Similarly, the wireless manners in which the uni-directional communication channel may be implemented are varied, including satellite communication, cellular communication, microwave communication, and radio communication, among other types of wireless communication.

The transmitter is operable to encode information (using an encoder) in a manner in accordance with the functionality and/or processing of at least some of the various aspects of the invention to assist in generating a signal that is to be launched into the communication channel coupling the transmitter and the receiver. The receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 10:
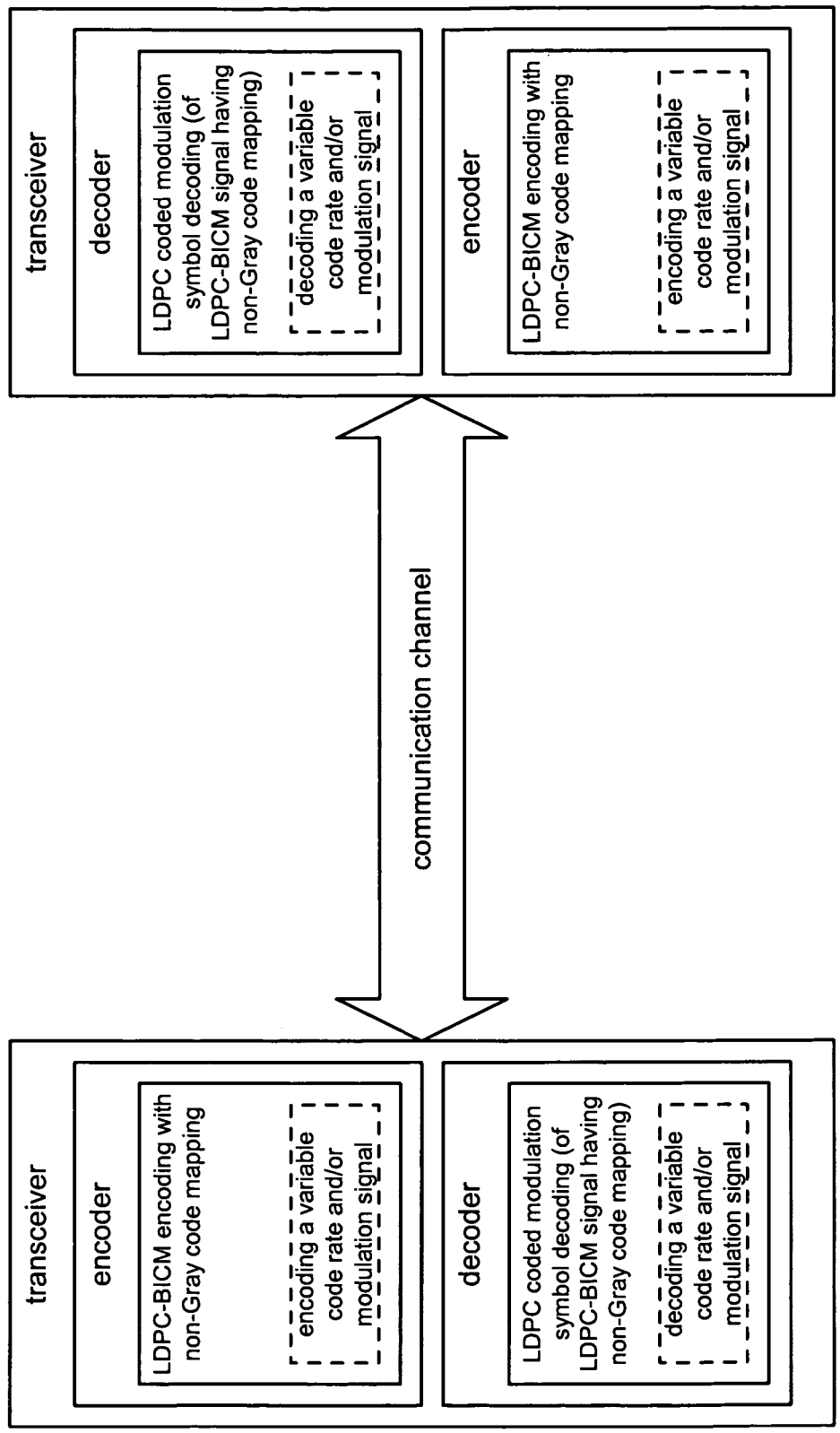
FIG. 10 is a system diagram illustrating an embodiment of a bi-directional communication system that is built according to the invention.

FIG. 10 is a system diagram illustrating an embodiment of a bi-directional communication system that is built according to the invention. A first transceiver is communicatively coupled to a second transceiver via a bi-directional communication channel. The bi-directional communication channel may be a wireline (or wired) communication channel or a wireless communication channel without departing from the scope and spirit of the invention. The wired media by which the bi-directional communication channel may be implemented are varied, including coaxial cable, fiber-optic cabling, and copper cabling, among other types of "wiring." Similarly, the wireless manners in which the bi-directional communication channel may be implemented are varied, including satellite communication, cellular communication, microwave communication, and radio communication, among other types of wireless communication.

Each of the transceivers is operable to encode information (using its corresponding encoder) that is to be transmitted the other transceiver. Each transceiver is operable to decode the transmitted signal (using its corresponding decoder) that it receives. Each of the transceivers includes an encoder and a decoder.

As within other embodiments that employ an encoder and a decoder, the encoder of either of the transceivers may be implemented to encode information (using its corresponding encoder) in a manner in accordance with the functionality and/or processing of at least some of the various aspects of the invention to assist in generating a signal that is to be launched into the communication channel coupling the transceivers. The decoder of either of the transceivers may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 11:
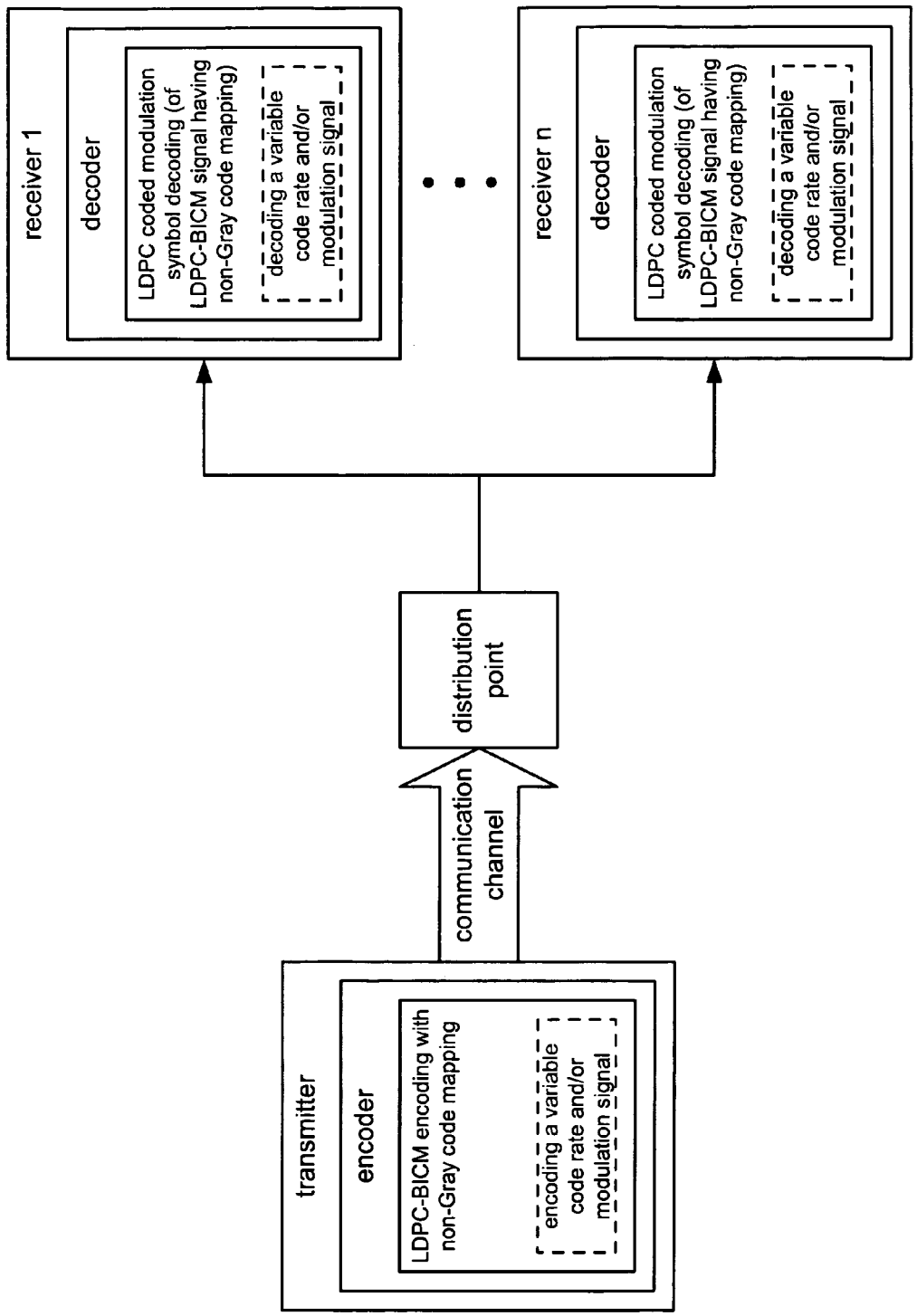
FIG. 11 is a system diagram illustrating an embodiment of a one to many communication system that is built according to the invention.

FIG. 11 is a system diagram illustrating an embodiment of a one to many communication system that is built according to the invention. A transmitter is able to communicate, via broadcast in certain embodiments, with a number of receivers, shown as receivers 1, . . . , n via a uni-directional communication channel. The uni-directional communication channel may be a wireline (or wired) communication channel or a wireless communication channel without departing from the scope and spirit of the invention. The wired media by which the communication channel may be implemented are varied, including coaxial cable, fiber-optic cabling, and copper cabling, among other types of "wiring."

Similarly, the wireless manners in which the communication channel may be implemented are varied, including satellite communication, cellular communication, microwave communication, and radio communication, among other types of wireless communication.

A distribution point is employed within the one to many communication system to provide the appropriate communication to the receivers 1, . . . , and n. In certain embodiments, the receivers 1, . . . , and n each receive the same communication and individually discern which portion of the total communication is intended for them.

The transmitter is operable to encode information (using an encoder) in a manner in accordance with the functionality and/or processing of at least some of the various aspects of the invention to assist in generating a signal that is to be launched into the communication channel coupling the transmitter and the receivers 1, . . . , and n. Each of the receivers 1, . . . , and n is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 12:
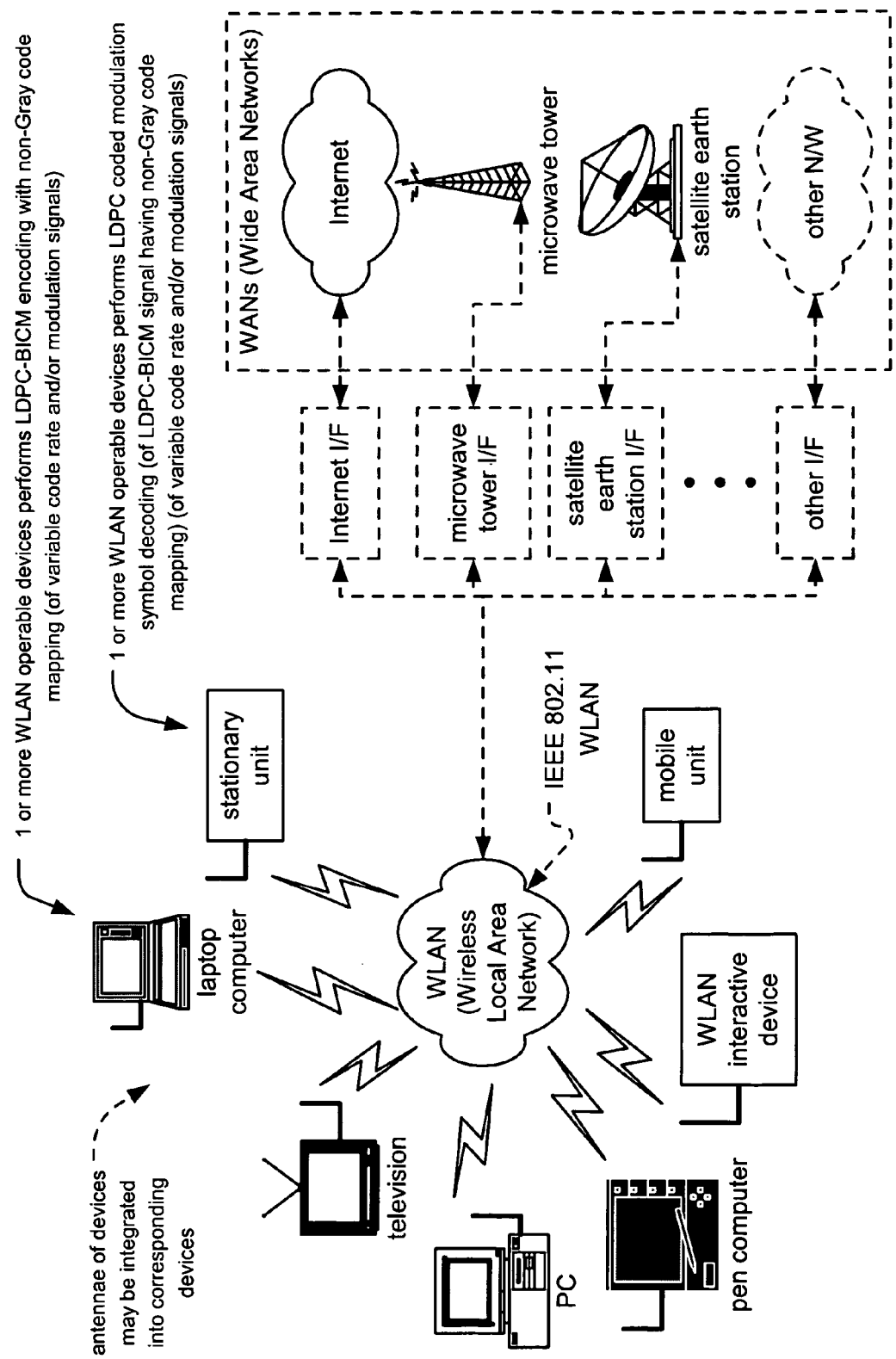
FIG. 12 is a diagram illustrating an embodiment of a WLAN (Wireless Local Area Network) that may be implemented according to the invention.

FIG. 12 is a diagram illustrating an embodiment of a WLAN (Wireless Local Area Network) communication system that may be implemented according to the invention. The WLAN communication system may be implemented to include a number of devices that are all operable to communicate with one another via the WLAN. For example, the various devices that each include the functionality to interface with the WLAN may include any 1 or more of a laptop computer, a television, a PC (Personal Computer), a pen computer (that may be viewed as being a PDA (Personal Digital Assistant) in some instances, a personal electronic planner, or similar device), a mobile unit (that may be viewed as being a telephone, a pager, or some other mobile WLAN operable device), and/or a stationary unit (that may be viewed as a device that typically resides in a single location within the WLAN). The antennae of any of the various WLAN interactive devices may be integrated into the corresponding devices without departing from the scope and spirit of the invention as well.

This illustrated group of devices that may interact with the WLAN is not intended to be an exhaustive list of devices that may interact with a WLAN, and a generic device shown as a WLAN interactive device represents any communication device that includes the functionality in order to interactive with the WLAN itself and/or the other devices that are associated with the WLAN. Any one of these devices that associate with the WLAN may be viewed generically as being a WLAN interactive device without departing from the scope and spirit of the invention. Each of the devices and the WLAN interactive device may be viewed as being located at nodes of the WLAN.

It is also noted that the WLAN itself may also include functionality to allow interfacing with other networks as well. These external networks may generically be referred to as WANs (Wide Area Networks). For example, the WLAN may include an Internet I/F (interface) that allows for interfacing to the Internet itself. This Internet I/F may be viewed as being a base station device for the WLAN that allows any one of the WLAN interactive devices to access the Internet.

It is also noted that the WLAN may also include functionality to allow interfacing with other networks (e.g., other WANs) besides simply the Internet. For example, the WLAN may include a microwave tower I/F that allows for interfacing to a microwave tower thereby allowing communication with one or more microwave networks. Similar to the Internet I/F described above, the microwave tower I/F may be viewed as being a base station device for the WLAN that allows any one of the WLAN interactive devices to access the one or more microwave networks via the microwave tower.

Moreover, the WLAN may include a satellite earth station I/F that allows for interfacing to a satellite earth station thereby allowing communication with one or more satellite networks. The satellite earth station I/F may be viewed as being a base station device for the WLAN that allows any one of the WLAN interactive devices to access the one or more satellite networks via the satellite earth station I/F.

This finite listing of various network types that may interface to the WLAN is also not intended to be exhaustive. For example, any other network may communicatively couple to the WLAN via an appropriate I/F that includes the functionality for any one of the WLAN interactive devices to access the other network.

Any of the various WLAN interactive devices described within this embodiment may include an encoder and a decoder to allow bi-directional communication with the other WLAN interactive device and/or the WANs. Again, as within other embodiments that includes bi-directional communication devices having an encoder and a decoder, the encoder of any of these various WLAN interactive devices may be implemented to encode information (using its corresponding encoder) in a manner in accordance with the functionality and/or processing of at least some of the various aspects of the invention to assist in generating a signal that is to be launched into the communication channel that couples to another WLAN interactive device. The decoder of any of the various WLAN interactive devices may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

In general, any one of the WLAN interactive devices may be characterized as being an IEEE (Institute of Electrical & Electronics Engineers) 802.11 operable device. For example, such an 802.11 operable device may be an 802.11a operable device, an 802.11b operable device, or an 802.11g operable device. Sometimes, an IEEE 802.11 operable device is operable to communicate according to more than one of the standards (e.g., both 802.11a and 802.11g in one instance). The IEEE 802.11g specification extends the rates for packet transmission in the 2.4 GHz (Giga-Hertz) frequency band. This is achieved by allowing packets, also known as frames, of two distinct types to coexist in this band. Frames utilizing DSSS/CCK (Direct Sequence Spread Spectrum with Complementary Code Keying) have been specified for transmission in the 2.4 GHz band at rates up to 11 Mbps (Mega-bits per second) as part of the 802.11b standard. The 802.11a standard uses a different frame format with OFDM (Orthogonal Frequency Division Multiplexing) to transmit at rates up to 54 Mbps with carrier frequencies in the 5 GHz range. The 802.11g specification allows for such OFDM frames to coexist with DSSS/CCK frames at 2.4 GHz.

Figure 13:
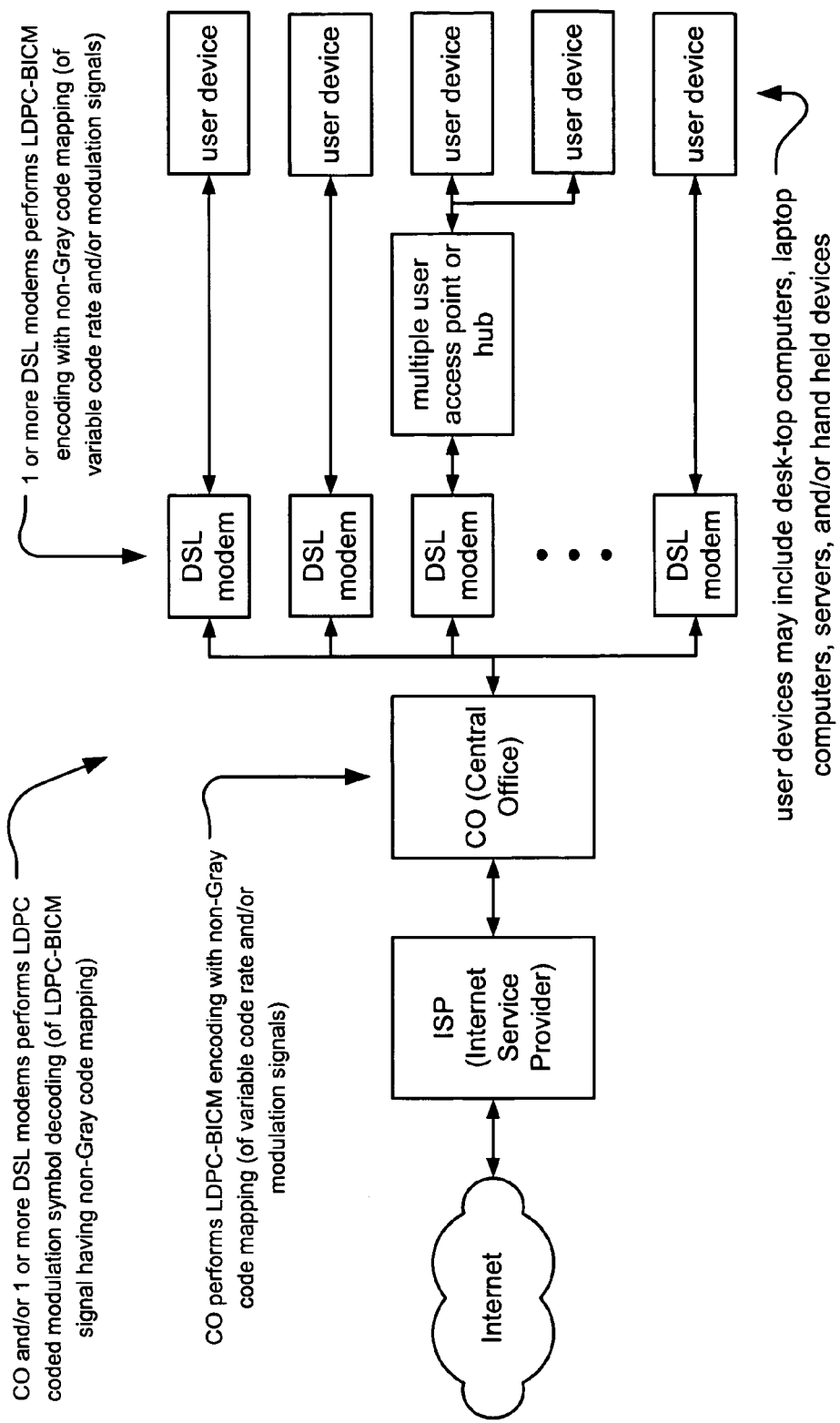
FIG. 13 is a diagram illustrating an embodiment of a DSL (Digital Subscriber Line) communication system that may be implemented according to the invention.

FIG. 13 is a diagram illustrating an embodiment of a DSL (Digital Subscriber Line) communication system that may be implemented according to the invention. The DSL communication system includes an interfacing to the Internet (or some other WAN). In this diagram, the Internet itself is shown, but other WANs may also be employed without departing from the scope and spirit of the invention. An ISP (Internet Service Provider) is operable to communicate data to and from the Internet. The ISP communicatively couples to a CO (Central Office) that is typically operated by a telephone services company. The CO may also allow for the providing of telephone services to one or more subscribers. However, the CO may also be implemented to allow interfacing of Internet traffic to and from one or more users (whose interactive devices are shown as user devices). These user devices may be any device within a wide variety of devices including desk-top computers, laptop computers, servers, and/or hand held devices without departing from the scope and spirit of the invention. Any of these user devices may be wired or wireless type devices as well. Each of the user devices is operably coupled to the CO via a DSL modem. The DSL modem may also be communicatively coupled to a multiple user access point or hub to allow more than one user device to access the Internet.

The CO and the various DSL modems may also be implemented to include an encoder and a decoder to allow bi-directional communication therein. For example, the CO is operable to encode and decode data when communicating to and from the various DSL modems and the ISP. Similarly, each of the various DSL modems is operable to encode and decode data when communicating to and from the CO and its respective one or more user devices.

As within other embodiments that employ an encoder and a decoder, the encoder of any of the CO and the various DSL modems may be implemented to encode information (using its corresponding encoder) in a manner in accordance with the functionality and/or processing of at least some of the various aspects of the invention to assist in generating a signal that is to be launched into the communication channel coupling the CO and the various DSL modems. The decoder of any of the CO and the various DSL modems may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 14:
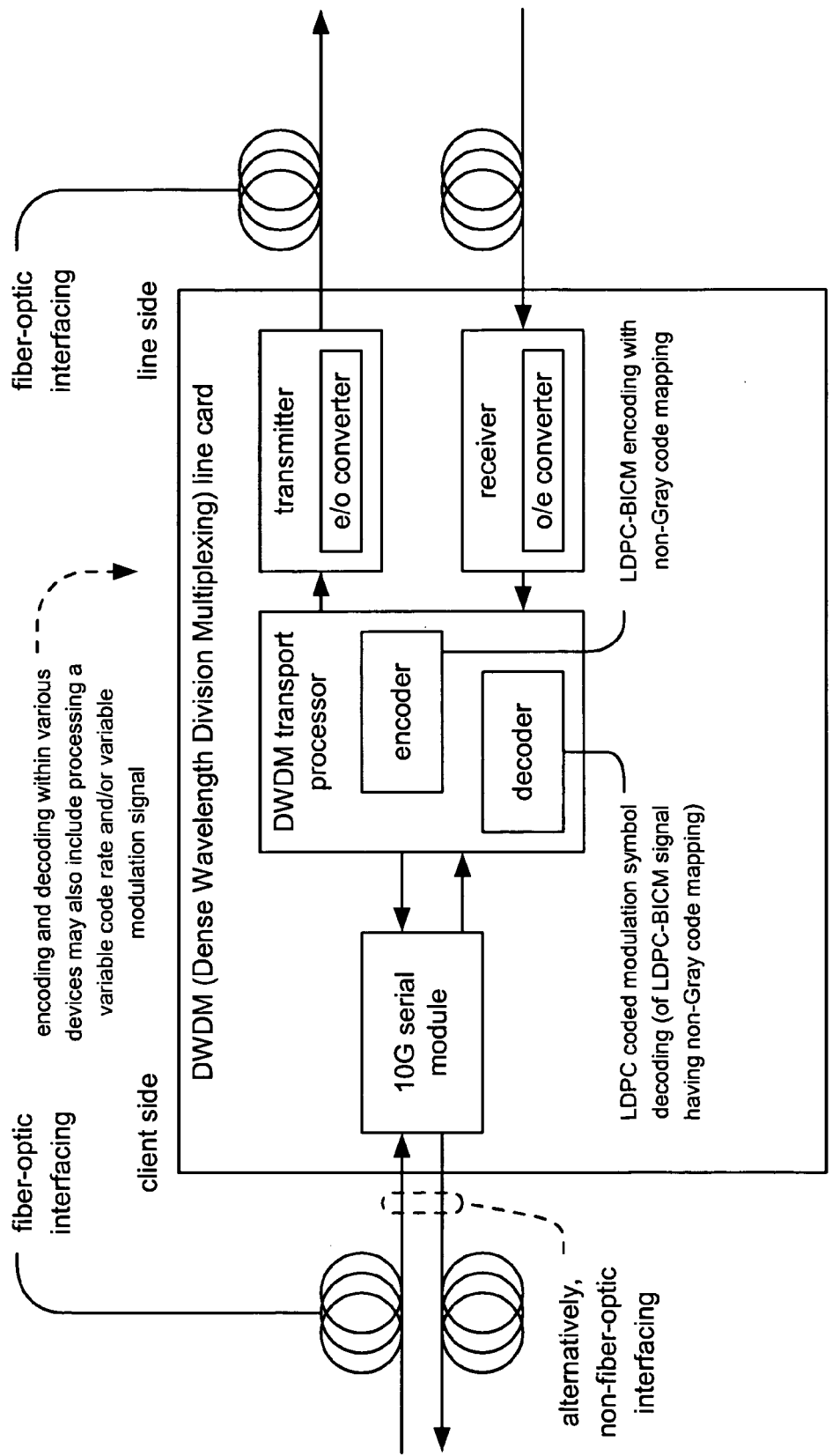
FIG. 14 is a system diagram illustrating an embodiment of a fiber-optic communication system that is built according to the invention.

FIG. 14 is a system diagram illustrating an embodiment of a fiber-optic communication system that is built according to the invention. The fiber-optic communication system includes a DWDM (Dense Wavelength Division Multiplexing, within the context of fiber optic communications) line card that is interposed between a line side and a client side. DWDM is a technology that has gained increasing interest recently. From both technical and economic perspectives, the ability to provide potentially unlimited transmission capacity is the most obvious advantage of DWDM technology. The current investment already made within fiber-optic infrastructure can not only be preserved when using DWDM, but it may even be optimized by a factor of at least 32. As demands change, more capacity can be added, either by simple equipment upgrades or by increasing the number of wavelengths (lambdas) on the fiber-optic cabling itself, without expensive upgrades. Capacity can be obtained for the cost of the equipment, and existing fiber plant investment is retained. From the bandwidth perspective, some of the most compelling technical advantages of DWDM can be summarized as follows:

1. The transparency of DWDM: Because DWDM is a PHY (physical layer) architecture, it can transparently support both TDM (Time Division Multiplexing) and data formats such as ATM (Asynchronous Transfer Mode), Gigabit Ethernet, ESCON (Enterprise System CONnection), and Fibre Channel with open interfaces over a common physical layer.

2. The scalability of DWDM: DWDM can leverage the abundance of dark fiber in many metropolitan area and enterprise networks to quickly meet demand for capacity on point-to-point links and on spans of existing SONET/SDH (Synchronous Optical NETwork)/(Synchronous Digital Hierarchy) rings.

3. The dynamic provisioning capabilities of DWDM: the fast, simple, and dynamic provisioning of network connections give providers the ability to provide high-bandwidth services in days rather than months.

Fiber-optic interfacing is employed at each of the client and line sides of the DWDM line card. The DWDM line card includes a transport processor that includes functionality to support DWDM long haul transport, DWDM metro transport, next-generation SONET/SDH multiplexers, digital cross-connects, and fiber-optic terminators and test equipment. On the line side, the DWDM line card includes a transmitter, that is operable to perform electrical to optical conversion for interfacing to an optical medium, and a receiver, that is operable to perform optical to electrical conversion for interfacing from the optical medium. On the client side, the DWDM line card includes a 10G serial module that is operable to communicate with any other devices on the client side of the fiber-optic communication system using a fiber-optic interface. Alternatively, the interface may be implemented using non-fiber-optic media, including copper cabling and/or some other type of interface medium.

The DWDM transport processor of the DWDM line card includes a decoder that is used to decode received signals from either one or both of the line and client sides and an encoder that is used to encode signals to be transmitted to either one or both of the line and client sides.

As within other embodiments that employ an encoder and a decoder, the encoder is operable to encode information in a manner in accordance with the functionality and/or processing of at least some of the various aspects of the invention to assist in generating a signal that is to be launched into the communication channel to which the DWDM line card is coupled. The decoder is operable to decode a signal received from the communication channel in a manner in accordance with the functionality and/or processing of at least some of the various aspects of the invention. This diagram shows yet another embodiment where one or more of the various aspects of the invention may be found.

Figure 15:
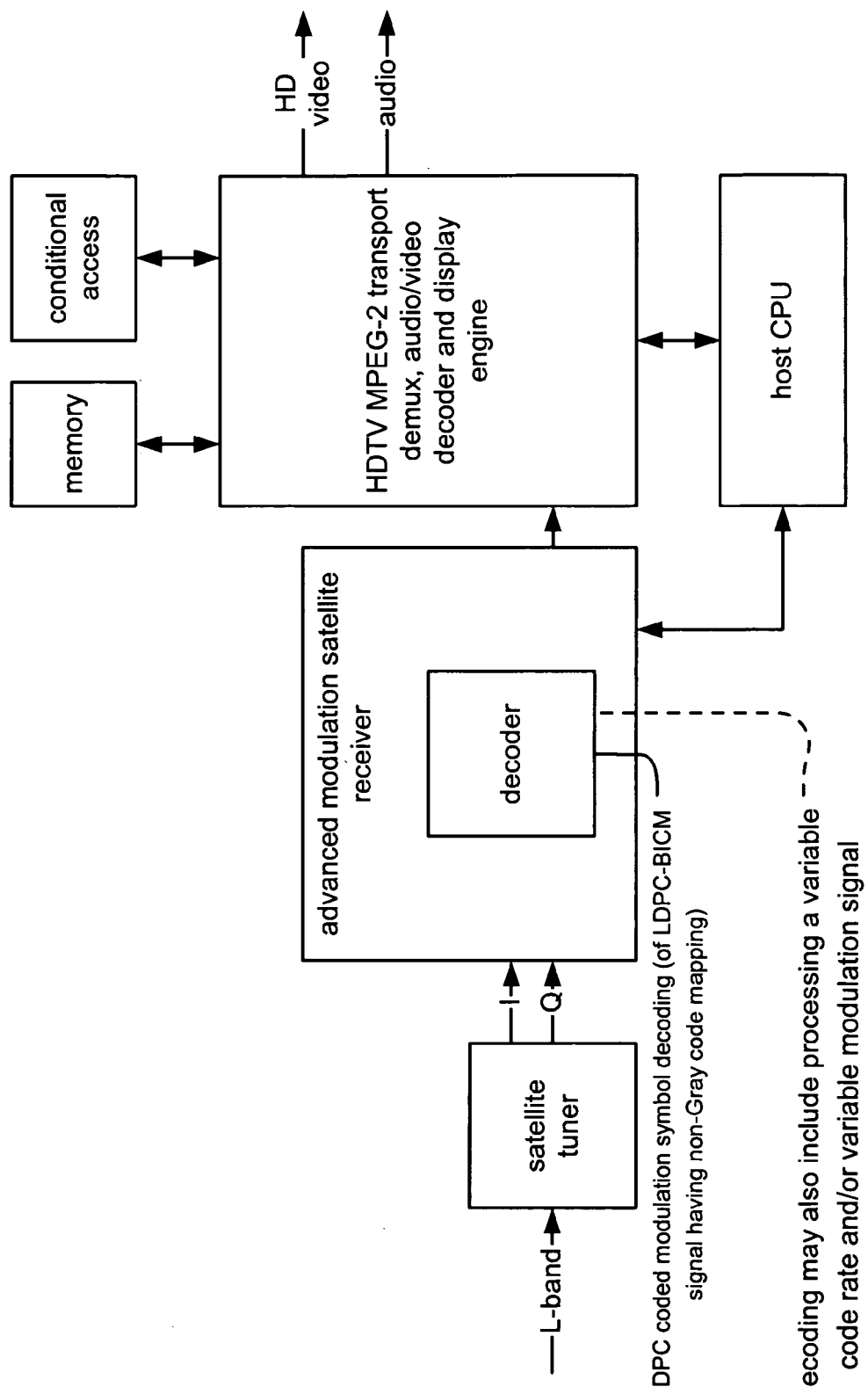
FIG. 15 is a system diagram illustrating an embodiment of a satellite receiver STB (Set Top Box) system that is built according to the invention.

FIG. 15 is a system diagram illustrating an embodiment of a satellite receiver STB (Set Top Box) system that is built according to the invention. The satellite receiver STB system includes an advanced modulation satellite receiver that is implemented in an all digital architecture. Moreover the advanced modulation satellite receiver may be implemented within a single integrated circuit in some embodiments. The satellite receiver STB system includes a satellite tuner that receives a signal via the L-band (e.g., within the frequency range between 390-1550 MHz (Mega-Hertz) in the ultrahigh radio frequency range). The satellite tuner extracts I, Q (In-phase, Quadrature) components from a signal received from the L-band and provides them to the advanced modulation satellite receiver. The advanced modulation satellite receiver includes a decoder.

As within other embodiments that employ a decoder, the decoder is operable to decode a signal received from a communication channel to which the advanced modulation satellite receiver is coupled in a manner in accordance with the functionality and/or processing of at least some of the various aspects of the invention. This diagram shows yet another embodiment where one or more of the various aspects of the invention may be found.

The advanced modulation satellite receiver may be implemented to communicatively couple to an HDTV MPEG-2 (Motion Picture Expert Group, level 2) transport de-mux, audio/video decoder and display engine. The advanced modulation satellite receiver and the HDTV MPEG-2 transport de-mux, audio/video decoder and display engine communicatively couple to a host CPU (Central Processing Unit). The HDTV MPEG-2 transport de-mux, audio/video decoder and display engine also communicatively couples to a memory module and a conditional access functional block. The HDTV MPEG-2 transport de-mux, audio/video decoder and display engine provides HD (High Definition) video and audio output that may be provided to an HDTV display.

The advanced modulation satellite receiver may be implemented as a single-chip digital satellite receiver supporting the decoder that operates in a manner in accordance with the functionality and/or processing of at least some of the various aspects of the invention. The advanced modulation satellite receiver is operable to receive communication provided to it from a transmitter device that includes an encoder as well.

In addition, several of the following Figures describe particular embodiments that may be used to implement some of the various aspects of processing bit interleaved LDPC coded modulation signals (or LDPC-BICM signals) that have been generated using non-Gray code mapping according to the invention. Several details of these various aspects are provided below. Initially, a general description of LDPC codes is provided.

Figure 16:
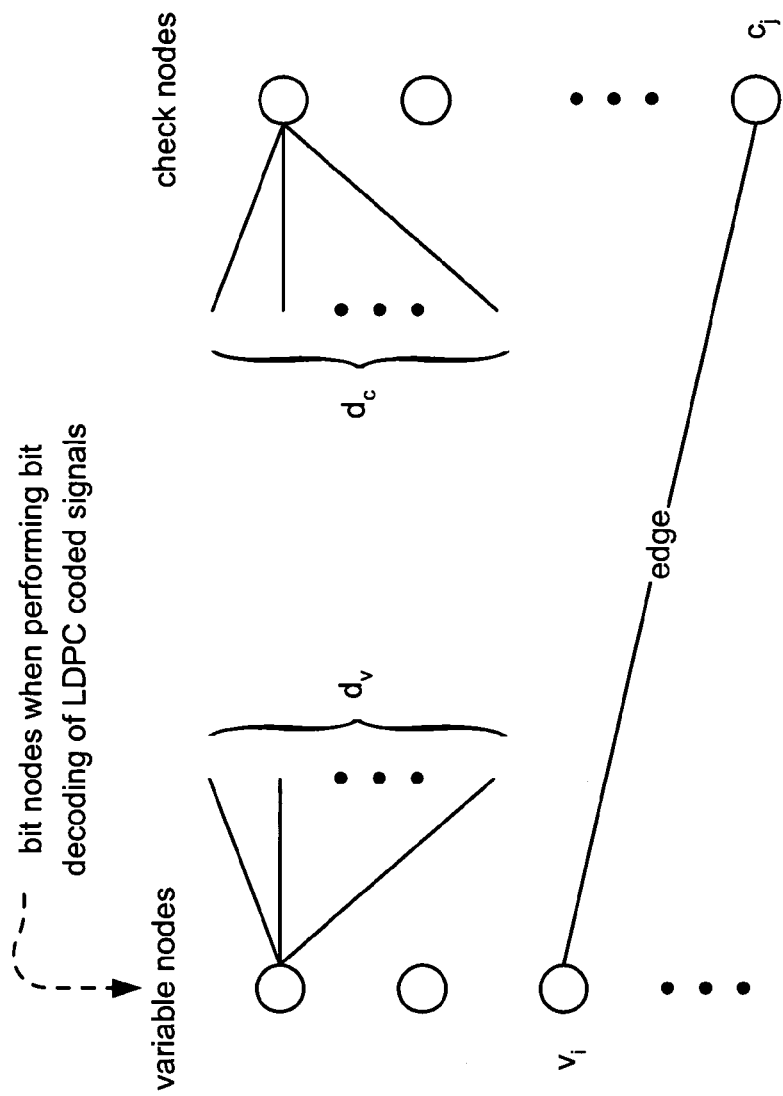
FIG. 16 is a diagram illustrating an embodiment of an LDPC (Low Density Parity Check) code bipartite graph.

FIG. 16 is a diagram illustrating an embodiment of an LDPC (Low Density Parity Check) code bipartite graph. An LDPC code may be viewed as being a code having a binary parity check matrix such that nearly all of the elements of the matrix have values of zeros (e.g., the binary parity check matrix is sparse). For example, $H=(h_{i,j})_{M \times N}$ may be viewed as being a parity check matrix of an LDPC code with block length N. If every column of the matrix has $d_v$ 1's, and every row of the matrix has $d_c$ 1's, then this code is referred to as a $(d_v,d_c)$ regular LDPC code. For example, a regular (4,72) LDPC code would be viewed as being a code whose binary parity check matrix would have 4 1's in every column and 72 1's in every row. These regular LDPC codes were introduced in R. Gallager, *Low-Density Parity-Check Codes*, Cambridge, Mass.: MIT Press, 1963.

A regular LDPC code can be represented as a bipartite graph by its parity check matrix with left side nodes representing variable of the code bits, and the right side nodes representing check equations. The bipartite graph of the code defined by H may be defined by N variable nodes and M check nodes. Every variable node of the N variable nodes has exactly $d_v$ edges connecting this node to one or more of the check nodes (within the M check nodes). This number of $d_v$ edges may be referred to as the degree of a variable node. Analogously, every check node of the M check nodes has exactly $d_c$ edges connecting this node to one or more of the variable nodes. This number of $d_c$ edges may be referred to as the degree of a check node.

An edge between a variable node $v_i$ and check node $c_j$ may be defined by $e=(i,j)$. However, on the other hand, given an edge $e=(i,j)$, the nodes of the edge may alternatively be denoted as by $e=(v(e),c(e))$. Given a variable node $v_i$, one may define the set of edges emitting from the node $v_i$ by $E_v(i)=\{e|v(e)=i\}$. Given a check node $c_j$, one may define the set of edges emitting from the node $c_j$ by $E_c(j)=\{e|c(e)=j\}$. Continuing on, the derivative result will be $|E_v(i)|=d_v$ and $|E_c(j)|=d_c$.

An irregular LDPC code may also be described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby, M. Mitzenmacher. M. A. Shokrollahi, D. A. Spielman, and V. Stemann, "Practical Loss-Resilient Codes", *Proc. 29th Symp. on Theory of Computing*, 1997, pp. 150-159.

In general, with a graph of an LDPC code, the parameters of an LDPC code can be defined by a degree of distribution, as described within M. Lugy, et al. (referenced above) and also within T. J. Richardson and R. L. Urbanke, "The capacity of low-density parity-check code under message-passing decoding,'" *IEEE Trans. Inform. Theory*, Vol. 47, pp. 599-618, February 2001. This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that the invention is also operable to accommodate both regular LDPC codes and irregular LDPC codes.

The LLR (Log-Likelihood Ratio) decoding of LDPC codes may be described as follows: the probability that a bit within a received vector in fact has a value of 1 when a 1 was actually transmitted is calculated. Similarly, the probability that a bit within a received vector in fact has a value of 0 when a 0 was actually transmitted is calculated. These probabilities are calculated using the LDPC code that is use to check the parity of the received vector. The LLR is the logarithm of the ratio of these two calculated probabilities. This LLR will give a measure of the degree to which the communication channel over which a signal is transmitted may undesirably affect the bits within the vector.

The LLR decoding of LDPC codes may be described mathematically as follows:

Beginning with $C=\{v|v=(v_0, \ldots, v_{N-1}), vH^T=0\}$ being an LDPC code and viewing a received vector, $y=(y_0, \ldots, y_{N-1})$, with the sent signal having the form of $((-1)^{v_0}, \ldots, (-1)^{v_{N-1}})$, then the metrics of the channel may be defined as $p(y_i|v_i=0)$, $p(y_i|v_i=1), i=0, \ldots, N-1$. The LLR of a metric will then be defined as follows:

$$L_{metric}(i) = \ln \frac{p(y_i \mid v_i = 0)}{p(y_i \mid v_i = 1)}$$

For every variable node $v_i$, its LLR information value will then be defined as follows:

$$\ln \frac{(v_i = 0 \mid y_i)}{(v_i = 1 \mid y_i)} = L_{metric}(i) + \ln \frac{p(v_i = 0)}{p(v_i = 1)}$$

Since the variable node, $v_i$, is in a codeword, then the value of the ratio of these, $\ln \frac{p(v_i = 0)}{p(v_i = 1)}$, may be replaced by the following $$\ln \frac{p(v_i = 0, vH^T = 0 \mid y)}{p(v_i = 1, vH^T = 0 \mid y)} = \sum_{(i,j) \in E_v(i)} \ln \frac{p(v_i = 0, vh_j^T = 0 \mid y)}{p(v_i = 1, vh_j^T = 0 \mid y)}$$

where $E_v(i)$ is a set of edges starting with $v_i$ as defined above.

When performing the BP (Belief Propagation) decoding approach in this context, then the value of $$\ln \frac{p(v_i = 0, vh_j^T = 0 \mid y)}{p(v_i = 1, vh_j^T = 0 \mid y)}$$

may be replaced by the following relationship $$L_{check}(i, j) = \ln \frac{p\left(\sum_{(e \in E_c(j) \setminus \{(i,j)\})} v_{v(e)} = 0 \mid y\right)}{p\left(\sum_{(e \in E_c(j) \setminus \{(i,j)\})} v_{v(e)} = 1 \mid y\right)}$$

$L_{check}(i,j)$ is called the EXT (extrinsic) information of the check node $c_j$ with respect to the edge $(i,j)$. In addition, it is noted that $e \in E_c(j) \setminus \{(i,j)\}$ indicates all of the edges emitting from check node $c_j$ except for the edge that emits from the check node $c_j$ to the variable node $v_i$. Extrinsic information values may be viewed as those values that are calculated to assist in the generation of best estimates of actual bit values within a received vector. Also in a BP approach, then the extrinsic information of the variable node $v_i$ with respect to the edge $(i,j)$ may be defined as follows:

$$L_{var}(i, j) = L_{metric}(i) + \sum_{(i,k) \in E_v(i) \setminus \{(i,j)\}} L_{check}(i, k).$$

From certain perspectives, the invention may be implemented within communication systems that involve combining modulation coding with LDPC coding to generate LDPC coded modulation signals. These LDPC coded modulation signals may be such that they have a code rate and/or modulation (constellation and mapping) that varies as frequently as on a symbol by symbol basis. Up to now, there have been some attempts to combine modulation encoding with LDPC coding, yet they are all limited to employing only a single code rate or modulation (constellation and mapping) symbols generated thereby. Nevertheless, some of the possible approaches to combine modulation coding and LDPC coding are described below. In addition, various approaches by which symbol decoding of LDPC coded modulation signals that have been encoded using non-Gray code maps are also presented.

Figure 17A:
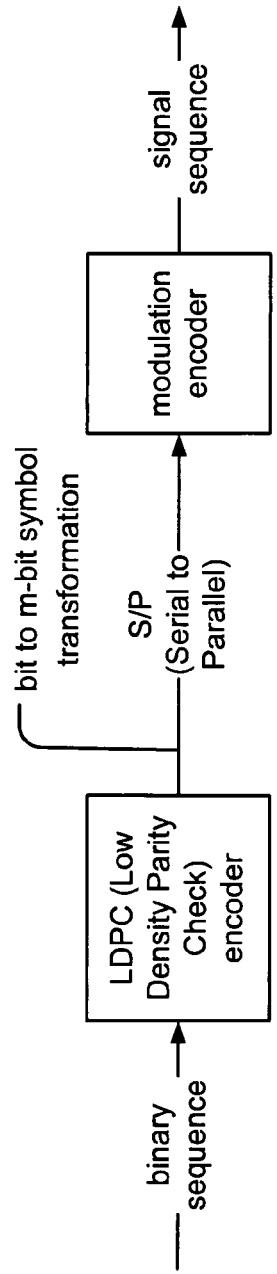
FIG. 17A is a diagram illustrating an embodiment of direct combining of LDPC (Low Density Parity Check) coding and modulation encoding.

FIG. 17A is a diagram illustrating an embodiment of direct combining of LDPC (Low Density Parity Check) coding and modulation encoding. A binary sequence (e.g., a bit stream) is provided to an LDPC (Low Density Parity Check) encoder. The LDPC encoder introduces a degree of redundancy (or parity) within the bit sequence provided thereto. These LDPC coded bits are then provided to a S/P (Serial to Parallel) path such that the output symbols may be provided to a modulation encoder. This S/P path performs the bit to m-bit symbol transformation. The modulation encoder outputs a signal sequence that includes symbols (composed of LDPC coded bits) that correspond to a modulation having a constellation and a mapping.

Figure 17B:
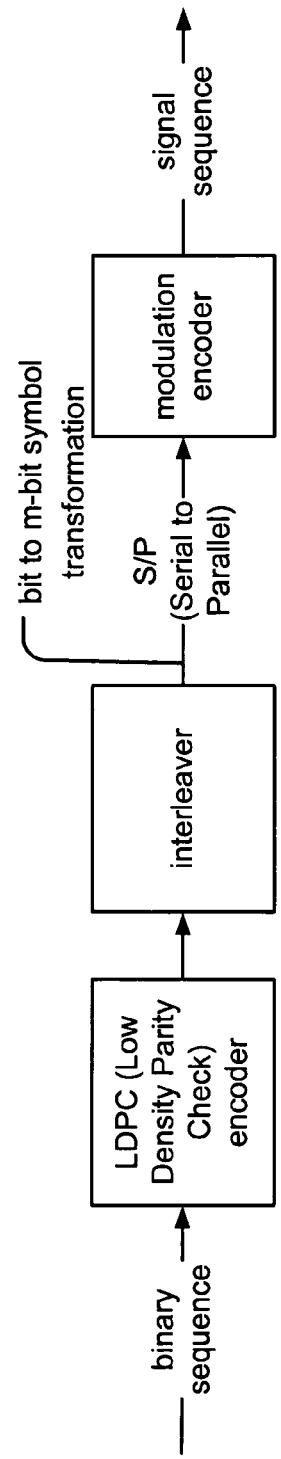
FIG. 17B is a diagram illustrating an embodiment of BICM (Bit Interleaved Coded Modulation) that is employed in conjunction with LDPC (Low Density Parity Check) coding and modulation encoding.

FIG. 17B is a diagram illustrating an embodiment of BICM (Bit Interleaved Coded Modulation) that is employed in conjunction with LDPC (Low Density Parity Check) coding and modulation encoding. This embodiment is similar to the embodiment described above that performs direct combining of LDPC coding and modulation encoding, with the exception that an interleaver is interposed between the LDPC encoder and the modulation encoder.

A binary sequence (e.g., a bit stream) is provided to an LDPC encoder. The LDPC encoder introduces a degree of redundancy (or parity) within the bit sequence provided thereto. These LDPC coded bits are then provided to an interleaver to generate a degree of randomness within the LDPC coded bits thereby (hopefully) making that LDPC coded bit sequence to be more robust to interference, noise, and other deleterious effects. This LDPC coded bit sequence that has been interleaved is then provided to a S/P (Serial to Parallel) path such that the output symbols may be provided to a modulation encoder. Again, this S/P path performs the bit to m-bit symbol transformation. The modulation encoder outputs a signal sequence that includes symbols (composed of the interleaved LDPC coded bits) that correspond to a modulation having a constellation and a mapping.

Figure 17C:
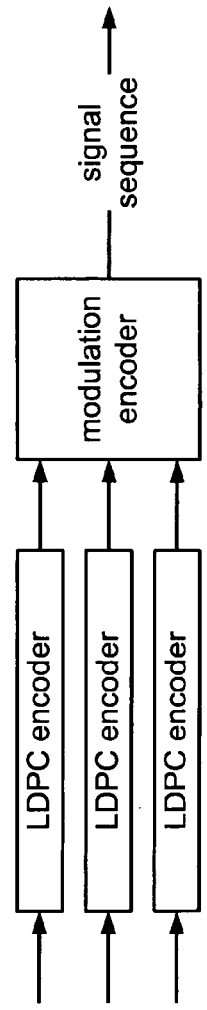
FIG. 17C is a diagram illustrating an embodiment of multilevel coded modulation encoding.

FIG. 17C is a diagram illustrating an embodiment of multilevel coded modulation encoding. Rather than require a S/P (Serial to Parallel) path between a single LDPC encoder and a modulation encoder, this embodiment shows a plurality of LDPC encoders operating in parallel such that the outputs of each of the LDPC encoder is already within parallel format (thereby obviating the need for the S/P (Serial to Parallel) path employed within the embodiments described above). The outputs of these LDPC encoders are provided to a modulation encoder. The modulation encoder outputs a signal sequence that includes symbols (composed of the LDPC coded bits provided by the various LDPC encoders) that correspond to a modulation having a constellation and a mapping.

All 3 of these embodiments, described above that perform the combination of LDPC coding and modulation encoding, typically operate using a single code rate and also use a single modulation (constellation and mapping) to map the binary bits to a given constellation. That is to say, they all typically employ a single code rate and a single modulation (having a single constellation type and a single mapping) for that single constellation. This approach inherently limits the maximal performance that may be achieved using these approaches. In contradistinction, the invention is operable to operate on LDPC coded signals having a code rate and/or a modulation (constellation and mapping) that may vary as frequently as on a symbol by symbol basis. To illustrate further the single modulation approach of these 3 embodiments, a specific implementation that performs such a single mapping is described below.

Figure 18:
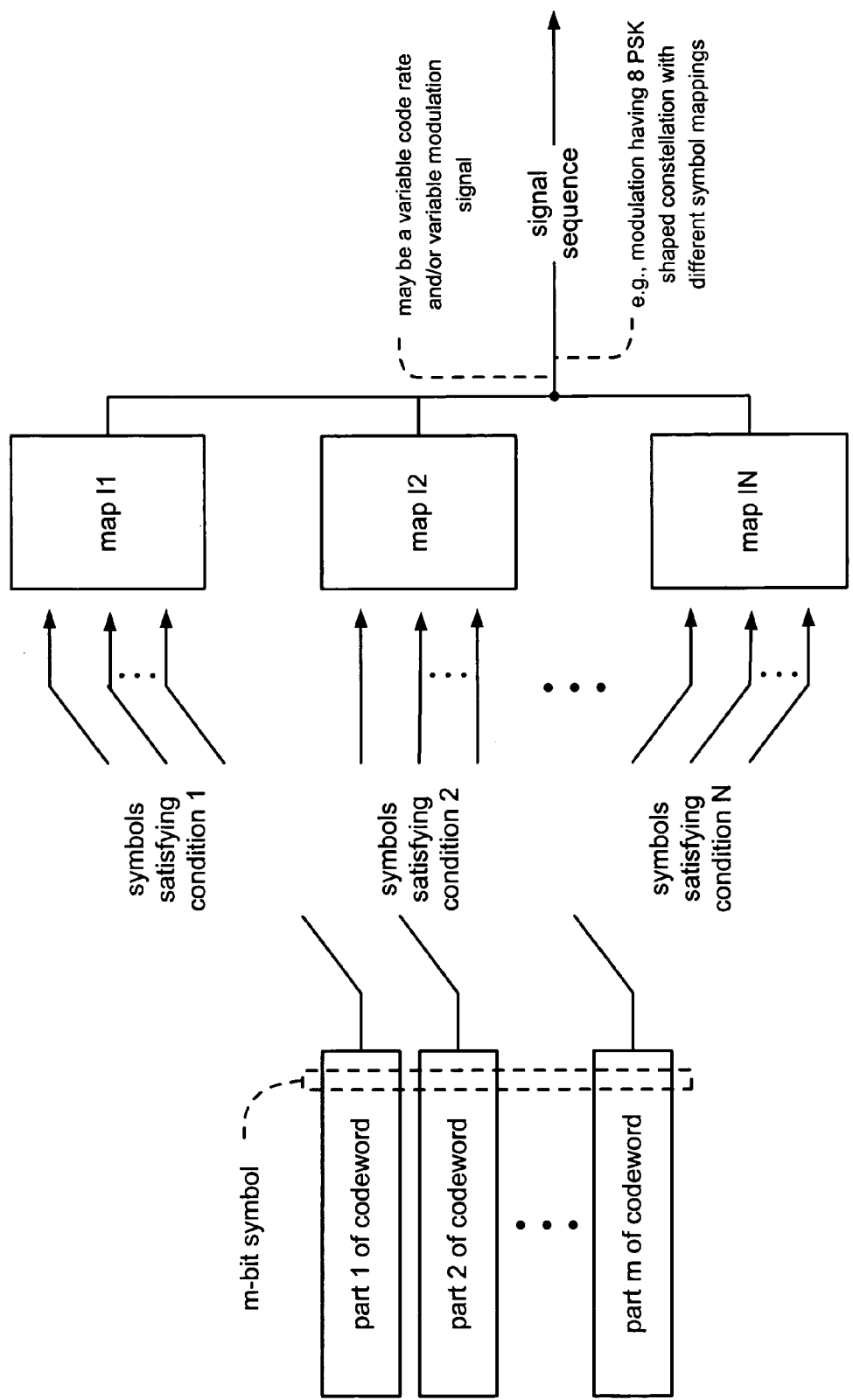
FIG. 18 is a diagram illustrating an embodiment of a variable signal mapping LDPC (Low Density Parity Check) coded modulation system that is built in accordance with invention.

FIG. 18 is a diagram illustrating an embodiment of a variable signal mapping LDPC (Low Density Parity Check) coded modulation system that is built in accordance with invention. This embodiment shows how a general implementation may be made for mapping an LDPC block coded modulation signal thereby generating LDPC coded signals having a modulation (constellation and mapping) that may vary as frequently as on a symbol by symbol basis.

In general, for any modulation, one can select as many as possible constellations and corresponding mappings, to construct an LDPC coded signal having a modulation (constellation and mapping) that may vary as frequently as on a symbol by symbol basis. This diagram illustrates a possible implementation for an m-bit constellation modulation. Moreover, it is also noted that the code can be any one of a variety of block codes.

In a very general illustration, a plurality of different encoders is employed. A first encoder employs a part 1 of a codeword, a second encoder employs a part 2 of a codeword, . . . , and a final encoder (of the plurality of encoders) employs a part m of a codeword. Those symbols that satisfy a condition 1 are provided to a map I1. Similarly, those symbols that satisfy a condition 2 are provided to a map I2, and those symbols that satisfy a condition N are provided to a map IN. The various conditions employed to govern the direction of which mapping to which the symbols are provided may be selected by a designer implementing the invention.

The signal sequence generated by this embodiment, or any of the other embodiments for which the decoding approaches of the invention may operate, may be a variable code rate and/or a variable modulation signal. For example, the code rate of the symbols of the signal sequence may vary as frequently as on a symbol by symbol basis. A first symbol may be encoded according to a first code rate, and a second symbol may be encoded according to a second code rate.

In addition, the modulation of the symbols of the signal sequence may vary as frequently as on a symbol by symbol basis. More specifically, for the variable modulation type signal, either one or both of the constellation or mapping of the symbols of the signal sequence may vary as frequently as on a symbol by symbol basis. As yet another example, multiple symbols of the signal sequence may all be mapped to a similarly shaped constellation, yet various symbols may also have different mappings to the same constellation. As one specific example, two symbols may each be associated with an 8 PSK (8 Phase Shift Key) shaped constellation, yet each of the symbols may be mapped differently within that 8 PSK shaped constellation. Clearly, other types of modulations may also be employed without departing from the scope and spirit of the invention.

Figure 19:
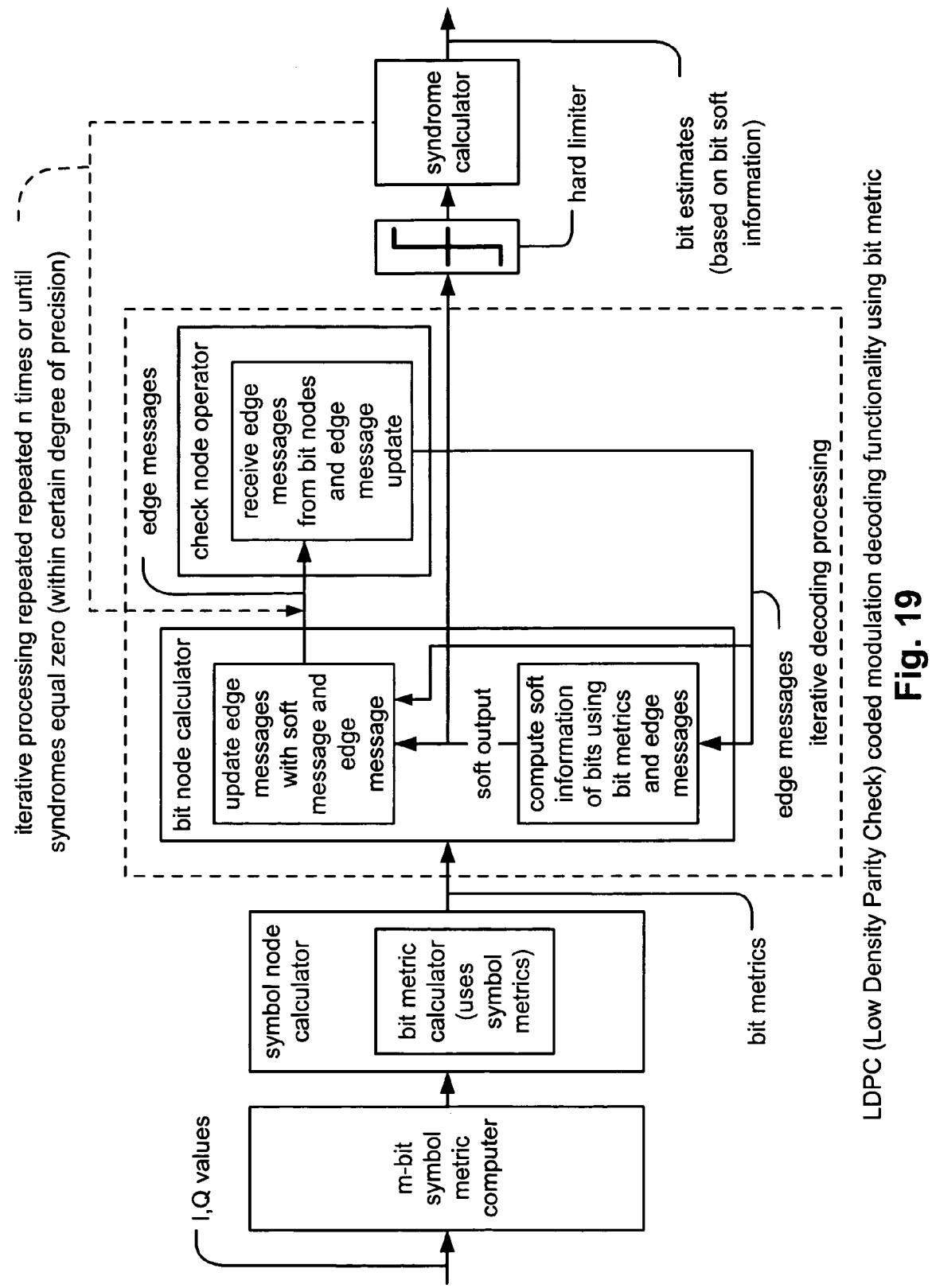
FIG. 19 is a diagram illustrating an embodiment of LDPC (Low Density Parity Check) coded modulation decoding functionality using bit metric according to the invention.

FIG. 19 is a diagram illustrating an embodiment of LDPC (Low Density Parity Check) coded modulation decoding functionality using bit metric according to the invention. To perform decoding of an LDPC coded modulation signal having an m-bit signal sequence, the functionality of this diagram may be employed. After receiving the I,Q (In-phase, Quadrature) values of a signal at the symbol nodes, an m-bit symbol metric computer functional block calculates the corresponding symbol metrics. At the symbol nodes, these symbol metrics are then passed to a symbol node calculator functional block that uses these received symbol metrics to calculate the bit metrics corresponding to those symbols. These bit metrics are then passed to the bit nodes connected to the symbol nodes.

Thereafter, at the bit nodes, a bit node calculator functional block operates to compute the corresponding soft messages of the bits. Then, in accordance with iterative decoding processing, the bit node calculator functional block receives the edge messages from a check node operator functional block and updates the edge messages with the bit metrics received from the symbol node calculator functional block. These edge messages, after being updated, are then passed to the check node operator functional block.

At the check nodes, the check node operator functional block then receives these edge messages sent from the bit nodes (from the bit node calculator functional block) and updates them accordingly. These updated edge messages are then passed back to the bit nodes (e.g., to the bit node calculator functional block) where the soft information of the bits is calculated using the bit metrics and the current iteration values of the edge messages. Thereafter, using this just calculated soft information of the bits (shown as the soft message), the bit node calculator functional block updates the edge messages using the previous values of the edge messages (from the just previous iteration) and the just calculated soft message. The iterative processing continues between the bit nodes and the check nodes according to the LDPC code bipartite graph that was employed to encode the signal that is being decoded.

These iterative decoding processing steps, performed by the bit node calculator functional block and the check node operator functional block, are repeated a predetermined number of iterations (e.g., repeated n times, where n is selectable). Alternatively, these iterative decoding processing steps are repeated until the syndromes of the LDPC code are all equal to zero (within a certain degree of precision).

Soft output information is generated within the bit node calculator functional block during each of the decoding iterations. In this embodiment, this soft output may be provided to a hard limiter where hard decisions may be made, and that hard information may be provided to a syndrome calculator to determined whether the syndromes of the LDPC code are all equal to zero (within a certain degree of precision). When thy are not, the iterative decoding processing continues again by appropriately updating and passing the edge messages between the bit node calculator functional block and the check node operator functional block.

After all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

Figure 20:
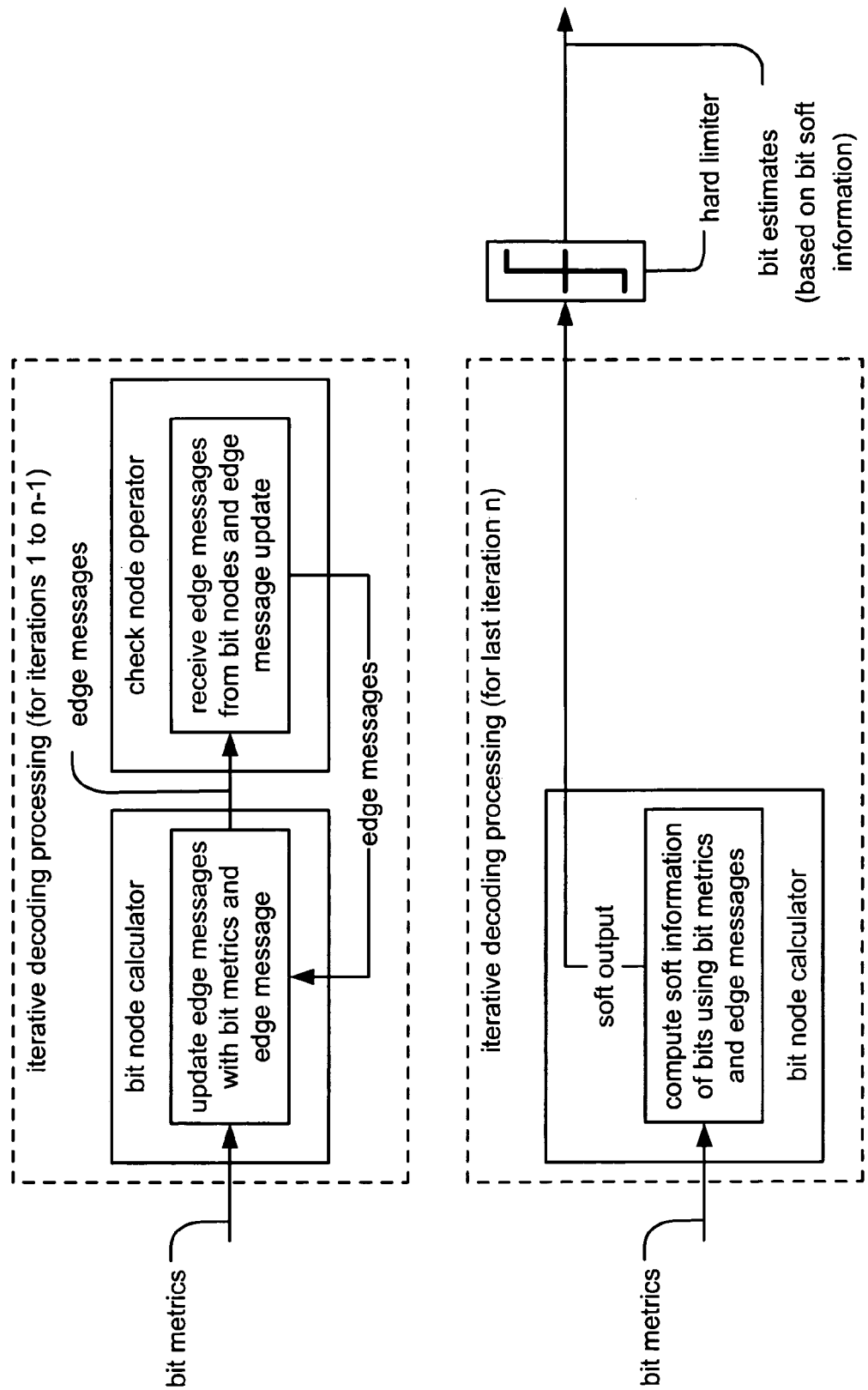
FIG. 20 is a diagram illustrating an alternative embodiment of LDPC coded modulation decoding functionality using bit metric according to the invention (when performing n number of iterations).

FIG. 20 is a diagram illustrating an alternative embodiment of LDPC coded modulation decoding functionality using bit metric according to the invention (when performing n number of iterations). This embodiment shows how the iterative decoding processing may be performed when a predetermined number of decoding iterations, shown as n, is performed. If the number of decoding iterations is known beforehand, as in a predetermined number of decoding iterations embodiment, then the bit node calculator functional block may perform the updating of its corresponding edge messages using the bit metrics themselves (and not the soft information of the bits as shown in the previous embodiment and described above). This processing may be performed in all but the last decoding iteration (e.g., for iterations 1 through n−1). However, during the last iteration, the bit node calculator functional block calculated the soft information of the bits (shown as soft output). The soft output is then provided to a hard limiter where hard decisions may be made of the bits. The syndromes need not be calculated in this embodiment since only a predetermined number of decoding iterations are being performed.

Figure 21:
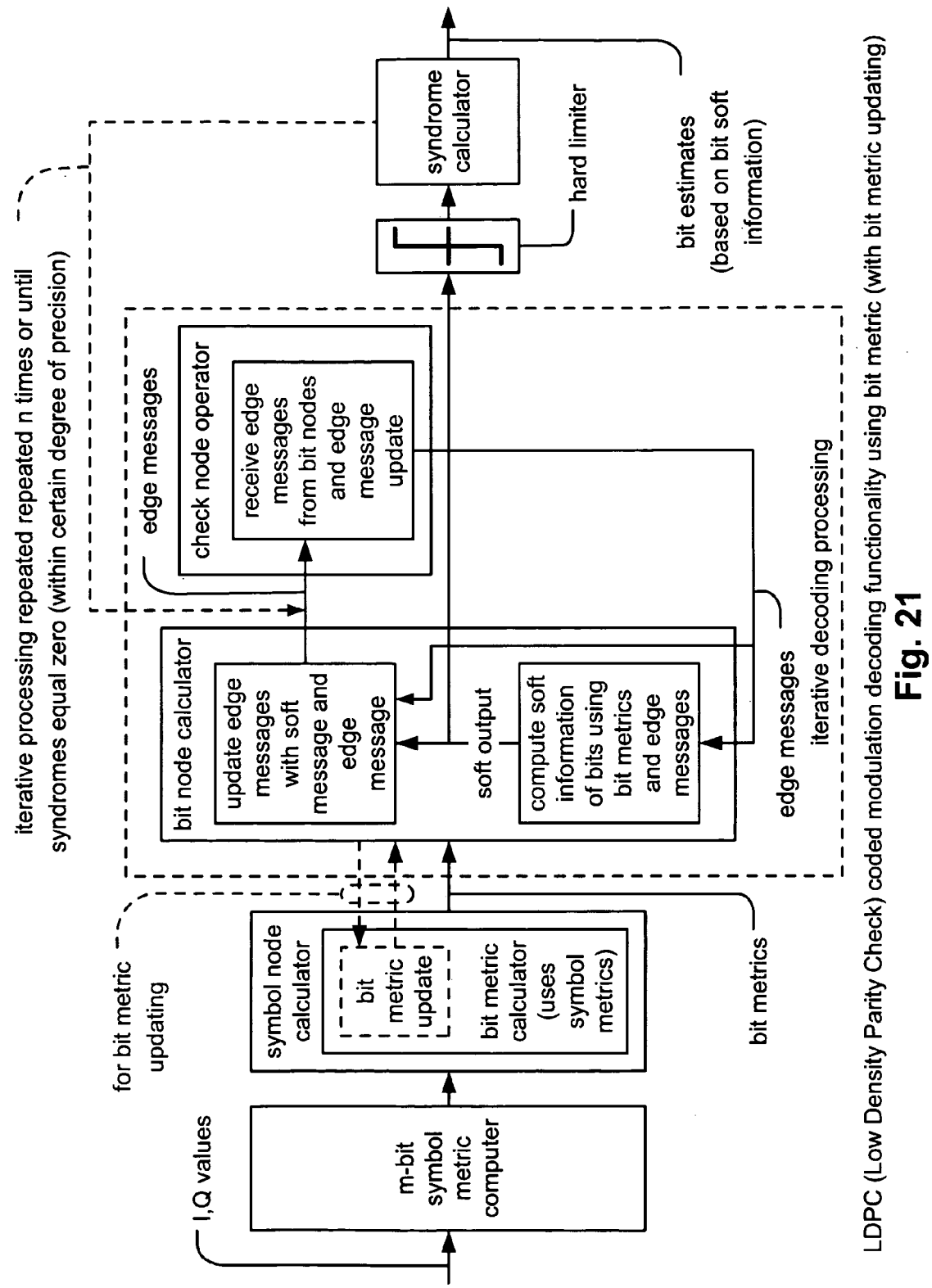
FIG. 21 is a diagram illustrating an alternative embodiment of LDPC (Low Density Parity Check) coded modulation decoding functionality using bit metric (with bit metric updating) according to the invention.

FIG. 21 is a diagram illustrating an alternative embodiment of LDPC (Low Density Parity Check) coded modulation decoding functionality using bit metric (with bit metric updating) according to the invention. To perform decoding of an LDPC coded modulation signal having an m-bit signal sequence, the functionality of this diagram may be employed. After receiving the I,Q (In-phase, Quadrature) values of a signal at the symbol nodes, an m-bit symbol metric computer functional block calculates the corresponding symbol metrics. At the symbol nodes, these symbol metrics are then passed to a symbol node calculator functional block that uses these received symbol metrics to calculate the bit metrics corresponding to those symbols. These bit metrics are then passed to the bit nodes connected to the symbol nodes. The symbol node calculator functional block is also operable to perform bit metric updating during subsequent decoding iterations.

Thereafter, at the bit nodes, a bit node calculator functional block operates to compute the corresponding soft messages of the bits. Then, in accordance with iterative decoding processing, the bit node calculator functional block receives the edge messages from a check node operator functional block and updates the edge messages with the bit metrics received from the symbol node calculator functional block. This updating of the edge messages may be performed using the updated bit metrics during subsequent iterations. These edge messages, after being updated, are then passed to the check node operator functional block.

At the check nodes, the check node operator functional block then receives these edge messages sent from the bit nodes (from the bit node calculator functional block) and updates them accordingly. These updated edge messages are then passed back to the bit nodes (e.g., to the bit node calculator functional block) where the soft information of the bits is calculated using the bit metrics and the current iteration values of the edge messages. Thereafter, using this just calculated soft information of the bits (shown as the soft message), the bit node calculator functional block updates the edge messages using the previous values of the edge messages (from the just previous iteration) and the just calculated soft message. At the same time, as the just calculated soft information of the bits (shown as the soft message) has been calculated, this information may be passed back to the symbol nodes (e.g., to the symbol node calculator functional block) for updating of the bit metrics employed within subsequent decoding iterations. The iterative processing continues between the bit nodes and the check nodes according to the LDPC code bipartite graph that was employed to encode the signal that is being decoded (by also employing the updated bit metrics during subsequent decoding iterations).

These iterative decoding processing steps, performed by the bit node calculator functional block and the check node operator functional block, are repeated a predetermined number of iterations (e.g., repeated n times, where n is selectable). Alternatively, these iterative decoding processing steps are repeated until the syndromes of the LDPC code are all equal to zero (within a certain degree of precision).

Soft output information is generated within the bit node calculator functional block during each of the decoding iterations. In this embodiment, this soft output may be provided to a hard limiter where hard decisions may be made, and that hard information may be provided to a syndrome calculator to determined whether the syndromes of the LDPC code are all equal to zero (within a certain degree of precision). When thy are not, the iterative decoding processing continues again by appropriately updating and passing the edge messages between the bit node calculator functional block and the check node operator functional block.

After all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

Figure 22:
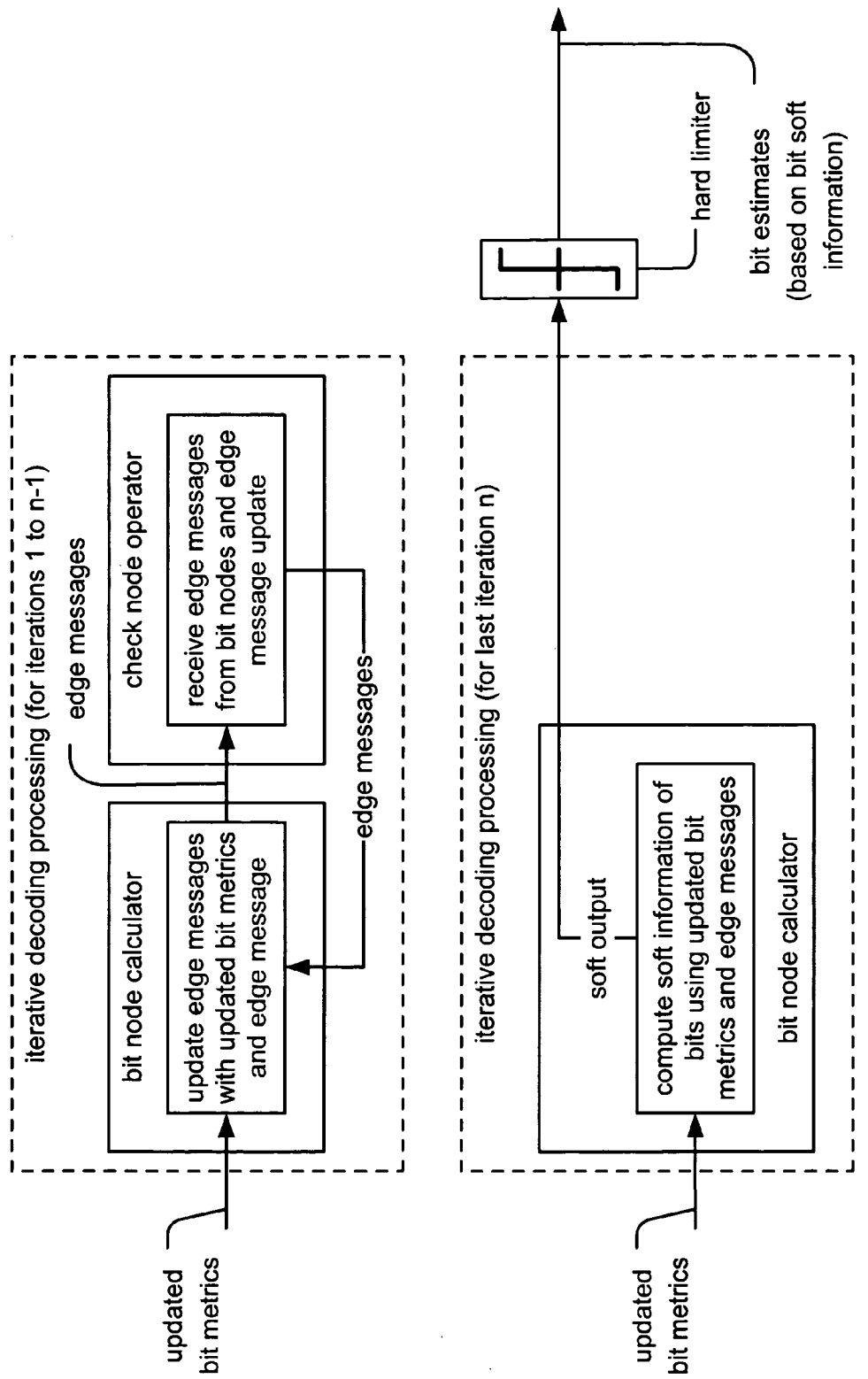
FIG. 22 is a diagram illustrating an alternative embodiment of LDPC coded modulation decoding functionality using bit metric (with bit metric updating) according to the invention (when performing n number of iterations).

FIG. 22 is a diagram illustrating an alternative embodiment of LDPC coded modulation decoding functionality using bit metric (with bit metric updating) according to the invention (when performing n number of iterations). This embodiment shows how the iterative decoding processing may be performed when a predetermined number of decoding iterations, shown as n, is performed (again, when employing bit metric updating). If the number of decoding iterations is known beforehand, as in a predetermined number of decoding iterations embodiment, then the bit node calculator functional block may perform the updating of its corresponding edge messages using the bit metrics/updated bit metrics themselves (and not the soft information of the bits as shown in the previous embodiment and described above). This processing may be performed in all but the last decoding iteration (e.g., for iterations 1 through n−1). However, during the last iteration, the bit node calculator functional block calculated the soft information of the bits (shown as soft output). The soft output is then provided to a hard limiter where hard decisions may be made of the bits. The syndromes need not be calculated in this embodiment since only a predetermined number of decoding iterations are being performed.

FIG. 23A is a diagram illustrating bit decoding using bit metric (shown with respect to an LDPC (Low Density Parity Check) code bipartite graph) according to the invention. Generally speaking, after receiving I, Q values of a signal at a symbol nodes, the m-bit symbol metrics are computed. Then, at the symbol nodes, the symbol metric is used to calculate the bit metric. The bit metric is then passed to the bit nodes connected to the symbol nodes. At the bit nodes, the soft messages of the bits are computed, and they are used to update the edge message sent from the check nodes with the bit metric. These edge messages are then passed to the check nodes. At the check nodes, updating of the edge messages sent from the bit nodes is performed, and these values are pass back the bit nodes.

As also described above with respect to the corresponding functionality embodiment, after all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

FIG. 23B is a diagram illustrating bit decoding using bit metric updating (shown with respect to an LDPC (Low Density Parity Check) code bipartite graph) according to the invention. With respect to this LDPC code bipartite graph that performs bit metric updating, the decoding processing may be performed as follows:

After receiving the I, Q value of the signal at the symbol nodes, the m-bit symbol metrics are computed. Then, at the symbol nodes, the symbol metrics are used to calculate the bit metrics. These values are then passed to the bit nodes connected to the symbol nodes. At the bit nodes, the edge message sent from the check nodes are updated with the bit metrics, and these edge messages are passed to the check nodes. In addition, at the same time the soft bit information is updated and passed back to the symbol nodes. At the symbol nodes, the bit metrics are updated with the soft bit information sent from the bit nodes, and these values are passed back to the variable nodes. At the check nodes, the edge information sent from the bit nodes is updated, and this information is passed back to the bit nodes.

As also described above with respect to the corresponding functionality embodiment, after all of these iterative decoding processing steps have been performed, then the best estimates of the bits are output based on the bit soft information. Again, it is shown in this embodiment that the bit metric values are not fixed; they are updated for use within subsequent decoding iterations. This is again in contradistinction to the embodiment described above where the bit metric values that are calculated only once and remain fixed values for all of the decoding iterations.

The various bit decoding approaches described above all provide relatively good performance when Gray code maps are used to map the symbols to constellation signals. For example, an n-bit Gray code is a scheme for listing all n-bit vectors such that successive elements differ in exactly one bit, i.e. the Hamming distance $d_H$ of the two adjacent elements is one. A cycle Gray code is a Gray code such that the first and the last element also differ in one bit. Applying other kinds of maps will cause the performance degradation (as can be seen in the performance comparison of the 5 different LDPC-BICM system types below).

FIG. 24A is a diagram illustrating an LDPC (Low Density Parity Check) coded modulation tripartite graph with symbol nodes connected to bit nodes according to the invention. In this embodiment, it can be seen that the bit nodes are connected to the symbol nodes. The appropriately corresponding bit nodes are also connected to the check nodes according to the LDPC code being employed. However, it is noted that the symbols to be decoded are solely determined by the bits connected to the corresponding symbol. This property is capitalized upon such that the bit nodes may be removed from the LDPC tripartite graph, so that the symbol nodes may be directly connected to the check nodes thereby generating an LDPC coded modulation bipartite graph.

As one example, 3 symbol nodes, $s_0$, $s_1$, $s_2$, are connected to the 9 bit nodes, $b_0$, $b_1$, $b_2$, ..., $b_8$, according to the following mapping:

$s_0 \leftrightarrows (b_0, b_3, b_6)$ $s_1 \leftrightarrows (b_1, b_4, b_7)$ $s_2 \leftrightarrows (b_2, b_5, b_8)$ (EQ 1)

The connections between the 9 bit nodes, $b_0$, $b_1$, $b_2$, ..., $b_8$, and the 3 check nodes, $c_0$, $c_1$, $c_2$, are made according to the following mapping:

$b_0 \leftrightarrows (c_0, c_2)$ $b_1 \leftrightarrows (c_0, c_1)$ $b_2 \leftrightarrows (c_1, c_2)$ $b_3 \leftrightarrows (c_0, c_1)$ $b_4 \leftrightarrows (c_1, c_2)$ $b_5 \leftrightarrows (c_0, c_2)$ $b_6 \leftrightarrows (c_0, c_1)$ $b_7 \leftrightarrows (c_1, c_1)$ $b_8 \leftrightarrows (c_0, c_1)$ FIG. 24B is a diagram illustrating an LDPC (Low Density Parity Check) coded modulation bipartite graph with symbol nodes connected directly to check nodes according to the invention (this bipartite graph is generated from the tripartite graph shown in FIG. 24A). One aspect of the invention is the ability to reduce the number of nodes within an LDPC bipartite graph by directly connecting the symbols nodes to the check nodes (e.g., by modifying an LDPC coded modulation tripartite graph to generate an LDPC coded modulation bipartite graph). However, this must be performed very carefully to ensure proper decoding of such LDPC coded signals. As is described herein, the labeling of the edges connected the symbols nodes to the check nodes needs to be done carefully to ensure proper decoding of symbols.

Within this LDPC code bipartite graph, the edges are only connected between the symbol nodes and the check nodes. In doing so, every edge connecting the symbol nodes and the check nodes is labeled by a value according to EQ 1 shown above. In some embodiments, these edges are labeled using octal values.

For example, using an octal labeling approach, the edge connecting the symbol node $s_0$ to the check node $c_0$, depicted as $(s_0, c_0)$, is labeled as 7 since all three bits $b_0$, $b_3$, $b_6$ are connected to $c_0$ (e.g., labeled as 7 because $b_0$, $b_3$, $b_6$=111). Similarly, the edge connecting the symbol node $s_0$ to the check node $c_1$, depicted as $(s_0, c_1)$, is labeled as 6 since only the two bits $b_0$, $b_3$ are connected to $c_1$ (e.g., labeled as 6 because $b_0$, $b_3$, $b_6$=110). As another example, the edge connecting the symbol node $s_0$ to the check node $c_2$, depicted as $(s_0, c_2)$, is labeled as 1 since only the one bit $b_0$ is connected to $c_2$ (e.g., labeled as 1 because $b_0$, $b_3$, $b_6$=100). The additional edges that communicatively couple the symbols nodes to the check nodes may also be labeled according to this convention.

One of the advantages of the symbol node to check node LDPC code bipartite graph is that a decoder may use symbol metrics when performing the decoding processing of the LDPC coded symbols instead of bit metrics. In this way of performing the decoding processing, there is therefore no need to perform metric updating; the metric updating within the decoding processing may have the undesirable effect of requiring an increased amount of memory to be used. Moreover, the decoding based on the LDPC code bipartite graph (sometimes referred to as a symbol LDPC code bipartite graph) actually out-performs decoding processing that is based on an LDPC code tripartite graph (whose bit nodes are connected to check nodes). In addition, the LDPC symbol decoding provides comparable or better performance of LDPC bit decoding that involves updating of the bit metrics.

Figure 25A:
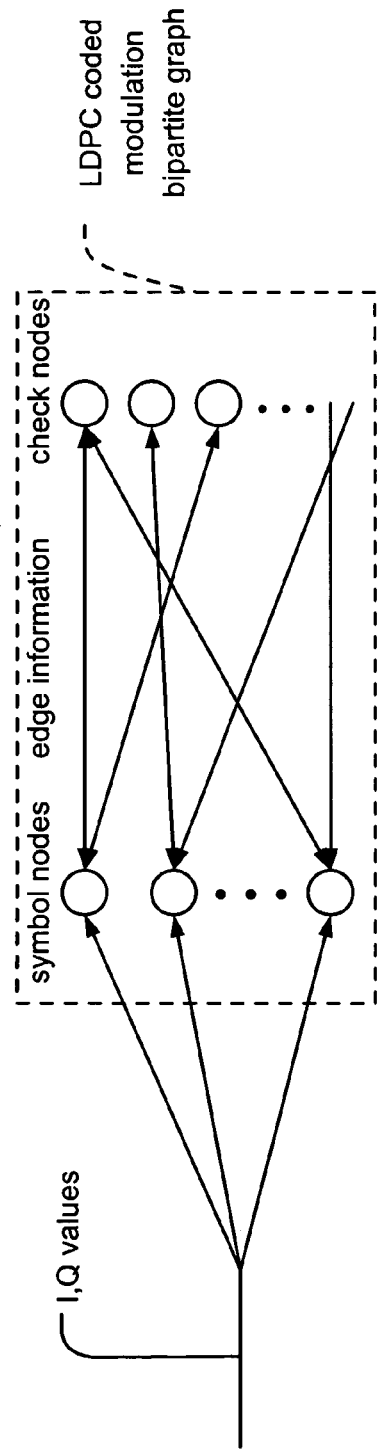
FIG. 25A is a diagram illustrating symbol decoding (shown with respect to an LDPC (Low Density Parity Check) coded modulation bipartite graph) according to the invention.

FIG. 25A is a diagram illustrating symbol decoding (shown with respect to an LDPC (Low Density Parity Check) coded modulation bipartite graph) according to the invention. The symbol decoding processing performed according to the invention may be performed using an LDPC coded modulation bipartite graph in which the symbol nodes are connected directly to the check nodes. In general, the I,Q values of a symbol are provided to the symbol nodes, and the iterative decoding processing is performed according to the manner in which the labeled edges communicatively couple the symbol nodes to the check nodes.

As an example of how the decoding processing may be performed using such an LDPC coded modulation bipartite graph, a rate ⅔ LDPC code with an 8 PSK (8 Phase Shift Key) modulation signal is decoded and explained in detail. This LDPC code may be a regular LDPC code or an irregular LDPC code without departing from the scope and spirit of the invention. The block length of the LDPC code is 3N and a 3 bit symbol $s_i$ is mapped (e.g., using a symbol mapper) according to the following notation:

$$s_i = (b_i, b_{N+i}, b_{2N+i})$$

The parity check matrix of the LDPC code may be represented as $[h_{ij}]_{N \times 3N}$. The estimated symbols $r_i$ corresponding to the 3 bit symbol $s_i$ may be represented as $r_i = (r_{0i}, r_{1i}, r_{2i})$. The partial syndromes $S^m(i)$ and $S_m(i)$ that are calculated using the estimated symbols and the parity check matrix of the LDPC code may be represented as follows:

$$S^m(i) = \sum_{j=0}^{m-1} (r_{0j} h_{ij} + r_{1j} h_{i(N+j)} + r_{2j} h_{i(2N+j)}) \quad (EQ\,2)$$

$$S_m(i) = \sum_{j=m}^{N-1} (r_{0j} h_{ij} + r_{1j} h_{i(N+j)} + r_{2j} h_{i(2N+j)})$$

The following decoding processing description is described as being performed on a signal sequence Y. The probability of the signal sequence Y satisfying the partial syndrome, $p(S^j(i)=m|Y)$, to be equal to $A_{i,j}(m)$ is calculated (e.g., the probability of $p(S^j(i)=m|Y)=A_{i,j}(m)$). In addition, other probabilities are calculated; namely, the probability of the signal sequence Y satisfying the partial syndrome, $p(S_j(i)=m|Y)$, to be equal to $B_{i,j}(m)$ is calculated (e.g., the probability of $p(S_j(i)=m|Y)=B_{i,j}(m)$). These probabilities are all calculated based on the following conditions:

$$A_{i,0}(0)=1$$

and $$B_{i,\deg(c_1)-1}(0)=1'$$

$$A_{i,0}(m)=0$$

where $m \neq 0$.

$$B_{i,\deg(c_1)-1}(m)=0'$$

Since the decoding may be performed in the logarithmic domain thereby enabling multiplication operations to be performed using addition and division operations to be performed using subtraction, these variables may be redefined within the logarithmic domain as follows:

$$\alpha_{i,j}(m) = \log(A_{i,j}(m))$$

$$\beta_{i,j}(m) = \log(B_{i,j}(m))'$$

These values may be referred to as the alphas, or forward metrics, $(\alpha_{i,j}(m))$ and betas, or backward metrics, $(\beta_{i,j}(m))$ to be employed within the decoding processing.

The edge messages being passed from the check nodes to the symbol nodes may be represented as Medge[i][j][k], where i runs according to the appropriately labeled edges within the LDPC coded modulation bipartite graph.

As some examples:

1. if the label is 7, then k runs from 0 to 7,
2. if the label is 3, 5, or 6, then k runs from 0 to 3, and
3. if the label is 1, 2, or 6, then k runs between 0 to 1.

In addition, a new function $x(v)$ that varies from $\{0, \ldots, 7\}$ to $\{0,1\}$ may be employed. The value v may be viewed as being an integer represented in octal. Then, the value of v may be represented as $v=(v_0,v_1,v_2)$. This new function $x(v)$ may be represented as follows:

$$x(v)=v_0 \oplus v_1 \oplus v_2 \quad (EQ\,3)$$

where $\oplus$ is an exclusive-or (e.g., XOR) function (e.g., binary addition).

The notation and definitions provided above are also employed to describe the symbol decoding processing in other embodiments whose decoding processing and/or functionality are described in more detail below. More specifically, the embodiments described in more detail below show how the check node updating and symbol sequence estimation, as well as symbol node updating, is performed using these various values.

Figure 25B:
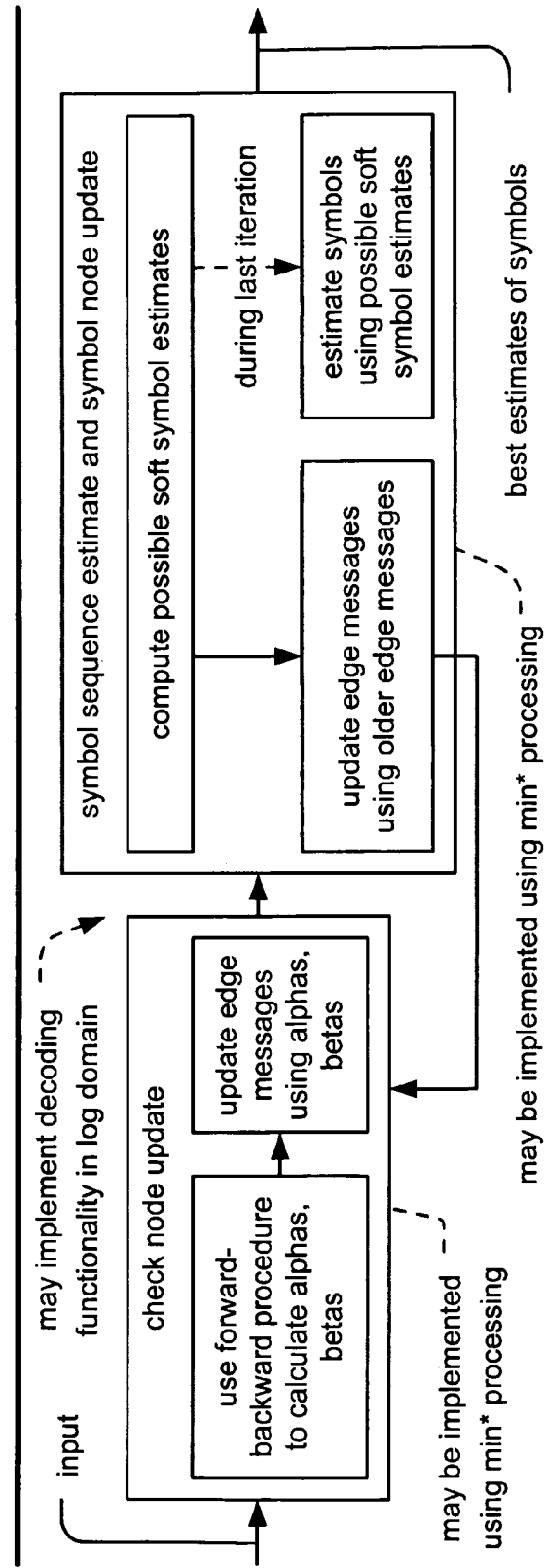
FIG. 25B is a diagram illustrating an embodiment of symbol decoding functionality (supported with an LDPC (Low Density Parity Check) coded modulation bipartite graph) according to the invention.

FIG. 25B is a diagram illustrating an embodiment of symbol decoding functionality (supported with an LDPC (Low Density Parity Check) coded modulation bipartite graph) according to the invention. This embodiment shows in more detail how the check node updating and symbol sequence estimation, as well as symbol node updating, is performed.

The decoding processing described in this embodiment may be better understood in the context of the check node updating and symbol sequence estimation, including the symbol node updating, that may be performed within in at least 2 different embodiments that are described herein in accordance with the invention: (1) symbol decoding and (2) hybrid decoding (that performs a combination of bit level and symbol level decoding). One possible embodiment of symbol decoding is described in this diagram (FIG. 25B), and one possible embodiment of the hybrid decoding is described below with respect to the diagram of FIG. 27.

Beginning from the left hand side of the diagram, input information corresponding to the calculated partial syndromes, that also includes the initial values of the alphas $(\alpha_{i,j}(m))$ and the betas $(\beta_{i,j}(m))$ (e.g., forward and backward metrics), are provided to a check node update functional block. Iterative decoding processing is performed within the check node update functional block over the total number of check nodes. For example, M iterations are performs over i (where i varies from 0 to M−1, and where M is the total number of check nodes of the LDPC bipartite graph).

In doing this iterative decoding processing, the check node updating initially involves calculating the values of the alphas $(\alpha_{i,j}(m))$ and the betas $(\beta_{i,j}(m))$ (beyond merely the initial values that are provided during the initial iteration) for each of the symbols of a received symbol block. This iterative decoding processing in calculating the alphas and betas may be performed using a forward-backward procedure through the received symbol block.

The calculation of the alphas and betas is described below.

For j=0 to deg($c_i$)−1 and m=0,1, the forward-backward processing procedure may be employed to calculate the alphas $(\alpha_{i,j}(m))$ and the betas $(\beta_{i,j}(m))$ as follows:

$$\alpha_{i,j}(m) = \min^* \{\text{Medge}[i][j-1][k] + \alpha_{i,j-1}(m \oplus x(k)) | \text{ all possible } k\}$$

$$\beta_{i,j}(m) = \min^* \{\text{Medge}[i][j+1][k] + \beta_{i,j+1}(m \oplus x(k)) | \text{ all possible } k\}$$

Now that these values of alpha and beta are available for each of the symbols within a received symbol block, the edge messages Medge[i][j][k] (that communicatively couple the symbol nodes to the check nodes) are updated using these calculated alphas and betas values.

For j=0 to deg($c_i$)−1 and all possible k, the updating of the edge messages Medge[i][j][k] may be performed as follows:

$$\text{Medge}[i][j][k] = \min^* \{\lfloor \alpha_{i,j}(0) + \beta_{i,j}(x(k)) \rfloor, \lfloor \alpha_{i,j}(1) + \beta_{i,j}(x(k) \oplus 1) \rfloor\}$$

The min* processing functionality described herein may be better understood by the following description. The min* processing includes determining a minimum value from among two values (e.g., shown as min(A,B) in min* processing) as well as determining a logarithmic correction factor (e.g., shown as $\ln(1+e^{-|A-B|})$ in min* processing) in selecting the smaller metric. In addition, it is also noted that max* processing may alternatively be performed in place of min* processing. The max* processing operation also includes a logarithmic correction in selecting the larger metric. It is noted that the various embodiments of the invention may be implemented using the max* operations in lieu of the min* operation when preferred in a given implementation.

The min* processing, when operating on inputs A and B, may be expressed as follows:

$$\min^*(A,B) = \min(A,B) - \ln(1+e^{-|A-B|})$$

Again, the calculations that are performed using min* processing may alternatively be performed using max* processing. The max* processing, when operating on inputs A and B, may be expressed as follows:

$$\max^*(A,B) = \max(A,B) + \ln(1+e^{-|A-B|})$$

Moreover, when multiple min* operations are to be performed on multiple values (e.g., more than 2), the min* processing may be expressed as follows:

$$\min^*(x_1, \ldots, x_N) = \min^*(\min^*(x_1, \ldots, x_{N-1}), x_N) \quad \text{(EQ 4)}$$

After the check node processing has been completed, a symbol sequence estimate and symbol node update functional block operates using the check node update messages to continue the decoding processing.

Since the total number of edges is the same count from either side (e.g., from either the symbol node side or the check node side), the edges are intrinsically re-ordered according to the symbols that are being decoded. This re-ordering may be intrinsically performed using a LUT (Look-Up Table) to ensure the proper ordering of the check node updating. In other words, the LUT may be implemented to perform the function of which edge information to take when performing the symbol sequence estimate and symbol node update. In addition, this re-ordering functionality may be inherently implemented in hardware for proper ordering of the check node updating such that it corresponds to an order that is appropriate to the symbol node updating. For proper decoding of the symbols of the sequence (e.g., first symbol to last symbol), there needs to be some ordering of the symbols. However, this symbol ordering is not critical when performing the check node updating. That is to say, the ordering of the check node updating may then be performed according to any desired ordering, and to ensure proper decoding of the symbols according to the desired order (e.g., first symbol to last symbol), the check node updating is performed to ensure that the edge messages are inherently appropriately ordered according to the desired order for the decoding processing.

More specifically, this decoding processing may be understood with respect to the edge messages Medge[i][j][k], where i runs across all of the symbol nodes, where j runs according to the degree of the edges from the symbol nodes, and where k runs according to the labels of the LDPC bipartite graph.

This embodiment described with respect to this diagram is shown with respect to a code that includes 3 bit symbols, coded according to 8 PSK (8 Phase Shift Key) modulation. However, it is noted that such a decoding approach may also be adapted very easily to decoding signals having an even larger number of bits. For example, this decoding approach may be adapted to perform decoding of signals having symbols of higher order modulations including 16 QAM (16 Quadrature Amplitude Modulation), 16 APSK (16 Asymmetric Phase Shift Keying), 64 QAM, and even other modulation types without departing from the scope and spirit of the invention.

The label on the j-th edge from the check node i may be denoted as $L_{i,j}$. A new function, sh(L,v), may be defined and employed to assist in the decoding processing describer herein. This new function sh(L,v) may be defined as follows:

$$sh(L, (v_0, v_1, v_2)) = \begin{cases} v_2 & L = 1 \\ v_1 & L = 2 \\ (v_1, v_2) & L = 2 \\ v_0 & L = 4 \\ (v_0, v_2) & L = 5 \\ (v_0, v_1) & L = 6 \\ (v_0, v_1, v_2) & L = 7 \end{cases} \quad \text{(EQ 5)}$$

After the edge messages have been intrinsically and appropriately re-ordered using the approach described above, the symbol sequence estimate and symbol node update functional block continues to operate according to the following procedure.

For m=0, . . . , 7, the possible values for the soft symbol estimates are computed (e.g., the possible values for the soft information of the symbols is calculated) as follows:

$$p_i(m) = \text{Metric}_i[m] + \sum_{j=0}^{deg(s_i)-1} \left( \sum_{L_{i,j}} \text{Medge}[i][j][sh(L_{i,j}, m)] \right),$$

where $\text{Metric}_i[m]$ is the appropriate symbol metric obtained from the received signal according to its appropriate modulation (constellation and mapping values).

The symbol sequence estimate and symbol node update functional block continues by estimating the symbols using the soft symbol estimates. More specifically, the estimate of the symbol $s_i$ to m is made such that $p_i(m)$ is the smallest value selected from among all of the possible values of $p_i(0)$, $p_i(1)$, . . . , $p_i(7)$.

After the estimate of the symbols is made using the soft symbol estimates, the edge messages are updated within the symbol sequence estimate and symbol node update functional block using the older edge messages. More specifically, the edge messages are updated as follows:

The processing may be better understood by considering the edge label $L_{i,j}$, 1. if $L_{i,j}=7$, then for m=0, ..., 7, Medge[i][j][k]=$p_i$[m]−Medge[i][j][m].
2. alternatively, if $L_{i,j}=3, 5, 6$, then for $m_0, m_1 \in \{0,1\}$, then the values of the edge messages may be defined as:

$$Medge[i][j][(m_0, m_1)] = \begin{cases} \min*(p_i(0, m_0, m_1), p_i(1, m_0, m_1)) - Medge[i][j][(m_0, m_1)] & L_{i,j} = 3 \\ \min*(p_i(m_0, 0, m_1), p_i(m_0, 1, m_1)) - Medge[i][j][(m_0, m_1)] & L_{i,j} = 5 \\ \min*(p_i(m_0, m_1, 0), p_i(m_0, m_1, 1)) - Medge[i][j][(m_0, m_1)] & L_{i,j} = 6 \end{cases}$$

3. alternatively, if $L_{i,j}=1, 2, 4$, then for m=0,1, then the values of the edge messages may be defined as:

$$Medge[i][j][(m)] = \begin{cases} \min*\{p_i(k_0, k_1, m) \mid k_0, k_1 \in \{0, 1\}\} - Medge[i][j][m] & L_{i,j} = 1 \\ \min*\{p_i(k_0, m, k_1) \mid k_0, k_1 \in \{0, 1\}\} - Medge[i][j][m] & L_{i,j} = 2 \\ \min*\{p_i(m, k_0, k_1) \mid k_0, k_1 \in \{0, 1\}\} - Medge[i][j][m] & L_{i,j} = 4 \end{cases}$$

where the right hand side edge of these equations is the old edge message passed from the check node.

Continuing on with the iterative decoding processing, using the updated edge messages (that are updated either a predetermined number of times and/or until convergence of the edge messages has been met within a certain degree of precision), then the best estimates of the symbols of a received symbol block may be made.

The performance of various approaches to decoding such a received symbol block are compared in the following diagram.

Figure 26:
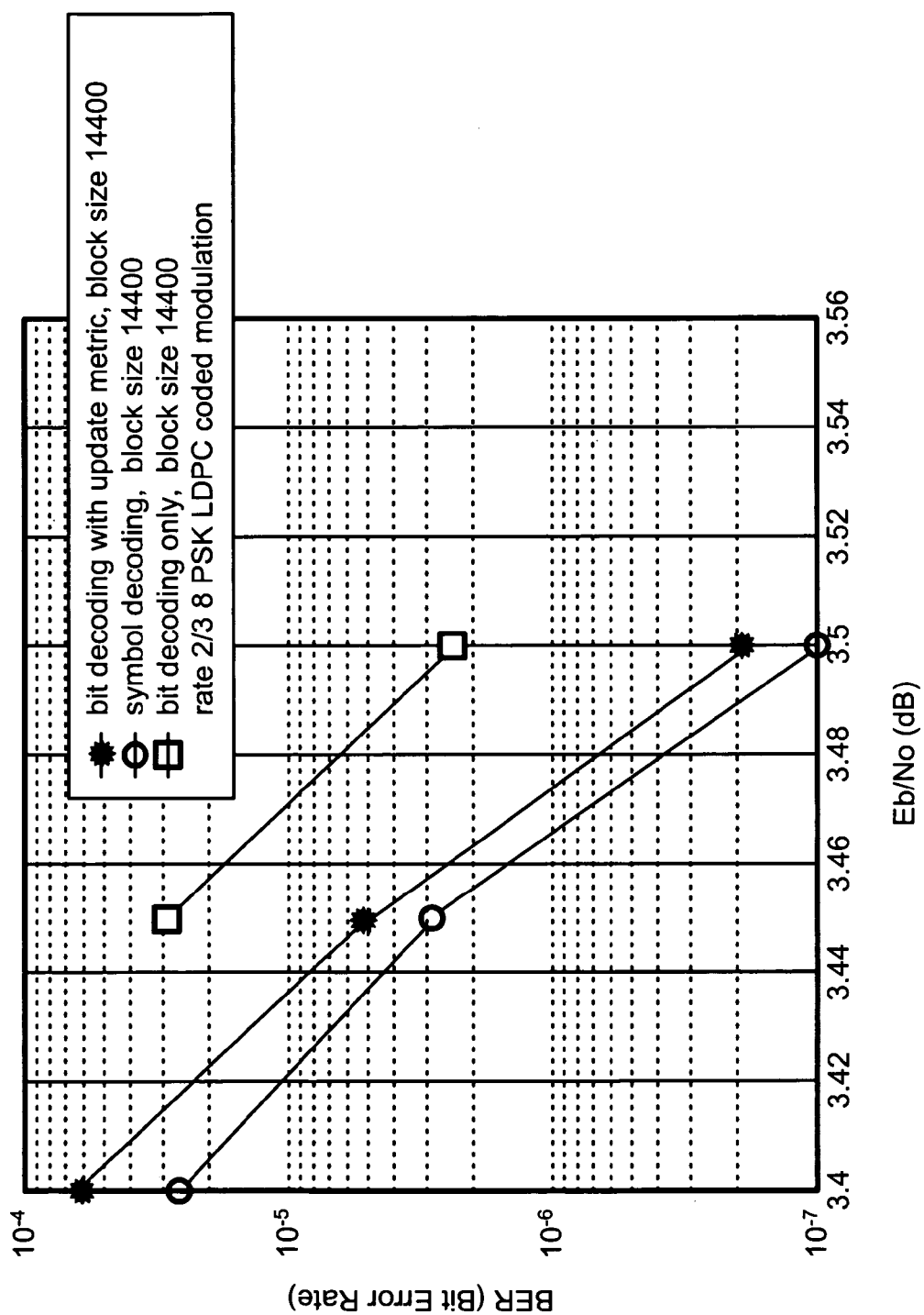
FIG. 26 is a diagram illustrating an embodiment of performance comparison of symbol vs. bit decoding of LDPC (Low Density Parity Check) code modulation signals according to the invention.

FIG. 26 is a diagram illustrating an embodiment of performance comparison of symbol vs. bit decoding of LDPC (Low Density Parity Check) code modulation signals according to the invention. These performance curves are described in the context of BER (Bit Error Rate) versus $E_b/N_o$ (ratio of energy per bit $E_b$ to the Spectral Noise Density $N_o$). This term $E_b/N_o$ is the measure of SNR (Signal to Noise Ratio) for a digital communication system. When looking at these performance curves, the BER may be determined for any given $E_b/N_o$ (or SNR).

Three different decoding approaches are compared when decoding LDPC coded modulation signals. Within this comparison, the block size of the LDPC code is 14400, and the signal is a code rate ⅔ 8 PSK (8 Phase Shift Key) LDPC coded modulation signal.

As some example, the worst performing performance curve corresponds to bit decoding only; when operating at an $E_b/N_o$ of approximately 3.5 dB (decibels), the BER of the bit decoding only approach is approximately $2.5 \times 10^{-6}$.

The next better performance curve corresponds to performing bit decoding in accompany with bit metric updating; for this decoding approach, when operating at an $E_b/N_o$ of approximately 3.5 dB, the BER of the bit decoding approach (that also included metric updating) decreases even more to below approximately under $2 \times 10^{-7}$.

However, the symbol decoding approach described herein provides a better performance than either of these other approaches. More specifically, for this symbol decoding approach performed in accordance with the invention, when operating at an $E_b/N_o$ of approximately 3.5 dB, the BER of the symbol decoding approach decreases by an even greater amount to approximately $1 \times 10^{-7}$.

As can be seen when comparing these various approaches to performing decoding of LDPC coded modulation signals, the symbol decoding approach may be implemented as to provide for much improved performance.

Figure 27:
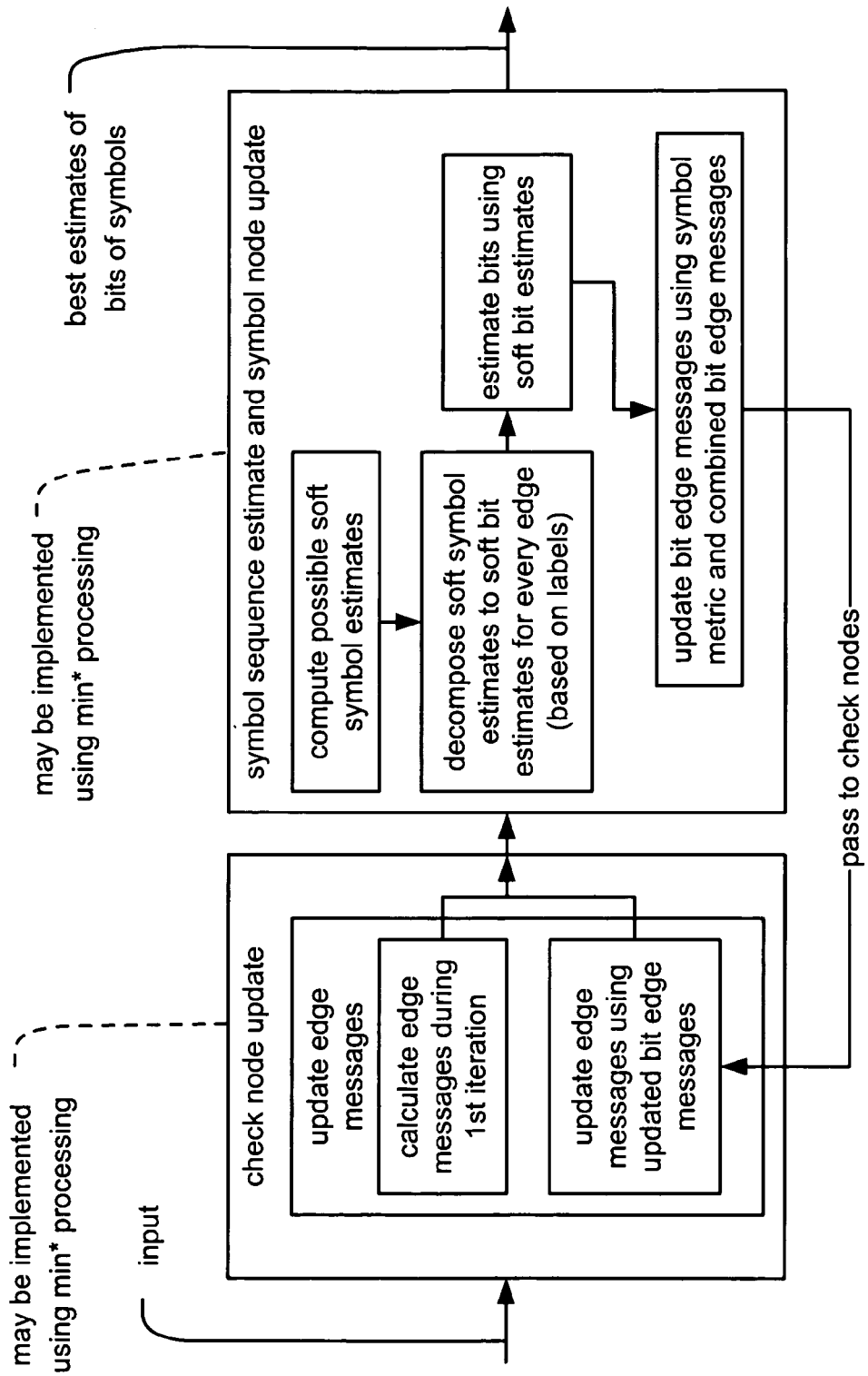
FIG. 27 is a diagram illustrating an embodiment of hybrid decoding functionality that reduces the complexity of symbol decoding of LDPC coded modulation signals according to the invention.

FIG. 27 is a diagram illustrating an embodiment of hybrid decoding functionality that reduces the complexity of symbol decoding of LDPC coded modulation signals according to the invention.

This hybrid approach to performing decoding of LDPC coded modulation signals is similar to the symbol decoding approach described above within other embodiments with the exception being that the check nodes are updated using the edge messages corresponding to the bit nodes and the symbol nodes are updated using the symbol metrics and the combined edge messages corresponding to the bit nodes.

With respect to the LDPC code bipartite graphs described above, it is noted that the labels of some of the edges correspond to more than 1 bit. For example, for the bits 3, 5, 6, and 7, the edge messages correspond to more than 2 values. Because of this, the common approach of employing LLR (log likelihood ratio) decoding cannot be employed. Moreover, additional memory may be required to store the increased number of edge messages that are employed when performing symbol decoding.

The hybrid approach to LDPC coded modulation decoding may be employed to reduce the increase of complexity that may be associated with some implementations of symbol decoding of LDPC coded modulation signals.

The hybrid decoding approach may be characterized as follows:

1. updating the check nodes using the bit edge messages, and
2. updating the symbol nodes using the symbol metrics and the combined bit edge message.

Within this diagram, a modified check node update functional block and a symbol sequence estimate and symbol node update functional block are employed; these functional blocks (for the hybrid decoding functionality) are modified with respect to the symbol decoding functionality described above. This diagram is shown as receiving input that includes the partial syndrome information.

A check node update functional block performs updating of the edge messages therein. Initially, during a first decoding iteration, the check node update functional block calculates the edge messages for this first decoding iteration. These edge messages are then passed to a symbol sequence estimate and symbol node update functional block.

Within the symbol sequence estimate and symbol node update functional block and similar to the embodiment described above, since the total number of edges is the same count from either side (e.g., from either the symbol node side or the check node side), the edges are inherently ordered in a manner that is appropriate for the decoding. As also described above, this appropriate ordering may be implemented according to a LUT, or it may be inherently implemented in hardware. Again, the ordering of the decoded signal is what is important; the order in which the check nodes are processed is not critical (they may be processed in an order that corresponds to the order in which the signal is to be decoded).

The symbol sequence estimate and symbol node update functional block continues by computing soft symbol estimates and by estimating the symbols using those calculated soft symbol estimates. Within the symbol sequence estimate and symbol node update functional block, after obtaining the soft symbol estimate $p_i[m]$ from the symbol node update, min* processing may be employed to decompose the soft symbol estimates to soft bit estimates for every edge (based on the labels of the edges). An example of this processing may be employed to understand the decoding processing by considering the j-th edge of the i-th symbol as having the label 5. This symbol then has 2 bits connected to the check node through this edge. The soft bit estimates for the k-th bit may be calculated as follows:

$$est_{i,j,0}[b]=\min^*\{p_i(m_0,m_1,b)|m_0,m_1\in\{0,1\}\} \quad (EQ\ 6)$$

$$est_{i,j,1}[b]=\min^*\{p_i(b,m_0,m_1)|m_0,m_1\in\{0,1\}\} \quad (EQ\ 7)$$

The bit estimates are then made corresponding to these soft bit estimates. Using these soft bit estimates, the bit edge messages are then updated using the symbol metric and the combined bit edge messages. Once these bit edge messages are updated, they may then be passed to the check nodes to continue the subsequent iterations of the iterative decoding processing. Using this approach, memory can be reduced (when compared to the symbol decoding approach) and the LLR decoding approach may be performed in updating the check nodes.

Continuing on with the iterative decoding processing, the edge messages are then updated using the updated bit edge messages. The iterative decoding processing continues for a predetermined number of iterations or until the edge messages have converged to a solution within an acceptable degree of precision. Best estimates of the symbols of a received symbol block may then be made after the iterative decoding processing has been performed in a similar manner than in performed above with respect to the symbol decoding approach.

Some comments may be made when comparing the symbol decoding approach, the bit only decoding approach, the bit (with metric updating) decoding approach, and the hybrid decoding approach. When updating of the symbol nodes is performed using symbol metrics, the edge messages for the symbols are needed. Therefore, the decoding processing has first to get back the edge message of the symbol from the edge message of the bits. Since the bit edge message is a probability of the bit related to the check node, then the conditional probability is needed to get the symbol probability. However, that probability is initially not available. Therefore, the decoding processing assumes that those bits are independent from one another. While this property does hold true for the information bits of the LDPC code, it is not necessarily true for the check bits. Because of this characteristic of the hybrid decoding approach, the hybrid decoding approach may incur some performance loss when compared to the other approaches of decoding described herein.

FIG. 28A is a flowchart illustrating an embodiment of a method for symbol decoding of LDPC coded modulation signals according to the invention. The method involves receiving a symbol block that includes a plurality of symbols. This symbol block may be viewed as being a block of LDPC coded modulation symbols. The symbols are then mapped according to an appropriate code rate and/or modulation. The modulation includes a constellation and a mapping for each symbol within the symbol block. Either one or both of the code rate and the modulation may vary within the symbol block as frequently as on a symbol by symbol basis.

Thereafter, the method continues by performing initial estimating of the symbols. The method then continues by performing check node updating. Thereafter, the method continues by performing symbol sequence estimating and symbol node updating. After the iterative decoding processing is completed, then the method finishes by outputting best estimates of the symbols of the received symbol block.

FIG. 28B is a flowchart illustrating an embodiment of a hybrid decoding method of LDPC coded modulation signals according to the invention. This hybrid method of decoding involves updating the check nodes using the bit edge message and also updating the symbol nodes using the symbol metric and combined bit edge message.

Many portions of this method may also include similar operational steps of the symbol decoding method described above. For example, the method may also involve receiving a symbol block that includes a plurality of symbols. This symbol block may be viewed as being a block of LDPC coded modulation symbols. The symbols are then mapped according to an appropriate code rate and/or modulation. The modulation includes a constellation and a mapping for each symbol within the symbol block. Either one or both of the code rate and the modulation may vary within the symbol block as frequently as on a symbol by symbol basis.

This hybrid decoding method then involves obtaining soft symbol estimates from the symbol node updating. The method then involves decomposing the soft symbol estimates to soft bit estimates for every edge (based on the labeling of those edges).

The method then involves estimating the bits using the soft bit estimates. The bit edge messages are then updated using the symbol metric and the combined bit messages. The method then involves passing these updated edge messages to the check nodes. The method then involves updating the edge messages at the check nodes using the bit edge messages.

As with the symbol decoding method described above, the iterative decoding processing is also completed within this hybrid decoding method. The method then finishes by outputting best estimates of the symbols of the received symbol block.

Any of the various approaches of symbol decoding described above may be employed to perform symbol decoding of an LDPC-BICM signal. When an LDPC-BICM signal is decoded using the symbol decoding as described herein, the BICM aspect thereof can be considered as a code defined on the Euclidean space. Therefore, the symbol maps that are related to Euclidean distance may offer better performance. A new LDPC-BICM communication system is introduced herein that applies multiple symbols maps to symbols such that at least one of the symbol maps is a non-Gray code map. This LDPC-BICM signal, having at least some symbols that are mapped according to non-Gray code maps, may also be decoded using symbol decoding as described herein. An exemplary embodiment of an 8 PSK (Phase Shift Key) LDPC-BICM communication system is used to illustrate some of the operation and benefits of the invention. However, it is noted that the functionality described herein may be extended to other higher order modulation type communication systems as well without departing from the scope and spirit of the invention.

Again, an exemplary communication system type that is used to illustrate the functionality of the invention is an 8 PSK LDPC-BICM communication system. The LDPC code that is employed is an irregular rate ⅔ code of block size 43200 with the following degree distribution:

$$\lambda_2=0.2,\ \lambda_3=0.5,\ \lambda_4=\lambda_5=\ldots=\lambda_8=0,\ \lambda_9=0.3\ \text{and}$$
$$\rho_{10}=1.$$

The code has 43200 bit nodes with 4800 degree 9 nodes at the beginning followed by 24000 degree 3 nodes and 14400 degree 2 nodes.

Figure 29A:
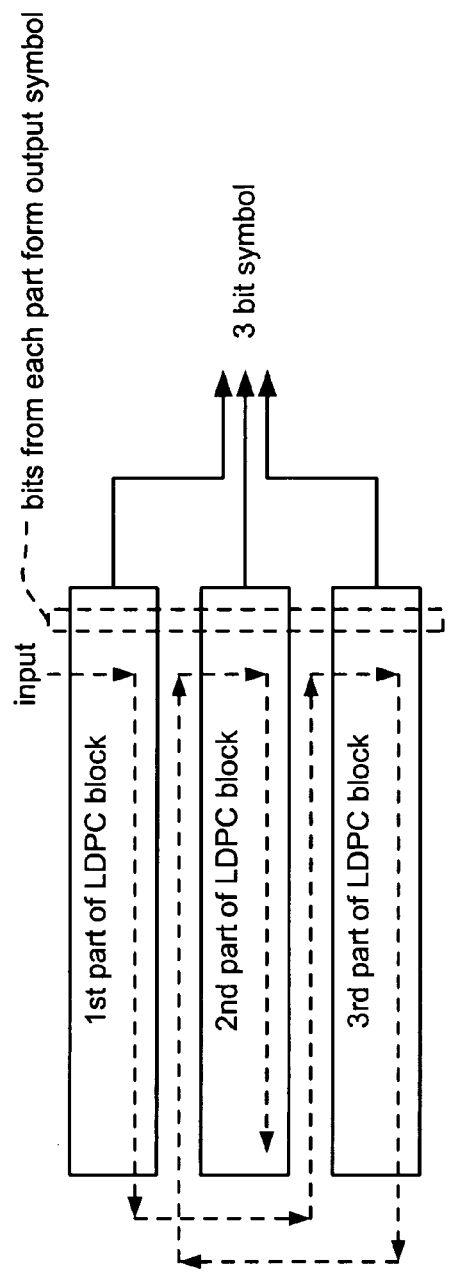
FIG. 29A is a diagram illustrating an embodiment of an interleaver and S/P (Serial to Parallel) transformer as performed within an LDPC-BICM (Low Density Parity Check-Bit Interleaved Coded Modulation) system according to the invention.

FIG. 29A is a diagram illustrating an embodiment of an interleaver and S/P (Serial to Parallel) transformer as performed within an LDPC-BICM (Low Density Parity Check-Bit Interleaved Coded Modulation) system according to the invention. The interleaver and S/P transformer operates initially by breaking the 43200 LDPC coded bits into three separate parts. The first part contains the first 14400 LDPC coded bits, the second part contains the last 14000 LDPC coded bits, and the third part contains the middle 14400 LDPC coded bits of the total 43200 LDPC coded bits. The output symbols that are extracted there from consist of 3 bits from each of the three different parts. This embodiment shows how a 3 bit symbol may be generated, but symbols having fewer of more bits may also be generated using an analogous approach without departing from the scope and spirit of the invention. Since the illustrative communication system being used herein is an 8 PSK LDPC-BICM communication system, 3 bit symbols are being generated that will subsequently be symbol mapped according to an appropriate 8 PSK shaped constellation.

Figure 29B:
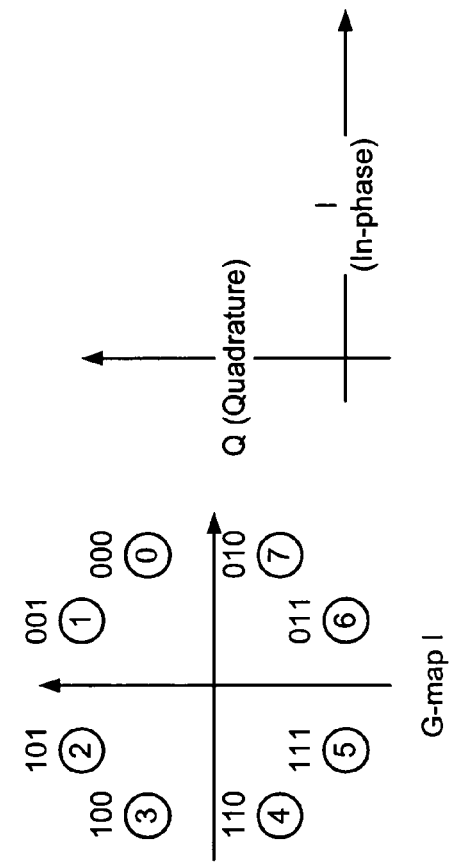
FIG. 29B is a diagram illustrating an embodiment of a Gray code map (G-map I) (shown using an 8 PSK (Phase Shift Key) shaped constellation) according to the invention.

FIG. 29B is a diagram illustrating an embodiment of a Gray code map (G-map I) (shown using an 8 PSK (Phase Shift Key) shaped constellation) according to the invention. Each of the constellation points of the 8 PSK shaped constellation is indexed according to its 3 bit symbol value. For example, the constellation points within the 8 PSK shaped constellation are indexed as follows (going counter-clockwise around the constellation):

The 3 bit symbol 000 is mapped to the 0 constellation point.
The 3 bit symbol 001 is mapped to the 1 constellation point.
The 3 bit symbol 101 is mapped to the 2 constellation point.
The 3 bit symbol 100 is mapped to the 3 constellation point.
The 3 bit symbol 110 is mapped to the 4 constellation point.
The 3 bit symbol 111 is mapped to the 5 constellation point.
The 3 bit symbol 011 is mapped to the 6 constellation point.
The 3 bit symbol 010 is mapped to the 7 constellation point.

Again, it is noted that this symbol map is a Gray code map, in that, all 3-bit vectors are arranged such that successive elements differ in exactly one bit, i.e. the Hamming distance $d_H$ of the two adjacent elements is one (as also described in more detail above).

Figure 30A:
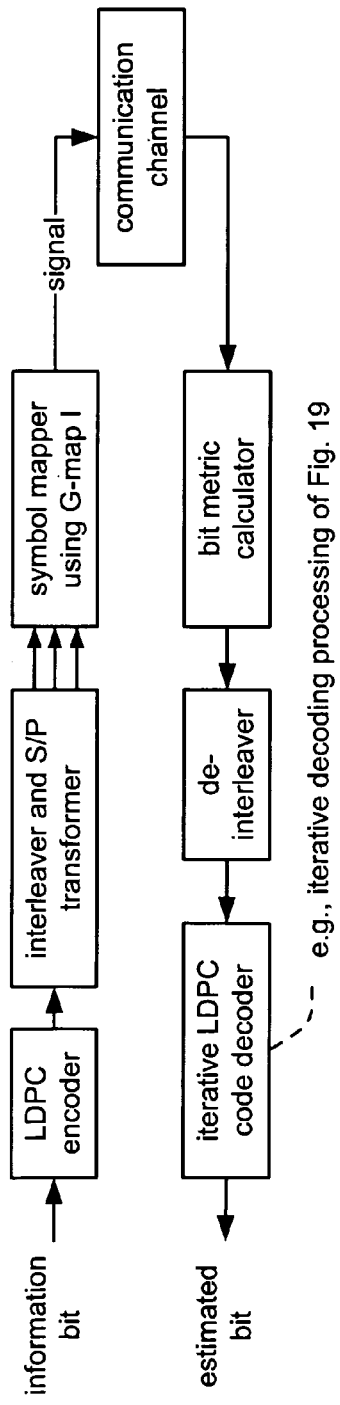
FIG. 30A is a diagram illustrating an embodiment of an LDPC-BICM communication system I that performs encoding of an LDPC-BICM signal using a single Gray code map (G-map I) and performs decoding of the LDPC-BICM signal using bit metric only.

FIG. 30A is a diagram illustrating an embodiment of an LDPC-BICM communication system I that performs encoding of an LDPC-BICM signal using a single Gray code map (G-map I) and performs decoding of the LDPC-BICM signal using bit metric only. Within this communication system, an information bit is provided to an LDPC encoder where it is coded to generate a plurality of LDPC coded bits. This plurality of LDPC coded bits is provided to an interleaver and S/P transformer (e.g., as described above with respect to FIG. 29A). The 3 bit symbols that are output from the interleaver and S/P transformer are provided to a symbol mapper that employs a Gray code map (the G-map I presented above with respect to FIG. 29B) to perform symbol mapping of these symbols to the appropriate constellation points included therein. These mapped symbols then appropriately undergo digital to analog conversion and any appropriate channel modulation to transform the mapped symbols into an LDPC-BICM continuous time transmit signal that is appropriate for transmitting across a communication channel.

The communication channel may be viewed as being an AWGN (Additive White Gaussian Noise) communication channel. This digital to analog conversion and channel modulation may include converting a symbol mapped plurality of discrete valued modulation symbols (e.g., the discrete valued modulation symbols of the LDPC-BICM signal when in a purely digital format) to an actual physical waveform having an amplitude, phase, and frequency. This may also include performing any appropriate filtering of this signal, any frequency shifting (e.g., up-converting to a carrier frequency), or any other modification as to transform the symbol mapped plurality of discrete valued modulation symbols into a continuous-time LDPC-BICM signal that is capable of being launched into the communication channel for transmission to a device on a receive end that is capable of extracting the encoded information bit there from.

At the other end of the communication channel, the converse operations are initially performed. A received continuous-time LDPC-BICM signal is initially channel demodulated and sampled (e.g., converted from an analog signal to a digital signal). The digital samples are then used to generate a received plurality of discrete-valued modulation symbols, and this received plurality of discrete-valued modulation symbols is appropriately partitioned into a number of symbols blocks that subsequently undergo decoding using a decoding approach that employs bit metric only. These symbols blocks are provided to a bit metric calculator that calculates the bit metrics that are subsequently used to perform the decoding. These bit metrics and the demodulated and mapped symbols are passed through a de-interleaver and ultimately to an iterative LDPC coded decoder that performs decoding to make a best estimate of the information bit originally provided to the LDPC encoder at the other end of the communication channel.

Various approaches of this LDPC-BICM communication system I can be found within the prior art. However, a more efficient decoding approach may be employed to perform the decoding processing therein than is usually found in the prior art. In theory, the symbol metrics may first be calculated from the received LDPC-BICM signal, and the symbol metrics may then be decomposed there from to generate the bit metrics according to probability theory. In a practical application, these two steps can functionally be performed in one processing step.

Figure 30B:
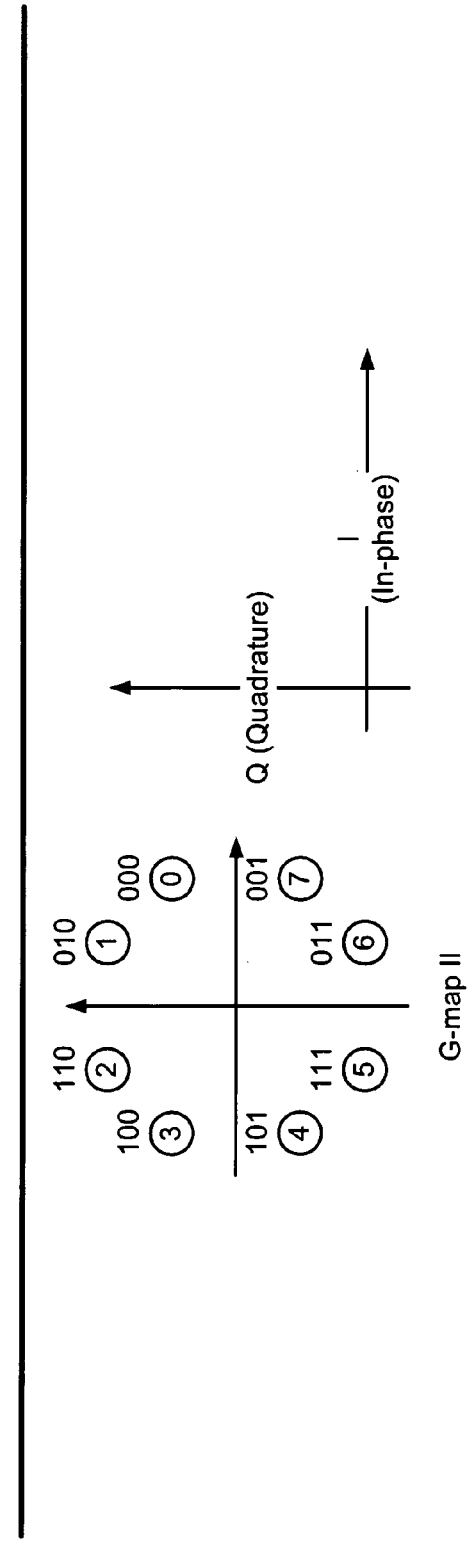
FIG. 30B is a diagram illustrating another embodiment of a Gray code map (G-map II) (shown also using an 8 PSK shaped constellation) according to the invention.

FIG. 30B is a diagram illustrating another embodiment of a Gray code map (G-map II) (shown also using an 8 PSK shaped constellation) according to the invention. This second Gray code map (G-map II) may be used within an LDPC-BICM communication system that performs encoding of an LDPC-BICM signal using 2 Gray code maps. Each of the constellation points of the 8 PSK shaped constellation is indexed according to its 3 bit symbol value. For example, the constellation points within the 8 PSK shaped constellation are indexed as follows (going counter-clockwise around the constellation):

The 3 bit symbol 000 is mapped to the 0 constellation point.
The 3 bit symbol 010 is mapped to the 1 constellation point.
The 3 bit symbol 110 is mapped to the 2 constellation point.

The 3 bit symbol 100 is mapped to the 3 constellation point.

The 3 bit symbol 101 is mapped to the 4 constellation point.

The 3 bit symbol 111 is mapped to the 5 constellation point.

The 3 bit symbol 011 is mapped to the 6 constellation point.

The 3 bit symbol 001 is mapped to the 7 constellation point.

Again, it is noted that this symbol map is a Gray code map, in that, all 3-bit vectors are arranged such that successive elements differ in exactly one bit, i.e. the Hamming distance $d_H$ of the two adjacent elements is one (as also described in more detail above).

Figure 31A:
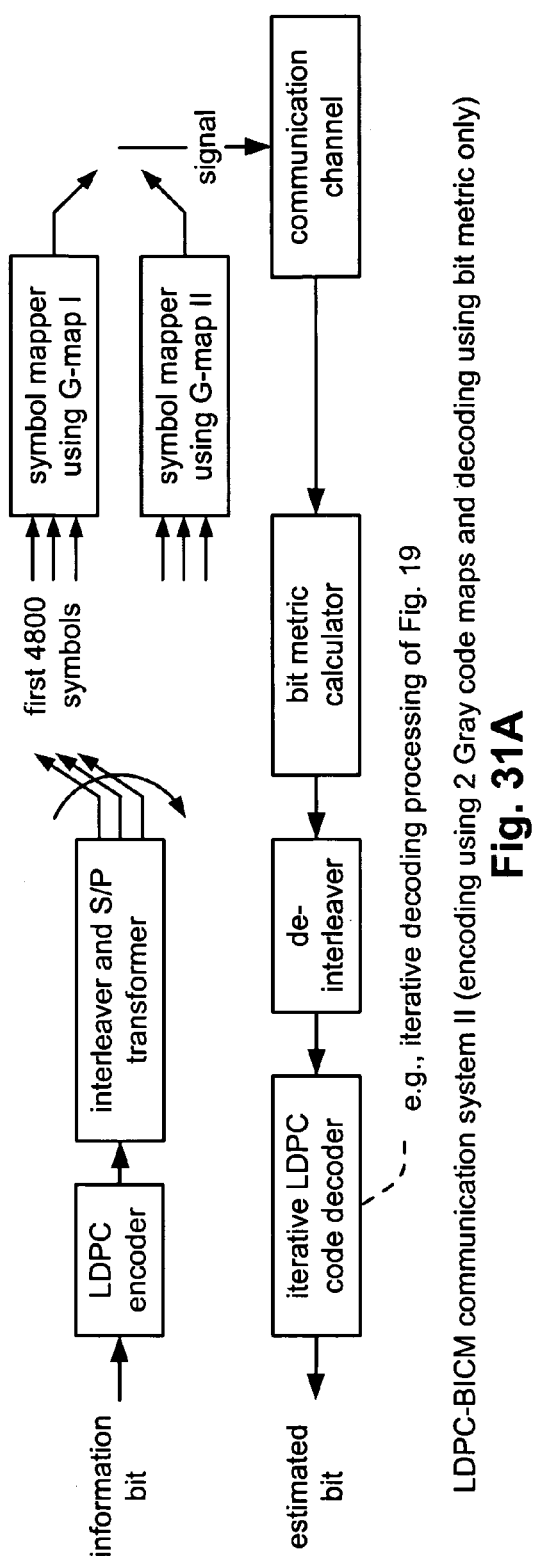
FIG. 31A is a diagram illustrating an embodiment of an LDPC-BICM communication system II that performs encoding of an LDPC-BICM signal using 2 Gray code maps (G-map I and G-map II) and performs decoding of the LDPC-BICM signal using bit metric only according to the invention.

FIG. 31A is a diagram illustrating an embodiment of an LDPC-BICM communication system II that performs encoding of an LDPC-BICM signal using 2 Gray code maps (G-map I and G-map II) and performs decoding of the LDPC-BICM signal using bit metric only according to the invention. The LDPC-BICM communication system II is a departure from the LDPC-BICM communication system I presented above. The output of the 3 bit symbols from the interleaver and S/P transformer are divided into two separate parts of LDPC coded bits. The first part consists of 4800 symbols having LDPC code bits with degree 9. The rest of the LDPC coded bits form the second part. The symbols within the first part are symbol mapped using the first Gray code map (G-map I) and the symbols of the second part are symbol mapped using the second Gray code map (G-map II). The symbols that have been symbol mapped using these 2 separate Gray code maps (G-map I and G-map II) then undergo any of the appropriate processing to transform them into a continuous-time LDPC-BICM signal that is capable of being launched into the communication channel.

The receiver end processing, including the decoding approach, which is performed within the LDPC-BICM communication system II is similar to that which is performed within the LDPC-BICM communication system I, in that, the decoding is performed using bit metric only.

It is noted that the LDPC-BICM communication system II provides for a 0.05 dB gain in performance over the LDPC-BICM communication system I due to the use of the multiple maps (e.g., G-map I and G-map II).

Figure 31B:
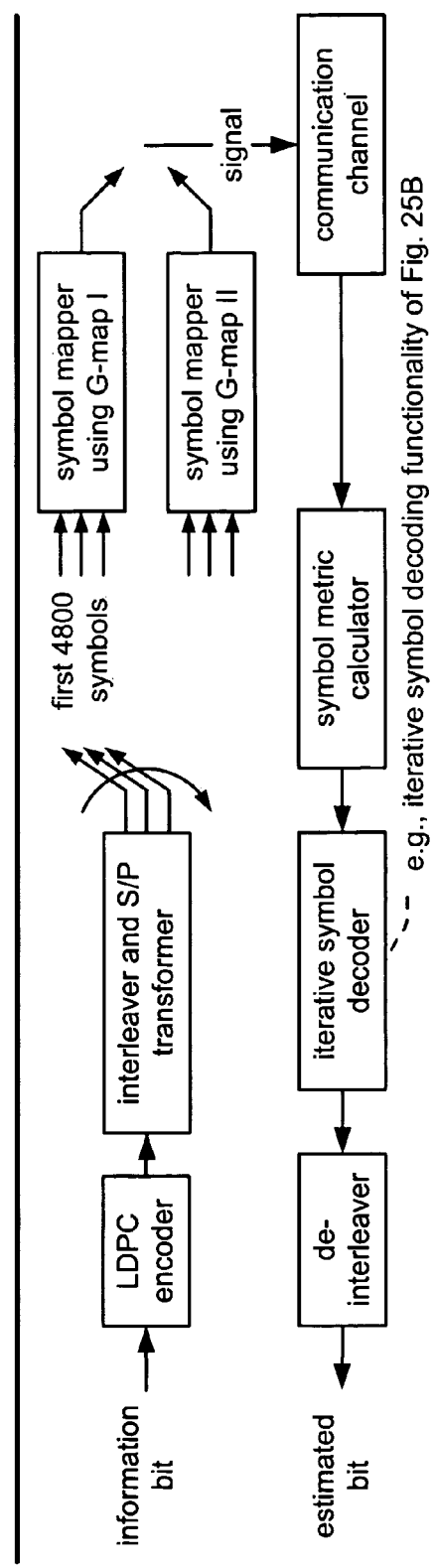
FIG. 31B is a diagram illustrating an embodiment of an LDPC-BICM communication system III that performs encoding of an LDPC-BICM signal using 2 Gray code maps and performs decoding of the LDPC-BICM signal using symbol metric according to the invention.

FIG. 31B is a diagram illustrating an embodiment of an LDPC-BICM communication system III that performs encoding of an LDPC-BICM signal using 2 Gray code maps and performs decoding of the LDPC-BICM signal using symbol metric according to the invention. The LDPC-BICM communication system III is a modification of the LDPC-BICM communication system II described above. The transmitter ends of the communication channel of these 2 LDPC-BICM communication systems (III and IV) operate similarly, in that, multiple symbol mapping is performed. However, the decoding within the LDPC-BICM communication system III is performed using symbol decoding as described above; this is in contradistinction to the bit metric decoding performed within the LDPC-BICM communication system II.

In the LDPC-BICM communication system III, symbol decoding is applied. This decoding approach needs to modify the LDPC coded modulation tripartite graph with symbol nodes connected to bit nodes (e.g., see FIG. 24A as an example) to generate an appropriate LDPC coded modulation bipartite graph with symbol nodes connected directly to check nodes (e.g., see FIG. 24B as an example). This mapping needs to be performed carefully with the appropriate labeling that may be performed using predetermined tables. When performing symbol decoding, the iterative symbol decoder needs only the symbol metric that is provided by a symbol metric calculator. The decoded symbols, output from the iterative symbol decoder, are then passed to a de-interleaver from which a best estimate of the information bit originally provided to the LDPC encoder at the other end of the communication channel is output. One embodiment by which the iterative symbol decoder may be implemented is provided above with respect to FIG. 25B.

It is noted that the LDPC-BICM communication system III outperforms the LDPC-BICM communication system II by approximately 0.05 dB. As such, the LDPC-BICM communication system III can provide a performance improvement of approximately 0.1 dB over the LDPC-BICM communication system I.

It is noted that each of the LDPC-BICM communication systems described up until now all employ Gray code maps when symbol mapping the symbols generated therein. Various embodiments of non-Gray code mapping are presented below that may alternatively be used to provide for even more improvement in performance.

Figure 32A:
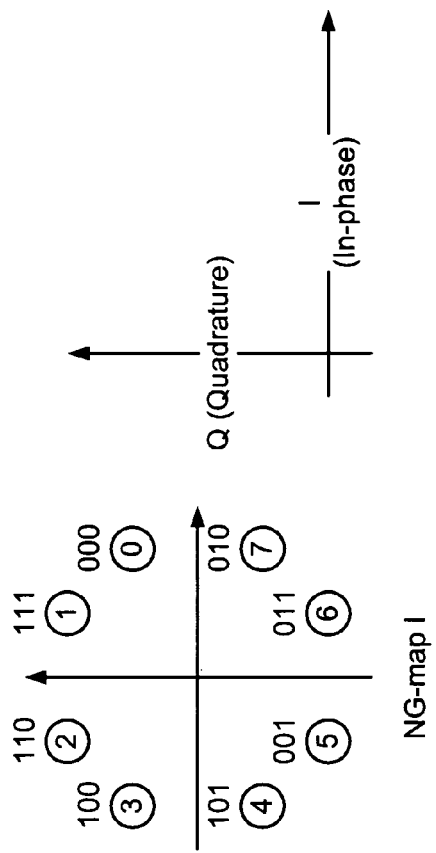
FIG. 32A is a diagram illustrating an embodiment of a non-Gray code map (NG-map I) (shown also using an 8 PSK shaped constellation) according to the invention.

FIG. 32A is a diagram illustrating an embodiment of a non-Gray code map (NG-map I) (shown also using an 8 PSK shaped constellation) according to the invention. This non-Gray code map (NG-map I) may be used within an LDPC-BICM communication system that performs encoding of an LDPC-BICM signal using 2 separate mappings. In such an LDPC-BICM communication system, a new non-Gray code map is employed as one of the mappings. In some instances, these 2 separate mappings include one Gray code map and one non-Gray code map.

Each of the constellation points of the 8 PSK shaped constellation is indexed according to its 3 bit symbol value. For example, the constellation points within the 8 PSK shaped constellation are indexed as follows (going counter-clockwise around the constellation):

The 3 bit symbol 000 is mapped to the 0 constellation point.

The 3 bit symbol 111 is mapped to the 1 constellation point.

The 3 bit symbol 110 is mapped to the 2 constellation point.

The 3 bit symbol 100 is mapped to the 3 constellation point.

The 3 bit symbol 101 is mapped to the 4 constellation point.

The 3 bit symbol 001 is mapped to the 5 constellation point.

The 3 bit symbol 011 is mapped to the 6 constellation point.

The 3 bit symbol 010 is mapped to the 7 constellation point.

Again, it is noted that this symbol map is a non-Gray code map, in that, all 3-bit vectors are arranged such that successive elements may differ in a manner that is more than exactly one bit, i.e. the Hamming distance $d_H$ of the two adjacent elements is not always one. Since the 3 bit symbols of the two adjacent symbols 0 and 1 differ by 3 bits, this map is not a Gray code map.

Figure 32B:
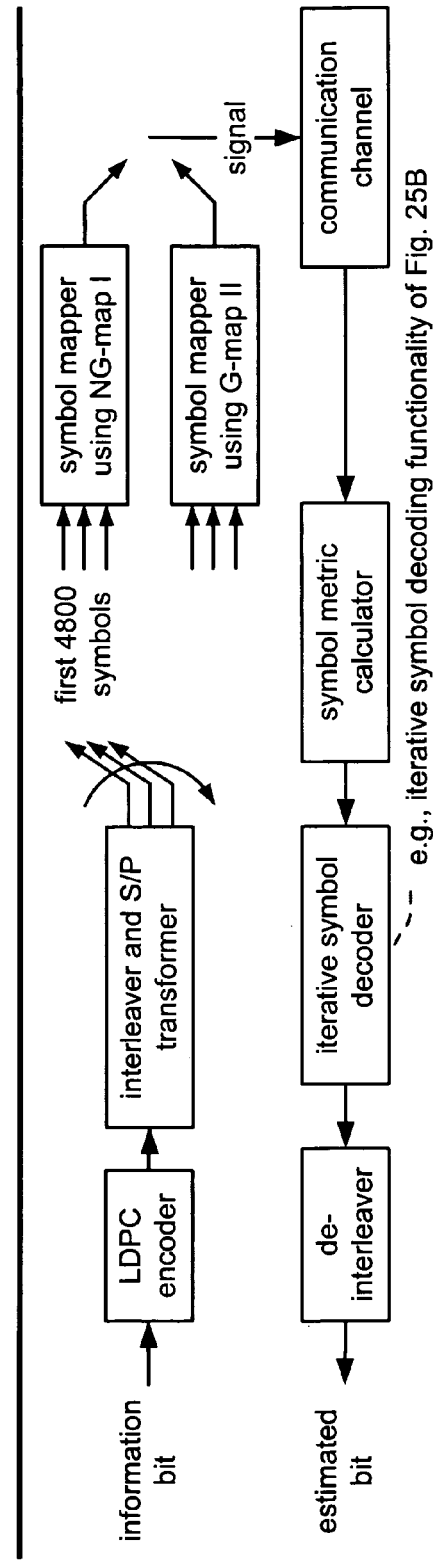
FIG. 32B is a diagram illustrating an embodiment of an LDPC-BICM communication system IV that performs encoding of an LDPC-BICM signal using 1 Gray code map (G-map II) and 1 non-Gray code map (NG-map I) and performs decoding of the LDPC-BICM signal using symbol metric according to the invention.

FIG. 32B is a diagram illustrating an embodiment of an LDPC-BICM communication system IV that performs encoding of an LDPC-BICM signal using 1 Gray code map (G-map II) and 1 non-Gray code map (NG-map I) and performs decoding of the LDPC-BICM signal using symbol metric according to the invention.

The LDPC-BICM communication system IV is somewhat similar to the LDPC-BICM communication system III except that a non-Gray code map (NG-map I) is used in place of the Gray code map (G-map I) by one of the 2 symbol mappers at the transmitter end of the communication channel. The decoding processing at the receiver end of the communication channel is performed using symbol decoding as also described above.

This LDPC-BICM communication system IV shows a communication system that operates by using an LDPC-BICM signal that has been generated using multiple maps (one of which is a Gray code map and one of which is a non-Gray code map). In addition, the decoding of this LDPC-BICM signal (that has non-Gray code mapping) is performed using symbol decoding.

By employing this non-Gray code map (NG-map I) in place of the previous Gray code map (G-map I), the LDPC-BICM communication system IV gains another 0.05 dB in performance over the LDPC-BICM communication system III. Therefore, the LDPC-BICM communication system IV outperform the prior art LDPC-BICM communication system I by over 0.15 dB by using the combination of Gray code mapping and non-Gray code mapping.

When considering the LDPC-BICM communication system IV, it can clearly be seen that there is a performance advantage by using a combination of Gray code mapping and non-Gray code mapping. More specifically, there is clearly a performance advantage of using non-Gray code mapping within an LDPC-BICM communication system. It is again noted that this combination of Gray code mapping and non-Gray code mapping is performed within an LDPC-BICM communication system that performs decoding of the LDPC-BICM signal using symbol decoding.

For completeness, a comparison is also made for an LDPC-BICM communication system that employs a combination of Gray code mapping and non-Gray code mapping and that also performs decoding of the LDPC-BICM signal using bit decoding (that uses bit metric only). That is to say, a comparison is performed to see if a combination of Gray code mapping and non-Gray code mapping within an LDPC-BICM communication system that performs bit metric only decoding could provide as good (or nearly as good) a performance improvement as within an LDPC-BICM communication system that performs symbol decoding on an LDPC-BICM signal having a combination of Gray code mapping and non-Gray code mapping.

Figure 33:
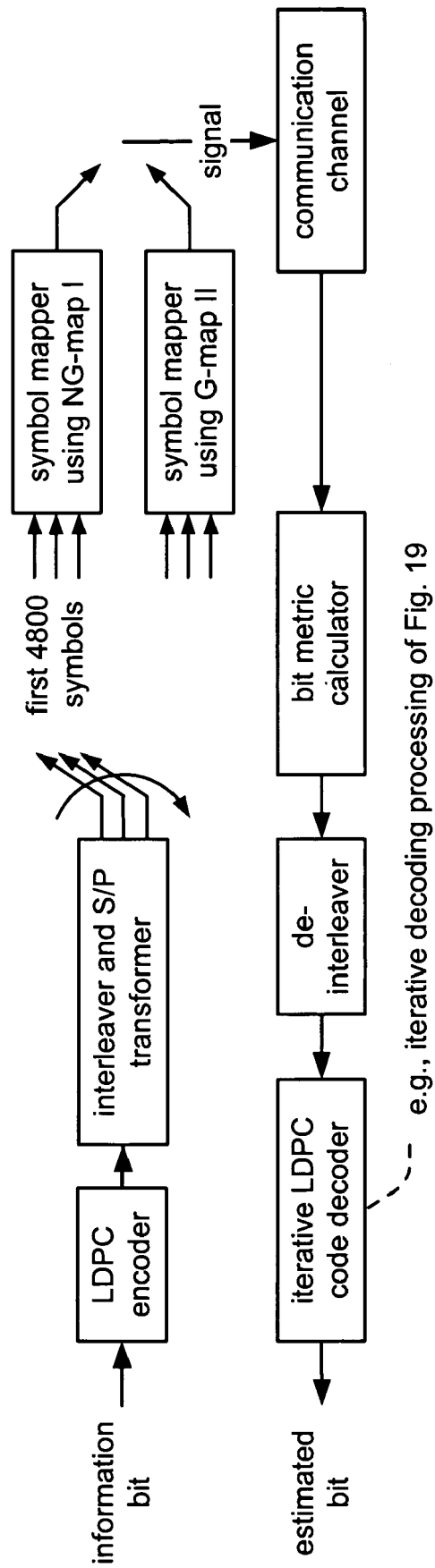
FIG. 33 is a diagram illustrating an embodiment of an LDPC-BICM communication system V that performs encoding of an LDPC-BICM signal using 1 Gray code map (G-map II) and 1 non-Gray code map (NG-map I) and performs decoding of the LDPC-BICM signal using bit metric only.

FIG. 33 is a diagram illustrating an embodiment of an LDPC-BICM communication system V that performs encoding of an LDPC-BICM signal using 1 Gray code map (G-map II) and 1 non-Gray code map (NG-map I) and performs decoding of the LDPC-BICM signal using bit metric only.

The LDPC-BICM communication system V is somewhat similar to the LDPC-BICM communication system IV except that bit metric only decoding is performed at the receiver end of the communication channel. As within the LDPC-BICM communication system IV, a non-Gray code map (NG-map I) is used in place of the Gray code map (G-map I) by one of the 2 symbol mappers at the transmitter end of the communication channel within the LDPC-BICM communication system V. The decoding processing at the receiver end of the communication channel is performed using bit metric only decoding as described above within other of the appropriate embodiments.

Surprisingly, the LDPC-BICM communication system V performs very poorly. The performance of the LDPC-BICM communication system V even has a 0.4 dB loss when compared to the performance of the LDPC-BICM communication system I that can be found in various implementations within the prior art.

Figure 34:
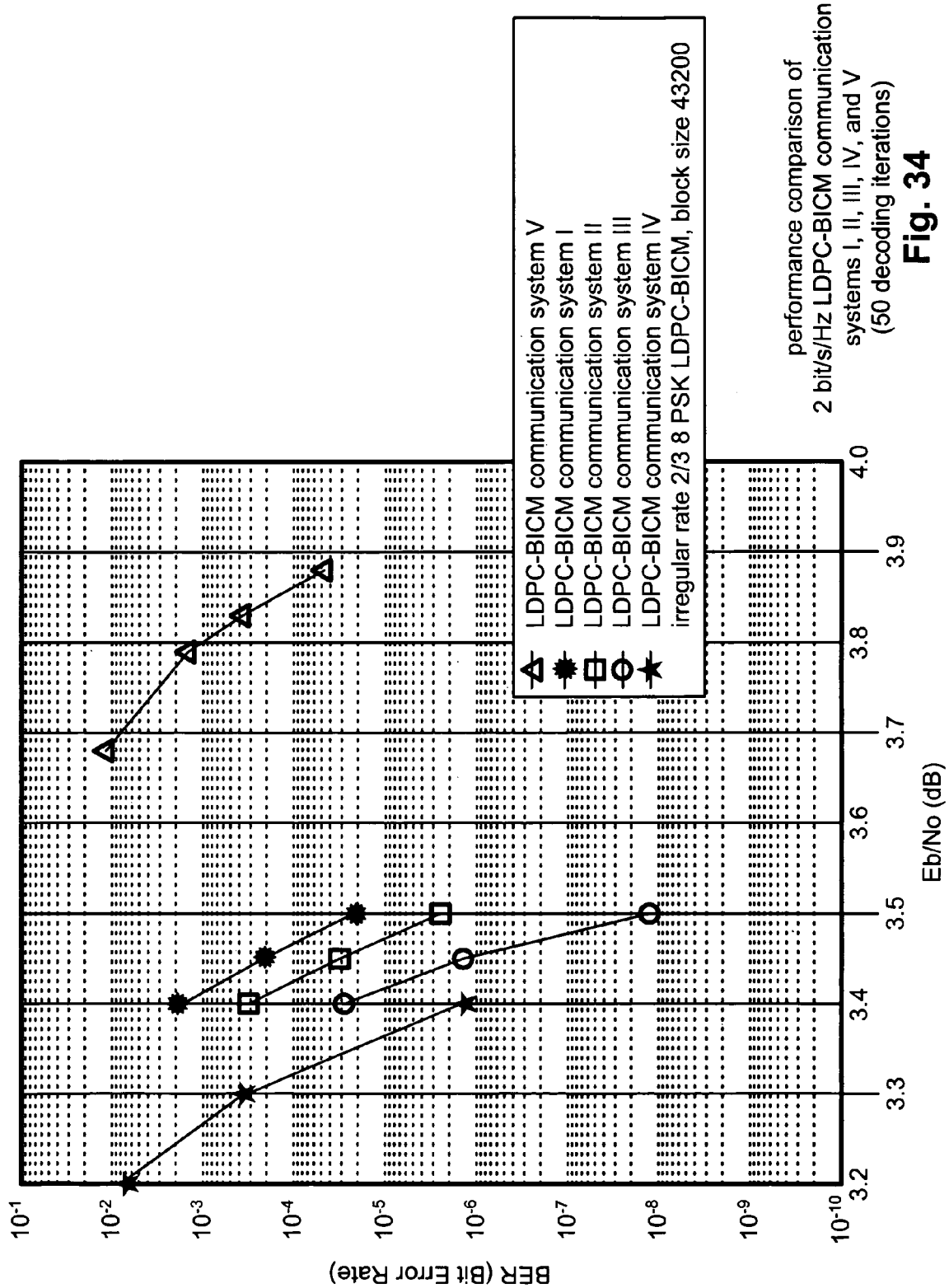
FIG. 34 is a diagram illustrating performance comparison of 2 bit/s/Hz embodiments of the LDPC-BICM communication systems I, II, III, IV, and V (results shown after having performed 50 decoding iterations) according to the invention.

FIG. 34 is a diagram illustrating performance comparison of 2 bit/s/Hz embodiments of the LDPC-BICM communication systems I, II, III, IV, and V (results shown after having performed 50 decoding iterations) according to the invention. As within other performance diagrams presented herein, these performance curves are described in the context of BER versus $E_b/N_o$ (ratio of energy per bit $E_b$ to the Spectral Noise Density $N_o$). Again, this term $E_b/N_o$ is the measure of SNR for a digital communication system. When looking at these performance curves, the BER may be determined for any given $E_b/N_o$ (or SNR).

The 5 different LDPC-BICM communication systems I, II, III, IV, and V are all compared when decoding their corresponding LDPC-BICM signals (having either 1 or 2 maps that are either both Gray code maps or a combination of a Gray code map and a non-Gray code map) as described above within their respective embodiments. Within this comparison, the block size of the LDPC code is 43200, and the signal is an irregular code rate ⅔ 8 PSK (8 Phase Shift Key) LDPC-BICM signal. This diagram shows the performance curves of the above 5 different LDPC-BICM communication systems I, II, III, IV, and V defined previously and transmitting across an AWGN communication channel. The number of decoding iterations performed within each of the embodiments is the same: 50 decoding iterations.

As can be seen within this comparison diagram, the best performing LDPC-BICM communication system is the LDPC-BICM communication system IV.

Figure 35A:
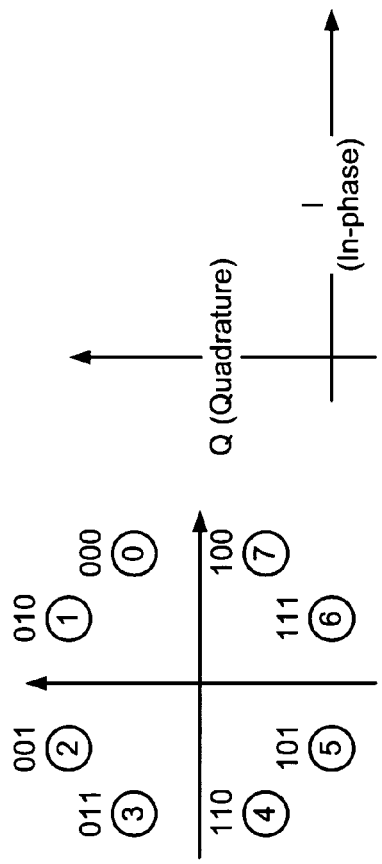
FIG. 35A is a diagram illustrating another embodiment of a non-Gray code map (NG-map II) (shown also using an 8 PSK shaped constellation) according to the invention.

FIG. 35A is a diagram illustrating another embodiment of a non-Gray code map (NG-map II) (shown also using an 8 PSK shaped constellation) according to the invention. There are many choices that may be made for use of a non-Gray code map within the LDPC-BICM communication system IV. By properly choosing the non-Gray code map, even more improvement in performance may be achieved. For example, by taking an alternative non-Gray code map, as illustrated in this diagram, an additional performance gain of 0.025 dB may be achieved within the LDPC-BICM communication system IV.

Each of the constellation points of this non-Gray code mapped 8 PSK shaped constellation (referred to as NG-map II) is indexed according to its 3 bit symbol value. For example, the constellation points within the 8 PSK shaped constellation are indexed as follows (going counter-clockwise around the constellation):

The 3 bit symbol 000 is mapped to the 0 constellation point.
The 3 bit symbol 010 is mapped to the 1 constellation point.
The 3 bit symbol 001 is mapped to the 2 constellation point.
The 3 bit symbol 011 is mapped to the 3 constellation point.
The 3 bit symbol 110 is mapped to the 4 constellation point.
The 3 bit symbol 101 is mapped to the 5 constellation point.
The 3 bit symbol 111 is mapped to the 6 constellation point.
The 3 bit symbol 100 is mapped to the 7 constellation point.

Figure 35B:
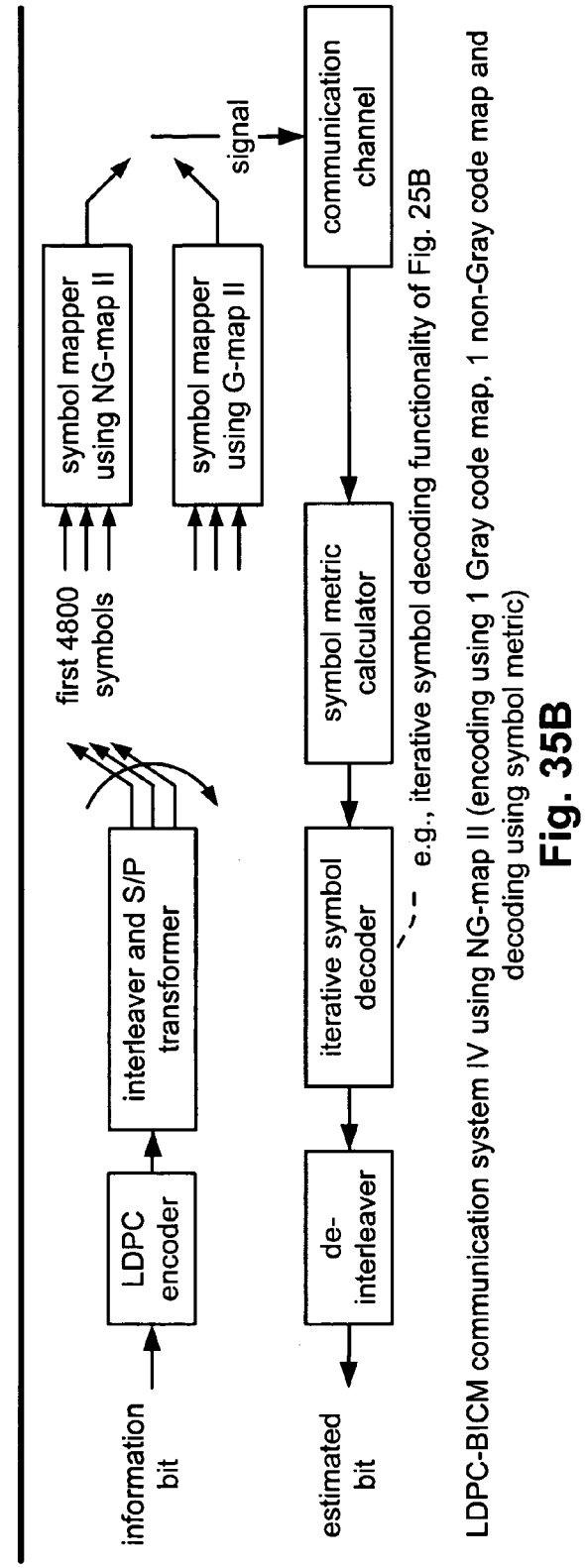
FIG. 35B is a diagram illustrating an alternatively embodiment of the LDPC-BICM communication system IV that performs encoding of an LDPC-BICM signal using 1 Gray code map (G-map II) and 1 non-Gray code map (NG-map II) and performs decoding of the LDPC-BICM signal using symbol metric according to the invention.

FIG. 35B is a diagram illustrating an alternatively embodiment of the LDPC-BICM communication system IV that performs encoding of an LDPC-BICM signal using 1

Gray code map (G-map II) and 1 non-Gray code map (NG-map II) and performs decoding of the LDPC-BICM signal using symbol metric according to the invention. This diagram shows an alternative implementation of the LDPC-BICM communication system IV. The symbol mapper that previously used the firstly introduced non-Gray code map (NG-map I) now uses the secondly introduced non-Gray code map (NG-map II). By using this non-Gray code map (NG-map II), a performance gain of 0.025 dB may be achieved. This is shown graphically in the following diagram.

Figure 36:
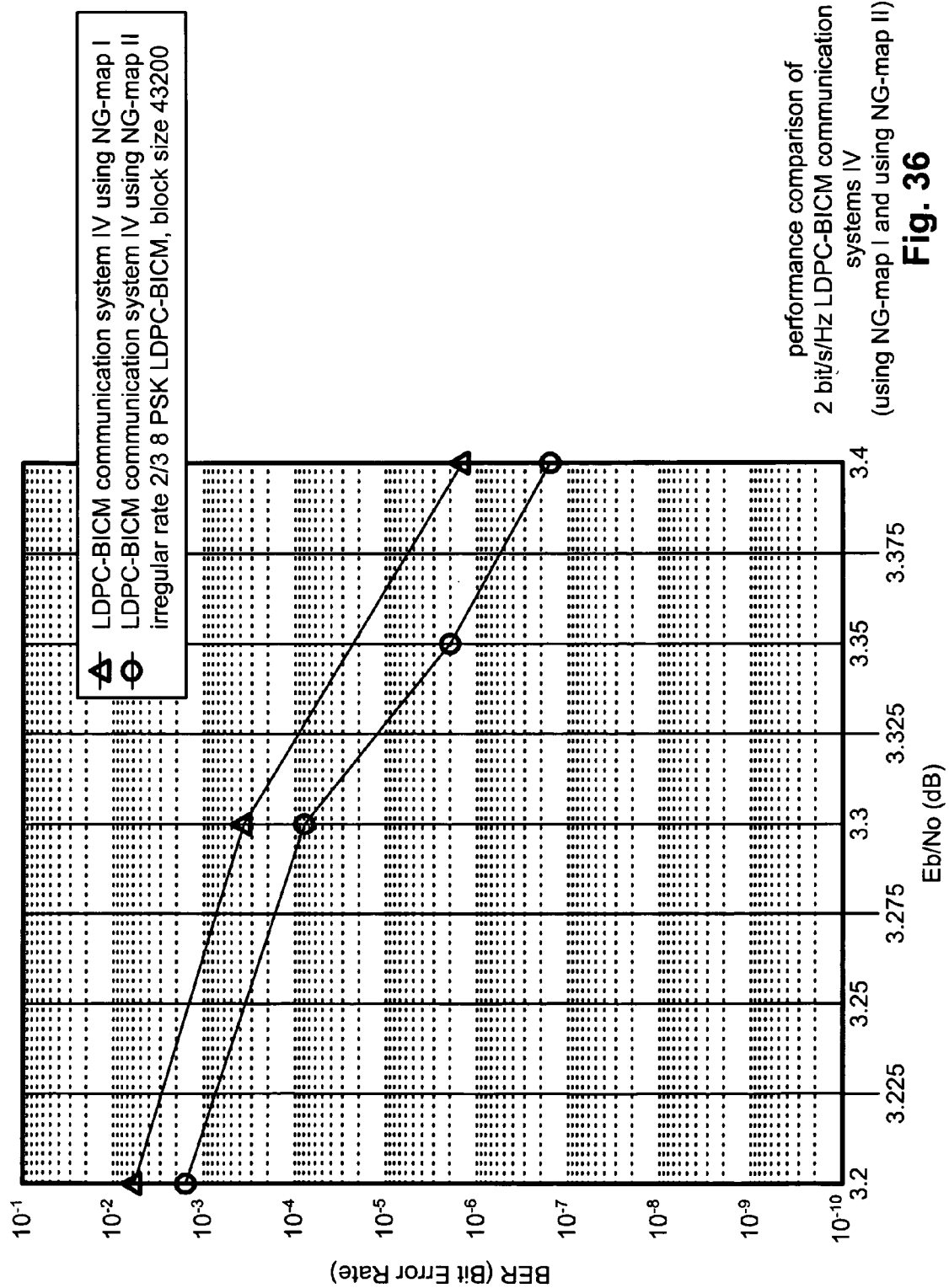
FIG. 36 is a diagram illustrating performance comparison of two alternative embodiments of 2 bit/s/Hz LDPC-BICM communication systems IV (respectively using two possible non-Gray code maps (NG-map I and NG-map II)) according to the invention.

FIG. 36 is a diagram illustrating performance comparison of two alternative embodiments of 2 bit/s/Hz LDPC-BICM communication systems IV (respectively using two possible non-Gray code maps (NG-map I and NG-map II)) according to the invention.

The same principle by which the first two possible alternatives to non-Gray code maps (e.g., NG-map I and NG-map II) may be extended to continue to search for yet another non-Gray code map that may provide for even better performance. The following non-Gray code map (NG-map III) is one such non-Gray code map that does in fact provide for even yet another incremental improvement in performance.

Figure 37A:
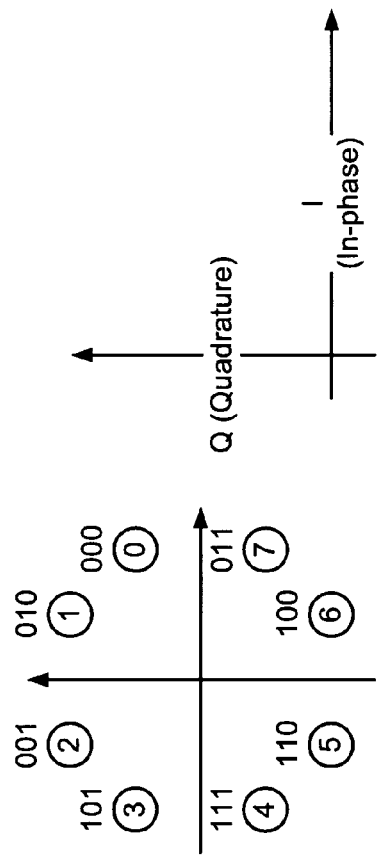
FIG. 37A is a diagram illustrating another embodiment of a non-Gray code map (NG-map III) (shown also using an 8 PSK shaped constellation) according to the invention.

FIG. 37A is a diagram illustrating another embodiment of a non-Gray code map (NG-map III) (shown also using an 8 PSK shaped constellation) according to the invention.

Again, there are many choices that may be made for use of a non-Gray code map within the LDPC-BICM communication system IV. By properly choosing the non-Gray code map, even more improvement in performance may be achieved. For example, by taking an alternative non-Gray code map, as illustrated in this diagram, an additional performance gain of 0.05 dB may be achieved within the LDPC-BICM communication system IV when using the non-Gray code map (NG-map III) as opposed to the initially found non-Gray code map (NG-map I). This means that a total performance improvement of 0.2 dB may be achieved when operating the LDPC-BICM communication system IV when using the non-Gray code map (NG-map III) as opposed to the conventional, prior art approach to performing bit only decoding of a signal whose symbols have been symbol mapped using only a single Gray code map. That is to say, the combination of using multiple maps (e.g., 1 Gray code map (G-map II) and 1 non-Gray code map (NG-map III)) can provide a performance improvement of approximately 0.2 dB over conventional, prior art approach to performing bit only decoding of a signal whose symbols have been symbol mapped using only a single Gray code map.

Each of the constellation points of this non-Gray code mapped 8 PSK shaped constellation (referred to as NG-map III) is indexed according to its 3 bit symbol value. For example, the constellation points within the 8 PSK shaped constellation are indexed as follows (going counter-clockwise around the constellation):

The 3 bit symbol 000 is mapped to the 0 constellation point.
The 3 bit symbol 010 is mapped to the 1 constellation point.
The 3 bit symbol 001 is mapped to the 2 constellation point.
The 3 bit symbol 101 is mapped to the 3 constellation point.
The 3 bit symbol 111 is mapped to the 4 constellation point.
The 3 bit symbol 110 is mapped to the 5 constellation point.
The 3 bit symbol 100 is mapped to the 6 constellation point.
The 3 bit symbol 011 is mapped to the 7 constellation point.

Figure 37B:
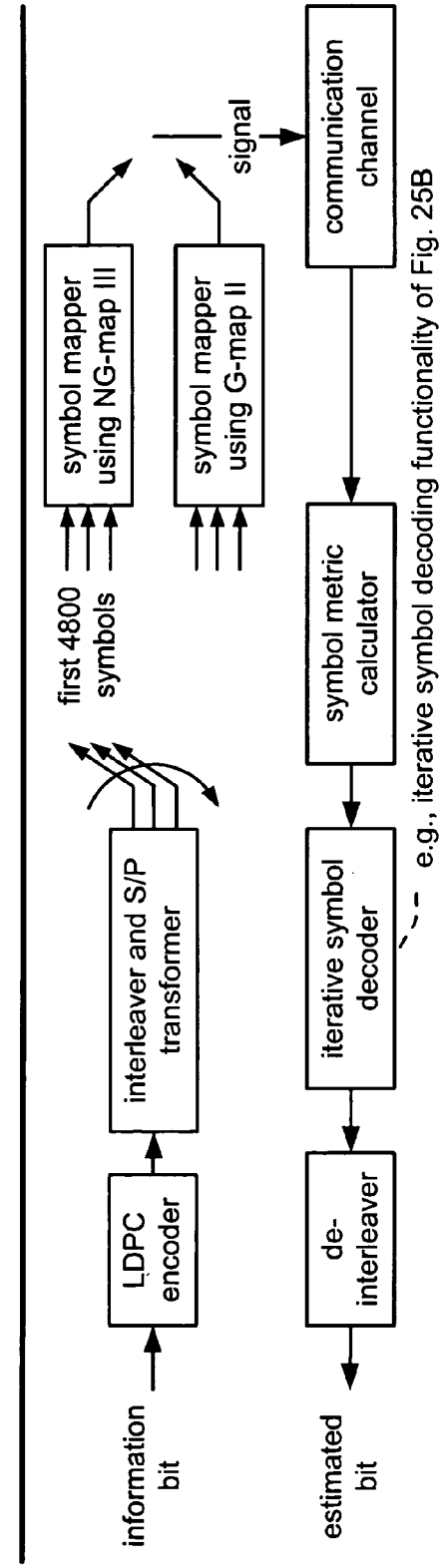
FIG. 37B is a diagram illustrating an alternatively embodiment of the LDPC-BICM communication system IV that performs encoding of an LDPC-BICM signal using 1

FIG. 37B is a diagram illustrating an alternatively embodiment of the LDPC-BICM communication system IV that performs encoding of an LDPC-BICM signal using 1 Gray code map (G-map II) and 1 non-Gray code map (NG-map III) and performs decoding of the LDPC-BICM signal using symbol metric according to the invention.

This diagram shows yet another alternative implementation of the LDPC-BICM communication system IV. The symbol mapper that previously used the firstly introduced non-Gray code map (NG-map I) now uses the thirdly introduced non-Gray code map (NG-map III). By using this non-Gray code map (NG-map III), a performance gain of 0.05 dB may be achieved when compared to the embodiment of the LDPC-BICM communication system IV that uses the firstly introduced non-Gray code map (NG-map I). This particular embodiment of the LDPC-BICM communication system IV is shown graphically in the following diagram.

FIG. 38 is a diagram illustrating performance comparison of three alternative embodiments of 2 bit/s/Hz LDPC-BICM communication systems IV (respectively using three possible non-Gray code maps (NG-map I, NG-map II, and NG-map III)) according to the invention.

It is also noted that the various embodiments of LDPC-BICM communication system IV can be generalized to operate using any of a variety of LDPC codes and modulation types having various constellation shapes. For example, various modulations may be employed such as QPSK (Quadrature Phase Shift Key), 16 QAM (Quadrature Amplitude Modulation), 64 QAM, 12 APSK (Asymmetric Phase Shift Keying), and even other modulation types including higher order modulation types. In addition, even more than 2 symbol maps may be employed without departing from the scope and spirit of the invention.

FIG. 39 is a flowchart illustrating an embodiment of a method for generating an LDPC-BICM (Low Density Parity Check-Bit Interleaved Coded Modulation) signal having a non-Gray code mapping according to the invention. The method involves receiving one or more information bits. The method then involves encoding the one or more information bits according to an LDPC code thereby generating a plurality of LDPC coded bits. The method then involves interleaving the plurality of LDPC coded bits into a plurality of parts. The method then continues by selecting one bit from each part of the plurality of parts thereby generating a plurality of discrete-valued symbols. In some embodiments, this plurality of discrete-valued symbols includes 3 bit discrete-valued symbols. The method then involves symbol mapping each of the plurality of discrete-valued symbols. This symbol mapping involves symbol mapping some of the discrete-valued symbols using a non-Gray code map, and this symbol mapping involves symbol mapping some of the discrete-valued symbols using a Gray code map.

Then, the method involves performing digital to analog conversion and channel modulation of the symbol mapped plurality of discrete-valued modulation symbols thereby generating a continuous-time LDPC-BICM transmit signal. The method then involves launching the continuous-time LDPC-BICM transmit signal into a communication channel. This communication channel may be an AWGN communication channel in some embodiments.

FIG. 40 is a flowchart illustrating an embodiment of a method for symbol decoding of LDPC-BICM signal having a non-Gray code mapping according to the invention. The method involves receiving a continuous-time LDPC-BICM signal from a communication channel. This communication channel may be an AWGN communication channel in some embodiments. The method then involves performing channel demodulation and analog to digital conversion of the received continuous-time LDPC-BICM signal thereby generating a received plurality of discrete-valued modulation symbols arranged into symbol blocks. The method then involves receiving a symbol block that has some symbols that have been mapped using at least one non-Gray code mapping. Some of the symbols may also have been mapped using a Gray code mapping.

The method then involves mapping symbols of the symbol block according to code rate and/or modulation. Again, one of the modulations includes at least one constellation having a non-Gray code mapping of the constellation points included therein.

Thereafter, the method continues by performing initial estimating of the symbols. The method then continues by performing check node updating. Thereafter, the method continues by performing symbol sequence estimating and symbol node updating. After the iterative decoding processing is completed, then the method finishes by outputting best estimates of the symbols of the received symbol block.

It is also noted that the methods described within the preceding figures may also be performed within any of the appropriate system and/or apparatus designs (e.g., communication systems, communication devices, communication transceivers, communication transmitters, communication receivers, and/or functionality described therein) that are described above without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. A decoder that is operable to perform symbol decoding of an LDPC-BICM (Low Density Parity Check-Bit Interleaved Coded Modulation) signal that includes at least one symbol that is mapped using a non-Gray code mapping, the decoder comprising:
    a check node update functional block that calculates a plurality of forward metrics and a plurality of backward metrics that correspond to symbol of a plurality of symbols of the LDPC-BICM signal;
    wherein the check node update functional block uses the plurality of forward metrics and the plurality of backward metrics that correspond to each symbol of the plurality of symbols of the LDPC-BICM signal to update a plurality of edge messages that corresponds to a plurality of edges that communicatively couple a plurality of symbol nodes to a plurality of check nodes within an LDPC coded modulation bipartite graph that corresponds to an LDPC code;
    a symbol sequence estimate and symbol node update functional block that computes a plurality of possible soft symbol estimates for each symbol of the plurality of symbols of the LDPC-BICM signal;
    wherein the symbol sequence estimate and symbol node update functional block updates the plurality of edges using the plurality of possible soft symbol estimates;
    wherein the check node update functional block and the symbol sequence estimate and symbol node update functional block cooperatively perform iterative decoding of the plurality of symbols of the LDPC-BICM signal; and
    wherein, during a last iterative decoding iteration, the symbol sequence estimate and symbol node update functional block makes a best estimate for each symbol of the plurality of symbols of the LDPC-BICM signal using that symbol's corresponding plurality of possible soft symbol estimates.

2. The decoder of claim 1, wherein:
    the LDPC-BICM signal is a variable modulation signal;
    a first symbol of the plurality of symbols is mapped according to a first modulation that includes a first constellation whose constellation points are mapped according to a corresponding Gray code mapping; and
    a second symbol of the plurality of symbols is mapped according to a second modulation that includes a second constellation whose constellation points are mapped according to a non-Gray code mapping.

3. The decoder of claim 2, wherein:
    the first modulation includes an 8 PSK (8 Phase Shift Key) shaped constellation whose constellation points are mapped according to the Gray code mapping; and
    the second modulation includes the 8 PSK shaped constellation whose constellation points are mapped according to the non-Gray code mapping.

4. The decoder of claim 1, wherein:
    the LDPC-BICM signal is a variable code rate signal;
    a first symbol of the plurality of symbols is encoded according to a first code rate; and
    a second symbol of the plurality of symbols is encoded according to a second code rate.

5. The decoder of claim 1, wherein:
    the check node update functional block calculates the plurality of forward metrics and the plurality of backward metrics that correspond to each symbol of the plurality of symbols by employing min* processing.

6. The decoder of claim 1, wherein:
    the symbol sequence estimate and symbol node update functional block updates the plurality of edges using the estimates of each symbol of the plurality of symbols by employing min* processing.

7. The decoder of claim 1, wherein:
    the decoder is implemented within a communication device; and
    the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

8. A decoder that is operable to perform symbol decoding of an LDPC-BICM (Low Density Parity Check-Bit Interleaved Coded Modulation) signal that includes at least one symbol that is mapped using a non-Gray code mapping, the decoder comprising:
    a check node update functional block that is operable to update a plurality of edge messages that corresponds to a plurality of edges that communicatively couple a plurality of symbol nodes to a plurality of check nodes within an LDPC (Low Density Parity Check) coded modulation bipartite graph that corresponds to an LDPC code; and a symbol sequence estimate and symbol node update functional block that is operable to employ the updated plurality of edge messages when making a best estimate of a symbol of the LDPC-BICM signal.

9. The decoder of claim 8, wherein:

the LDPC-BICM signal is a variable modulation signal having a plurality of symbols;

a first symbol of the plurality of symbols is mapped according to a first modulation that includes a first constellation whose constellation points are mapped according to a corresponding Gray code mapping; and a second symbol of the plurality of symbols is mapped according to a second modulation that includes a second constellation whose constellation points are mapped according to a corresponding non-Gray code mapping.

10. The decoder of claim 9, wherein:

the first modulation includes an 8 PSK (8 Phase Shift Key) shaped constellation whose constellation points are mapped according to the corresponding Gray code mapping; and the second modulation includes the 8 PSK shaped constellation whose constellation points are mapped according to the corresponding non-Gray code mapping.

11. The decoder of claim 8, wherein:

the LDPC-BICM signal is a variable code rate signal;

a first symbol of the plurality of symbols is encoded according to a first code rate; and a second symbol of the plurality of symbols is encoded according to a second code rate.

12. The decoder of claim 8, further comprising:

a check node update functional block that calculates a plurality of forward metrics and a plurality of backward metrics that correspond to symbol of a plurality of symbols of the LDPC-BICM signal;

wherein the check node update functional block uses the plurality of forward metrics and the plurality of backward metrics that correspond to each symbol of the plurality of symbols of the LDPC-BICM signal to update a plurality of edge messages that corresponds to a plurality of edges that communicatively couple a plurality of symbol nodes to a plurality of check nodes within an LDPC coded modulation bipartite graph that corresponds to an LDPC code;

a symbol sequence estimate and symbol node update functional block that computes a plurality of possible soft symbol estimates for each symbol of the plurality of symbols of the LDPC coded modulation signal;

wherein the symbol sequence estimate and symbol node update functional block updates the plurality of edges using the plurality of possible soft symbol estimates;

wherein the check node update functional block and the symbol sequence estimate and symbol node update functional block cooperatively perform iterative decoding of the plurality of symbols of the LDPC-BICM signal; and wherein, during a last iterative decoding iteration, the symbol sequence estimate and symbol node update functional block makes a best estimate for each symbol of the plurality of symbols of the LDPC-BICM signal using that symbol's corresponding plurality of possible soft symbol estimates.

13. The decoder of claim 12, wherein:

the check node update functional block calculates the plurality of forward metrics and the plurality of backward metrics that correspond to each symbol of the plurality of symbols by employing min* processing.

14. The decoder of claim 12, wherein:

the symbol sequence estimate and symbol node update functional block updates the plurality of edges using the estimates of each symbol of the plurality of symbols by employing min* processing.

15. The decoder of claim 8, wherein:

the decoder is implemented within a communication device; and the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

16. A decoding method that performs symbol decoding of an LDPC-BICM (Low Density Parity Check-Bit Interleaved Coded Modulation) signal that includes at least one symbol that is mapped using a non-Gray code mapping, the method comprising:

receiving a symbol block, that includes a plurality of symbols, of the LDPC-BICM signal;

mapping the plurality of symbols according to at least one modulation that corresponds to the plurality of symbols thereby generating a plurality of mapped symbols, wherein the at least one modulation includes a constellation and mapping;

making initial estimates of each mapped symbol of the plurality of mapped symbols;

calculating initial conditions of a plurality of forward metrics and a plurality of backward metrics that correspond to at least one symbol of the plurality of mapped symbols;

beginning with the initial conditions of the plurality of forward metrics and the plurality of backward metrics that correspond to the at least one symbol of the plurality of mapped symbols, calculating a plurality of forward metrics and a plurality of backward metrics that correspond to each mapped symbol of the plurality of mapped symbols;

updating a plurality of edge messages, that corresponds to a plurality of edges that communicatively couple a plurality of symbol nodes to a plurality of check nodes within an LDPC coded modulation bipartite graph that corresponds to an LDPC code, using the plurality of forward metrics and the plurality of backward metrics that correspond to each mapped symbol of the plurality of mapped symbols;

computing a plurality of soft symbol estimates for each mapped symbol of the plurality of mapped symbols;

updating each edge message of the plurality of edges messages using the corresponding plurality of soft symbol estimates for each mapped symbol of the plurality of mapped symbols;

performing iterative decoding of the plurality of mapped symbols; and during a last iterative decoding iteration, estimating each mapped symbol of the plurality of mapped symbols using that mapped symbol's corresponding plurality of soft symbol estimates thereby generating best estimates of each symbol of the plurality of symbols of the LDPC-BICM signal.

17. The method of claim 16, wherein:
the LDPC-BICM signal is a variable modulation signal; further comprising:
mapping a first symbol of the plurality of symbols according to a first modulation that includes a first constellation whose constellation points mapped according to a corresponding Gray code mapping; and
mapping a second symbol of the plurality of symbols according to a second modulation that includes a second constellation whose constellation points are mapped according to a corresponding non-Gray code mapping.

18. The method of claim 17, wherein:
the first modulation includes an 8 PSK (8 Phase Shift Key) shaped constellation whose constellation points are mapped according to the corresponding Gray code mapping; and
the second modulation includes the 8 PSK shaped constellation whose constellation points are mapped according to the corresponding non-Gray code mapping.

19. The method of claim 16, wherein:
the LDPC-BICM signal is a variable code rate sign;
a first symbol of the plurality of symbols is encoded according to a first code rate; and
a second symbol of the plurality of symbols is encoded according to a second code rate.

20. The method of claim 16, wherein:
the calculating of the plurality of forward metrics and the plurality of backward metrics that correspond to each mapped symbol of the plurality of mapped symbols is performed by employing min* processing.

21. The method of claim 16, wherein:
the updating the plurality of edges using the estimates of each mapped symbol of the plurality of mapped symbols is performed by employing min* processing.

22. The method of claim 16, wherein:
the method is performed within a decoder;
the decoder is implemented within a communication device; and
the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

23. A decoding method that performs symbol decoding of an LDPC-BICM (Low Density Parity Check-Bit Interleaved Coded Modulation) signal that includes at least one symbol that is mapped using a non-Gray code mapping, the method comprising:
calculating a plurality of forward metrics and a plurality of backward metrics that correspond to each mapped symbol of a plurality of mapped symbols that is mapped from a plurality of symbols of the LDPC-BICM signal;
updating a plurality of edge messages, that corresponds to a plurality of edges that communicatively couple a plurality of symbol nodes to a plurality of check nodes within an LDPC bipartite graph that corresponds to an LDPC code, using the plurality of forward metrics and the plurality of backward metrics that correspond to each mapped symbol of the plurality of mapped symbols;
computing a plurality of soft symbol estimates for each mapped symbol of the plurality of mapped symbols;
updating each edge message of the plurality of edges messages using the corresponding plurality of soft symbol estimates for each mapped symbol of the plurality of mapped symbols;
performing iterative decoding of the plurality of mapped symbols; and
during a last iterative decoding iteration, estimating each mapped symbol of the plurality of mapped symbols using that mapped symbol's corresponding plurality of soft symbol estimates thereby generating best estimates of each symbol of the plurality of symbols of the LDPC-BICM signal.

24. The method of claim 23, further comprising:
receiving a symbol block, that includes a plurality of symbols, of the LDPC-BICM signal;
mapping the plurality of symbols according to at least one modulation that corresponds to the plurality of symbols thereby generating the plurality of mapped symbols, wherein the at least one modulation includes a constellation and mapping;
making initial estimates of each mapped symbol of the plurality of mapped symbols;
calculating initial conditions of a plurality of forward metrics and a plurality of backward metrics that correspond to at least one symbol of the plurality of mapped symbols; and
beginning with the initial conditions of the plurality of forward metrics and the plurality of backward metrics that correspond to the at least one symbol of the plurality of mapped symbols, calculating the plurality of forward metrics and the plurality of backward metrics that correspond to each mapped symbol of the plurality of mapped symbols that is mapped from the plurality of symbols of the LDPC-BICM signal.

25. The method of claim 24, wherein:
the LDPC-BICM signal is a variable modulation signal; further comprising:
mapping a first symbol of the plurality of symbols according to a first modulation that includes a first constellation whose constellation points are mapped according to a corresponding Gray code mapping; and
mapping a second symbol of the plurality of symbols according to a second modulation that includes a second constellation whose constellation points are mapped according to a corresponding non-Gray code mapping.

26. The method of claim 25, wherein:
the first modulation includes an 8 PSK (8 Phase Shift Key) shaped constellation whose constellation points are mapped according to the corresponding Gray code mapping; and
the second modulation includes the 8 PSK shaped constellation whose constellation points are mapped according to the corresponding non-Gray code mapping.

27. The method of claim 23, wherein:

the LDPC-BICM signal is a variable code rate signal;

a first symbol of the plurality of symbols is encoded according to a first code rate; and a second symbol of the plurality of symbols is encoded according to a second code rate.

28. The method of claim 23, wherein:

the calculating of the plurality of forward metrics and the plurality of backward metrics that correspond to each symbol of the plurality of mapped symbols is performed by employing min* processing.

29. The method of claim 23, wherein:

the updating the plurality of edges using the estimates of each mapped symbol of the plurality of mapped symbols is performed by employing min* processing.

30. The method of claim 23, wherein:

the method is performed within a decoder;

the decoder is implemented within a communication device; and the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

* * * * *

UNITED STATES PATENT AND TRADEMARK OFFICE
CERTIFICATE OF CORRECTION

PATENT NO. : 7,322,005 B2
APPLICATION NO. : 10/802023
DATED : January 22, 2008
INVENTOR(S) : Ba-Zhong Shen et al.

Page 1 of 1

It is certified that error appears in the above-identified patent and that said Letters Patent is hereby corrected as shown below:

Column 49, line 27, in Claim 19: replace "sign;" with --signal;--

Signed and Sealed this

Eighth Day of July, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,322,005 B2 | Page 1 of 1 |
| APPLICATION NO. | : 10/802023 | |
| DATED | : January 22, 2008 | |
| INVENTOR(S) | : Ba-Zhong Shen, Hau Thien Tran and Kelly Brian Cameron | |

It is certified that error appears in the above-identified patent and that said Letters Patent is hereby corrected as shown below:

Title Page, (*) Notice, please replace "This patent is subject to a terminal disclaimer." with --This patent is subject to a terminal disclaimer, and specifically with respect to co-pending "reference" application 10/802,011 and prior U.S. patent 7,159,170 B2--

Signed and Sealed this

Twenty-third Day of November, 2010

David J. Kappos
*Director of the United States Patent and Trademark Office*